US012581952B2

(12) United States Patent
Ke et al.

(10) Patent No.: US 12,581,952 B2
(45) Date of Patent: Mar. 17, 2026

(54) PACKAGE STRUCTURE AND METHOD FOR MANUFACTURING THE SAME

(71) Applicant: Advanced Semiconductor Engineering, Inc., Kaohsiung (TW)

(72) Inventors: Po-Hsien Ke, Kaohsiung (TW); Teck-Chong Lee, Kaohsiung (TW); Chih-Pin Hung, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 18/434,698

(22) Filed: Feb. 6, 2024

(65) Prior Publication Data

US 2024/0178158 A1 May 30, 2024

Related U.S. Application Data

(63) Continuation of application No. 17/003,883, filed on Aug. 26, 2020, now Pat. No. 11,894,317.

(51) Int. Cl.
| | |
|---|---|
| *H01L 25/065* | (2023.01) |
| *H01L 21/56* | (2006.01) |
| *H01L 23/00* | (2006.01) |
| *H01L 23/31* | (2006.01) |
| *H01L 25/00* | (2006.01) |

(52) U.S. Cl.
CPC .......... *H01L 23/562* (2013.01); *H01L 21/563* (2013.01); *H01L 23/3135* (2013.01); *H01L 25/0652* (2013.01); *H01L 25/50* (2013.01)

(58) Field of Classification Search
CPC . H01L 23/562; H01L 21/563; H01L 23/3135; H01L 25/0652; H01L 25/50
See application file for complete search history.

(56) References Cited

U.S. PATENT DOCUMENTS

| | | | |
|---|---|---|---|
| 6,335,571 B1 * | 1/2002 | Capote | ................... H01L 24/81 257/E21.511 |
| 7,199,479 B2 * | 4/2007 | Wu | ..................... H01L 23/3128 257/737 |
| 9,543,242 B1 * | 1/2017 | Kelly | .................. H01L 21/6835 |

(Continued)

OTHER PUBLICATIONS

Final Office Action for U.S. Appl. No. 17/003,883, issued Jul. 14, 2023, 14 pages.

(Continued)

*Primary Examiner* — Phat X Cao
(74) *Attorney, Agent, or Firm* — Foley & Lardner LLP

(57) ABSTRACT

A package structure and a manufacturing method are provided. The package structure includes a wiring structure, a first electronic device, a second electronic device, a first underfill, a second underfill and a stiff bonding material. The first electronic device and the second electronic device are disposed on the wiring structure, and are electrically connected to each other through the wiring structure. The first underfill is disposed in a first space between the first electronic device and the wiring structure. The second underfill is disposed in a second space between the second electronic device and the wiring structure. The stiff bonding material is disposed in a central gap between the first electronic device and the second electronic device. The stiff bonding material is different from the first underfill and the second underfill.

8 Claims, 44 Drawing Sheets

(56)     References Cited

U.S. PATENT DOCUMENTS

| | | | |
|---|---|---|---|
| 11,410,919 | B2 | 8/2022 | Sankman et al. |
| 11,894,317 | B2 * | 2/2024 | Ke ........................ H01L 21/563 |
| 2013/0217188 | A1 | 8/2013 | Wang et al. |
| 2017/0365581 | A1 | 12/2017 | Yu et al. |
| 2018/0350754 | A1 * | 12/2018 | Huang ................ H01L 25/0655 |
| 2020/0058571 | A1 | 2/2020 | Wang et al. |
| 2020/0335456 | A1 * | 10/2020 | Fan ........................ H01L 21/56 |
| 2021/0272878 | A1 | 9/2021 | Bai et al. |

OTHER PUBLICATIONS

Non-Final Office Action for U.S. Appl. No. 17/003,883, issued Dec. 15, 2022, 13 pages.
Notice of Allowance for U.S. Appl. No. 17/003,883, issued Sep. 27, 2023, 7 pages.

* cited by examiner

PACKAGE STRUCTURE AND METHOD FOR MANUFACTURING THE SAME

CROSS-REFERENCE TO RELATED APPLICATION

This application is a continuation of U.S. patent application Ser. No. 17/003,883, filed Aug. 26, 2020, now U.S. Pat. No. 11,894,317, the content of which is incorporated herein by reference in its entirety.

BACKGROUND

1. Field of the Disclosure

The present disclosure relates to a package structure and a manufacturing method, and to a package structure including a stiff bonding material, and a method for manufacturing the same.

2. Description of the Related Art

Along with the rapid development in electronics industry and the progress of semiconductor processing technologies, semiconductor package structures are integrated with an increasing number of electronic components or electronic devices to achieve improved electrical performance and additional functions. Accordingly, a warpage of the semi-conductor package structure may occur during the thermal process. Since a rigidity or stiffness of the semiconductor package structure is relatively low, a crack may be formed at the top surface of the semiconductor package structure or in the protection material, and then extend or grow into the interior of the semiconductor package structure. If the crack reaches the semiconductor package substrate, the circuit layer in the semiconductor package substrate may be dam-aged or broken, which may result in an open circuit and render the semiconductor package structure inoperative. Thus, a yield of the semiconductor package structure may decrease.

SUMMARY

In some embodiments, a package structure includes a wiring structure, a first electronic device, a second electronic device, a first underfill, a second underfill and a stiff bonding material. The first electronic device is disposed on the wiring structure. The second electronic device is disposed on the wiring structure. The first electronic device and the second electronic device are electrically connected to each other through the wiring structure. The first underfill is disposed in a first space between the first electronic device and the wiring structure. The second underfill is disposed in a second space between the second electronic device and the wiring structure. The stiff bonding material is disposed in a central gap between the first electronic device and the second electronic device. The stiff bonding material is different from the first underfill and the second underfill.

In some embodiments, a manufacturing method includes: (a) providing a wiring structure; (b) bonding a first elec-tronic device and a second electronic device on the wiring structure side by side; (c) applying a stiff bonding material in a first space between the first electronic device and the wiring structure, and/or in a second space between the second electronic device and the wiring structure; and (d) applying a first underfill in the first space and a second underfill in the second space to push the stiff bonding material into a central gap between the first electronic device and the second electronic device.

In some embodiments, a manufacturing method includes: (a) providing a wiring structure; (b) disposing a first elec-tronic device and a second electronic device on the wiring structure side by side; (c) forming a first underfill in a first space between the first electronic device and the wiring structure and a second underfill in a second space between the second electronic device and the wiring structure; and (d) applying a stiff bonding material in a central gap between the first electronic device and the second electronic device.

BRIEF DESCRIPTION OF THE DRAWINGS

Aspects of some embodiments of the present disclosure are readily understood from the following detailed descrip-tion when read with the accompanying figures. It is noted that various structures may not be drawn to scale, and dimensions of the various structures may be arbitrarily increased or reduced for clarity of discussion.

DETAILED DESCRIPTION

Figure 1:
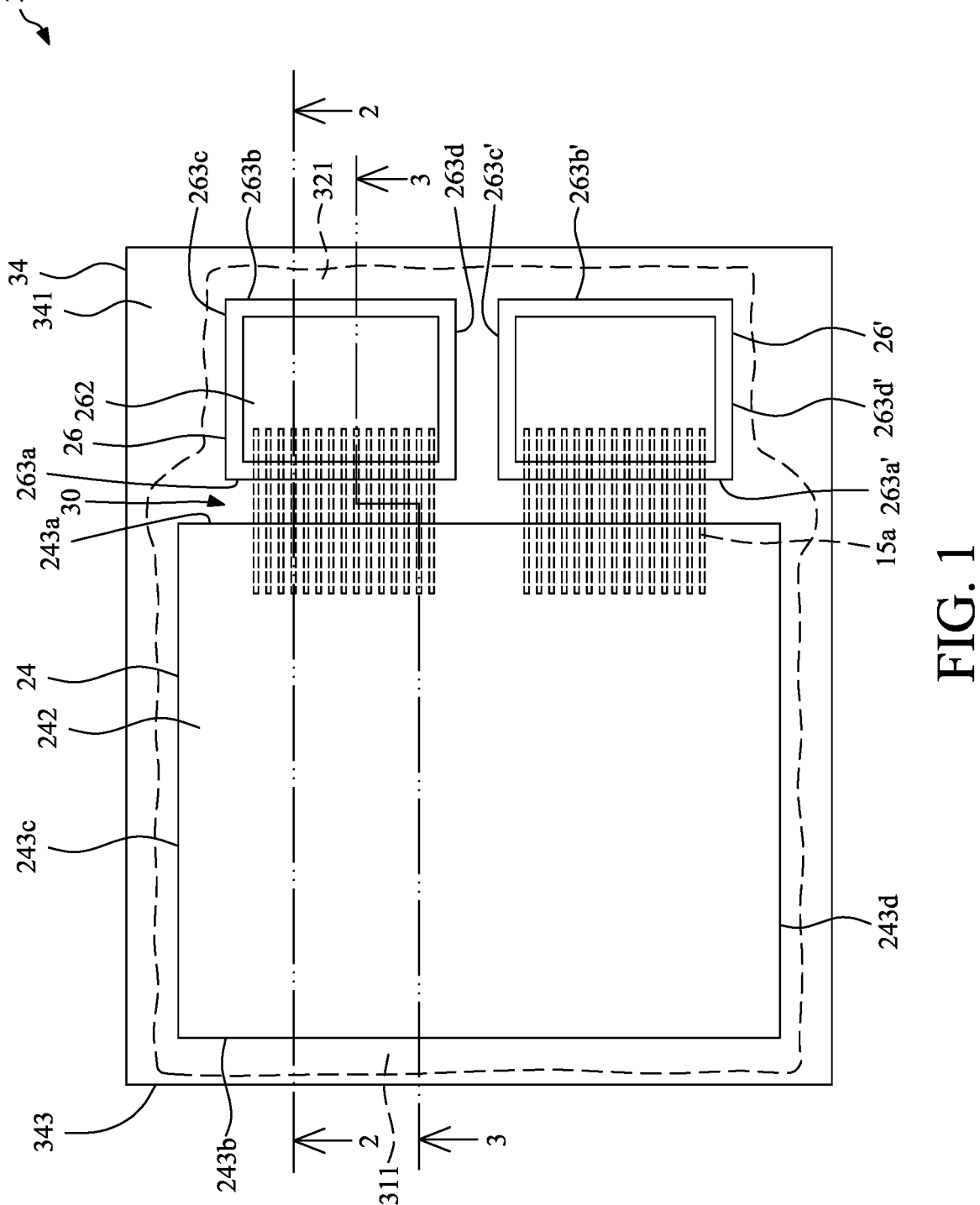
FIG. 1 illustrates a top view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure provide for a package structure which has an improved crack resistance so as to improve a reliability or a yield thereof. At least some embodiments of the present disclosure further provide for techniques for manufacturing the package structure and an assembly structure.

Figure 2:
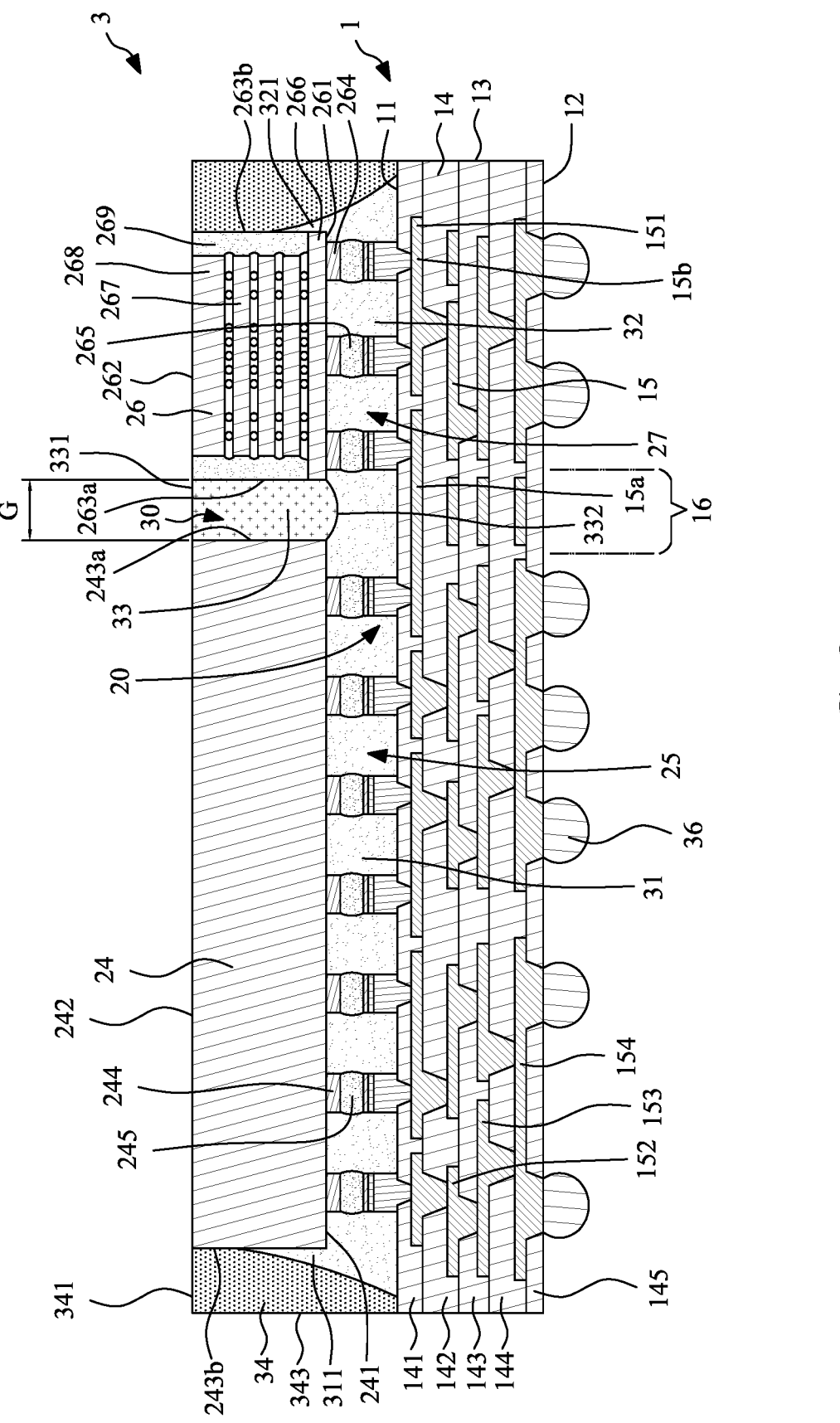
FIG. 2 illustrates a cross-sectional view taken along line 2-2 of the package structure of FIG. 1.
Figure 3:
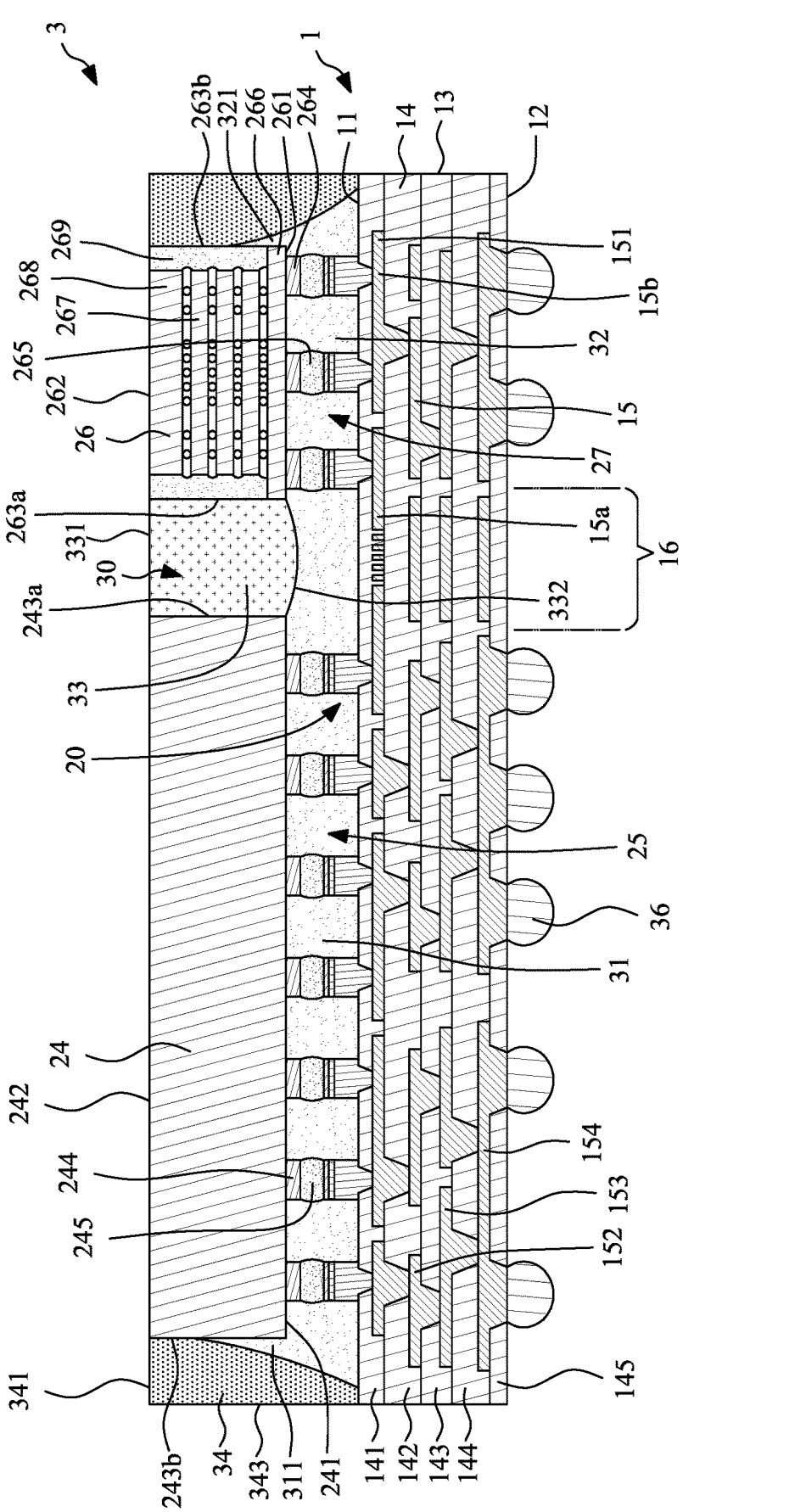
FIG. 3 illustrates a cross-sectional view taken along line 3-3 of the package structure of FIG. 1.

FIG. 1 illustrates a top view of a package structure 3 according to some embodiments of the present disclosure. FIG. 2 illustrates a cross-sectional view taken along line 2-2 of the package structure 3 of FIG. 1. FIG. 3 illustrates a cross-sectional view taken along line 3-3 of the package structure 3 of FIG. 1. The package structure (or a semiconductor package structure) 3 includes a wiring structure 1, a plurality of protrusion pads 20, a first electronic device 24, two second electronic devices 26, 26', a first underfill 31, a second underfill 32, a stiff bonding material 33, an encapsulant 34 and a plurality of solder materials 36. As shown in FIG. 1, the package structure 3 may include one first electronic device 24 and two second electronic devices 26, 26'. However, the amounts of the first electronic device(s) 24 and the second electronic device(s) 26, 26' are not limited in the present disclosure.

As shown in FIG. 2 and FIG. 3, the wiring structure 1 has a first surface 11 (e.g., a top surface), a second surface 12 (e.g., a bottom surface) opposite to the first surface 11, a lateral side surface 13 extending between the first surface 11 and the second surface 12, and a high line density region 16 (or a fine line region) between the first electronic device 24 and the second electronic devices 26, 26'. The wiring structure 1 may include at least one dielectric layer 14, at least one circuit layer 15 in contact with the dielectric layer 14, and a plurality of protrusion pads 20. For example, as shown in FIG. 2 and FIG. 3, the wiring structure 1 includes a first dielectric layer 141, a first circuit layer 151, a second dielectric layer 142, a second circuit layer 152, a third dielectric layer 143, a third circuit layer 153, a fourth dielectric layer 144, a fourth circuit layer 154, and a fifth dielectric layer 145. That is, the at least one dielectric layer 14 includes the first dielectric layer 141, the second dielectric layer 142, the third dielectric layer 143, the fourth dielectric layer 144 and the fifth dielectric layer 145. The at least one circuit layer 15 includes the first circuit layer 151, the second circuit layer 152, the third circuit layer 153 and the fourth circuit layer 154. Each of the circuit layers 15 may be a fan-out circuit layer or a redistribution layer (RDL).

The first dielectric layer 141 may be a topmost dielectric layer or an outermost dielectric layer of the wiring structure 1. The first circuit layer 151 may be a topmost circuit layer or an outermost circuit layer of the wiring structure 1. A material of the first circuit layer 151 may include, for example, copper, another conductive metal, or an alloy thereof. A material of the first dielectric layer 141 may include an insulating material, a passivation material, a dielectric material or a solder resist material, such as, for example, a benzocyclobutene (BCB) based polymer or a polyimide (PI). In some embodiments, the first dielectric layer 141 may be made of a photoimageable material. In addition, the first surface 11 of the wiring structure 1 may be a top surface of the first dielectric layer 141. The first circuit layer 151 is disposed adjacent to the top surface of the first dielectric layer 141. In some embodiments, the first circuit layer 151 is embedded in the first dielectric layer 141, and is exposed from the top surface of the first dielectric layer 141. That is, the first dielectric layer 141 covers the first circuit layer 151, and defines a plurality of openings to expose portions of the first circuit layer 151.

Further, the first circuit layer 151 may include an interconnection portion 15a and a periphery portion 15b. The interconnection portion 15a is located in the high line density region 16, and the periphery portion 15b is located outside the high line density region 16 (e.g., a low line density region). For example, the second electronic devices 26, 26' may be electrically connected to the first electronic device 24 through the interconnection portion 15a of the first circuit layer 151. The second electronic devices 26, 26' and the first electronic device 24 may be electrically connected to the solder materials 36 on the second surface 12 of the wiring structure 1 through the periphery portion 15b of the first circuit layer 151. A line width/line space (L/S) of the traces of the interconnection portion 15a may be less than an L/S of the traces of the periphery portion 15b. For example, an L/S of the traces of the interconnection portion 15a may be less than or equal to about 5 μm/about 5 μm, or less than or equal to about 2 μm/about 2 μm, or less than or equal to about 0.8 μm/about 0.8 μm. An L/S of the traces of the periphery portion 15b may be less than or equal to about 10 μm/about 10 μm, or less than or equal to about 7 μm/about 7 μm, or less than or equal to about 5 μm/about 5 μm.

The first dielectric layer 141 and the first circuit layer 151 may be disposed on the second dielectric layer 142. In addition, the second dielectric layer 142 may cover the second circuit layer 152. A portion (i.e., a via portion) of the first circuit layer 151 extends through the second dielectric layer 142 to electrically connect the second circuit layer 152. A material of the second dielectric layer 142 may be the same as or similar to the material of the first dielectric layer 141. The second circuit layer 152 may also include an interconnection portion located in the high line density region 16, and a periphery portion located outside the high line density region 16. In some embodiments, the via portion of the first circuit layer 151 may extend from the periphery portion, and they may be formed concurrently and integrally.

Similarly, the second dielectric layer 142 and the second circuit layer 152 may be disposed on the third dielectric layer 143. In addition, the third dielectric layer 143 may cover the third circuit layer 153. A portion (i.e., a via portion) of the second circuit layer 152 extends through the third dielectric layer 143 to electrically connect the third circuit layer 153. A material of the third dielectric layer 143 may be the same as or similar to the material of the second dielectric layer 142. The third circuit layer 153 may also include an interconnection portion located in the high line density region 16, and a periphery portion located outside the high line density region 16. In some embodiments, the via portion of the second circuit layer 152 may extend from the periphery portion, and they may be formed concurrently and integrally.

Similarly, the third dielectric layer 143 and the third circuit layer 153 may be disposed on the fourth dielectric layer 144. In addition, the fourth dielectric layer 144 may cover the fourth circuit layer 154. A portion (i.e., a via portion) of the third circuit layer 153 extends through the fourth dielectric layer 144 to electrically connect the fourth circuit layer 154. A material of the fourth dielectric layer 144 may be the same as or similar to the material of the third dielectric layer 143. The fourth circuit layer 154 may also include an interconnection portion located in the high line density region 16, and a periphery portion located outside the high line density region 16.

The fourth dielectric layer 144 and the fourth circuit layer 154 may be disposed on the fifth dielectric layer 145. A portion (i.e., a via portion) of the fourth circuit layer 154 extends through the fifth dielectric layer 145 to be exposed from a bottom surface of the fifth dielectric layer 145 (e.g., the second surface 12 of the wiring structure 1). A material of the fifth dielectric layer 145 may be the same as or similar to the material of the fourth dielectric layer 144. As shown in FIG. 2 and FIG. 3, the second electronic devices 26, 26' may be electrically connected to the first electronic device 24 through the interconnection portion 15a of the circuit layer 15 (including, for example, the interconnection portions 15a of the first circuit layer 151, the second circuit layer 152, the third circuit layer 153 and the fourth circuit layer 154). The second electronic devices 26, 26' and the first electronic device 24 may be electrically connected to the solder materials 36 through the via portions of the periphery portion 15b of the circuit layer 15 (including, for example, the periphery portions 15b of the first circuit layer 151, the second circuit layer 152, the third circuit layer 153 and the fourth circuit layer 154).

The protrusion pads 20 may be disposed on and protrude from the first dielectric layer 141 (i.e., the topmost dielectric layer or the outermost dielectric layer) of the wiring structure 1. The protrusion pads 20 may be disposed on and protrude from the first surface 11 of the wiring structure 1, and extend through the first dielectric layer 141 (i.e., the topmost dielectric layer or the outermost dielectric layer) to electrically connect the first circuit layer 151.

The first electronic device 24 and the second electronic devices 26, 26' are disposed adjacent to or disposed on the first surface 11 of the wiring structure 1 side by side, and are electrically connected to the circuit layer 15 of the wiring structure 1. The first electronic device 24 may be a semiconductor device such as an application specific integrated circuit (ASIC) die. As shown in FIG. 1 to FIG. 3, the first electronic device 24 has a first active surface 241 (e.g., bottom surface), a first backside surface 242 (e.g., top surface), a first lateral side surface 243*a*, a second lateral side surface 243*b*, a third lateral side surface 243*c* and a fourth lateral side surface 243*d*. The first backside surface 242 is opposite to the first active surface 241. All of the first lateral side surface 243*a*, the second lateral side surface 243*b*, the third lateral side surface 243*c* and the fourth lateral side surface 243*d* extend between the first active surface 241 and the first backside surface 242. The first lateral side surface 243*a* faces to the second electronic devices 26, 26'. The second lateral side surface 243*b* is opposite to the first lateral side surface 243*a*. The fourth lateral side surface 243*d* is opposite to the third lateral side surface 243*c*.

Further, the first electronic device 24 may include a plurality of electrical contacts 244. The electrical contacts 244 may be disposed adjacent to the first active surface 241. Alternatively, the electrical contacts 244 may be exposed or may protrude from the first active surface 241 for electrical connection. The electrical contacts 244 may be pads, bumps, studs, pillars or posts. In some embodiments, the electrical contacts 244 of the first electronic device 24 may be electrically connected and physically connected to the protrusion pads 20 through a plurality of solder materials 245. In other words, the first electronic device 24 may be electrically connected to the wiring structure 1 by flip-chip bonding.

The second electronic device 26 may be a semiconductor device such as high bandwidth memory (HBM) die. The second electronic device 26 has a second active surface 261 (e.g., bottom surface), a second backside surface 262 (e.g., top surface), a first lateral side surface 263*a*, a second lateral side surface 263*b*, a third lateral side surface 263*c* and a fourth lateral side surface 263*d*. The first lateral side surface 263*a* faces to the first electronic device 24. The second backside surface 262 is opposite to the second active surface 261. All of the first lateral side surface 263*a*, the second lateral side surface 263*b*, the third lateral side surface 263*c* and the fourth lateral side surface 263*d* extend between the second active surface 261 and the second backside surface 262. The second lateral side surface 263*b* is opposite to the first lateral side surface 263*a*. The fourth lateral side surface 263*d* is opposite to the third lateral side surface 263*c*.

Further, the second electronic device 26 may include a plurality of electrical contacts 264 disposed adjacent to the second active surface 261. The electrical contacts 264 may be exposed or may protrude from the second active surface 261 for electrical connection. The electrical contacts 264 may be pads, bumps, studs, pillars or posts. In some embodiments, the electrical contacts 264 of the second electronic device 26 may be electrically connected and bonded to the protrusion pads 20 through a plurality of solder materials 265. In other words, the second electronic device 26 may be bonded to the wiring structure 1 by flip-chip bonding. As shown in FIG. 2 and FIG. 3, the second electronic device 26 may include a logic die 266, a plurality of memory dice 267, a top die 268 and a package body 269 (e.g., a molding compound). The top die 268 and the memory dice 267 may be stacked on a top surface of the logic die 266. The package body 269 may cover the top die 268, the memory dice 267 and a portion of the top surface of the logic die 266.

As shown in FIG. 2 and FIG. 3, a central gap 30 is formed between the first lateral side surface 243*a* of the first electronic device 24 and the first lateral side surface 263*a* of the second electronic device 26. A width G of the central gap 30 may be defined as a minimum distance between the first lateral side surface 243*a* of the first electronic device 24 and the first lateral side surface 263*a* of the second electronic device 26. The width G of the central gap 30 may be less than or equal to about 100 µm, less than or equal to about 70 µm, or less than or equal to about 50 µm.

As shown in FIG. 2 and FIG. 3, the first underfill 31 may be disposed in a first space 25 between the first electronic device 24 and the wiring structure 1 so as to cover and protect the joints formed by the electrical contacts 244, the protrusion pads 20 and the solder materials 245. Further, the second underfill 32 may be disposed in a second space 27 between the second electronic device 26 and the wiring structure 1 so as to cover and protect the joints formed by the electrical contacts 264, the protrusion pads 20 and the solder materials 265. In addition, the stiff bonding material 33 may be disposed in the central gap 30 between the first electronic device 24 and the second electronic device 26. The stiff bonding material 33 may be a homogeneous material (e.g., resin) without fillers. It is noted that the stiff bonding material 33 is different from the first underfill 31 and the second underfill 32. In some embodiments, a Young's Modulus of the stiff bonding material 33 is greater than a Young's modulus of the first underfill 31 and a Young's modulus of the second underfill 32. A coefficient of thermal expansion (CTE) of the stiff bonding material 33 is greater than a CTE of the first underfill 31 and a CTE of the second underfill 32.

Further, the Young's Modulus of the stiff bonding material 33 may be greater than or equal to a Young's modulus of the first electronic device 24 and a Young's modulus of the second electronic device 26. The CTE of the stiff bonding material 33 may be greater than or equal to a CTE of the first electronic device 24 and a CTE of the second electronic device 26. In addition, the Young's Modulus of the stiff bonding material 33 may be greater than or equal to a Young's modulus of the wiring structure 1. The CTE of the stiff bonding material 33 may be greater than or equal to a CTE of the wiring structure 1. In some embodiments, a Young's Modulus of the stiff bonding material 33 may be about 3 GPa to about 20 Gpa, and a CTE of the stiff bonding material 33 may be about 30 ppm/° ° C. to about 60 ppm/° C. In some embodiments, a Young's Modulus of the stiff bonding material 33 may be about 6 GPa to about 35 Gpa, and a CTE of the stiff bonding material 33 may be about 5 ppm/C to about 35 ppm/C.

The stiff bonding material 33 may have a top surface 331 and a bottom surface 332. The top surface 331 may be substantially coplanar with the first backside surface 242 of the first electronic device 24 and the second backside surface 262 of the second electronic device 26. The bottom surface 332 may be a curved surface that extends between a bottom edge of the first electronic device 24 and a bottom edge of the second electronic device 26 since the first underfill 31 and the second underfill 32 are formed integrally and concurrently by dispensing. Thus, the bottom portion of the stiff bonding material 33 extends beyond the first active surface 241 of the first electronic device 24 and/or the second active surface 261 of the second electronic device 26. In addition, an extending portion 311 of the first underfill 31 may extend to or may be disposed on the second lateral side surface 243*b* of the first electronic device 24, and an extending portion 321 of the second underfill 32 may extend to or may be disposed on the second lateral side surface 263*b* of the second electronic device 26.

The encapsulant 34 may cover at least a portion of the first electronic device 24, at least a portion of the second electronic device 26, the first underfill 31, the second underfill 32, the stiff bonding material 33 and a portion of the first surface 11 of the wiring structure 1. A material of the encapsulant 34 may be a molding compound with or without fillers. The encapsulant 34 may have a first surface 341 (e.g., a top surface) and a lateral side surface 343. As shown in FIG. 2 and FIG. 3, the first surface 341 of the encapsulant 34, the first backside surface 242 of the first electronic device 24, the second backside surface 262 of the second electronic device 26 and the top surface 331 of the stiff bonding material 33 may be substantially coplanar with each other. In addition, the lateral side surface 343 of the encapsulant 34 may be substantially coplanar with the lateral side surface 13 of the wiring structure 1. In some embodiments, the Young's modulus of the stiff bonding material 33 may be greater than a Young's modulus of the encapsulant 34. The coefficient of thermal expansion (CTE) of the stiff bonding material 33 may be greater than a CTE of the encapsulant 34.

The solder materials 36 (e.g., solder balls) may be disposed adjacent to the second surface 12 of the wiring structure 1 for external connection. As shown in FIG. 2 and FIG. 3, the solder materials 36 are disposed on the exposed portions (i.e., the bottom portions of the via portions) of the fourth circuit layer 154.

In the embodiment illustrated in FIG. 1 to FIG. 3, the first underfill 31 may completely fill the first space 25, the second underfill 32 may completely fill the second space 27, and the stiff bonding material 33 may completely fill the central gap 30. The stiff bonding material 33 is used to bond the first electronic device 24 and the second electronic device 26 stiffly and tightly so as to form a rigid assembly structure. That is, a bonding force between the stiff bonding material 33 and the first electronic device 24 is greater than a bonding force between the first underfill 31 and the first electronic device 24, and a bonding force between the stiff bonding material 33 and the second electronic device 26 is greater than a bonding force between the second underfill 32 and the second electronic device 26. As a result, the warpage of the rigid assembly structure and the package structure 3 may be reduced, and the delamination of the first underfill 31 and the second underfill 32 may be avoided. Further, since the stiff bonding material 33 has a relatively high CTE, the deformation or bending of the rigid assembly structure and the package structure 3 during temperature cycling may be reduced. Thus, the interconnection portion 15*a* of the circuit layer 15 may be protected from being damaged or broken. That is, the risk of formation of crack in the interconnection portion 15*a* of the circuit layer 15 is low. Therefore, the reliability and yield of the package structure 3 is improved.

Figure 4:
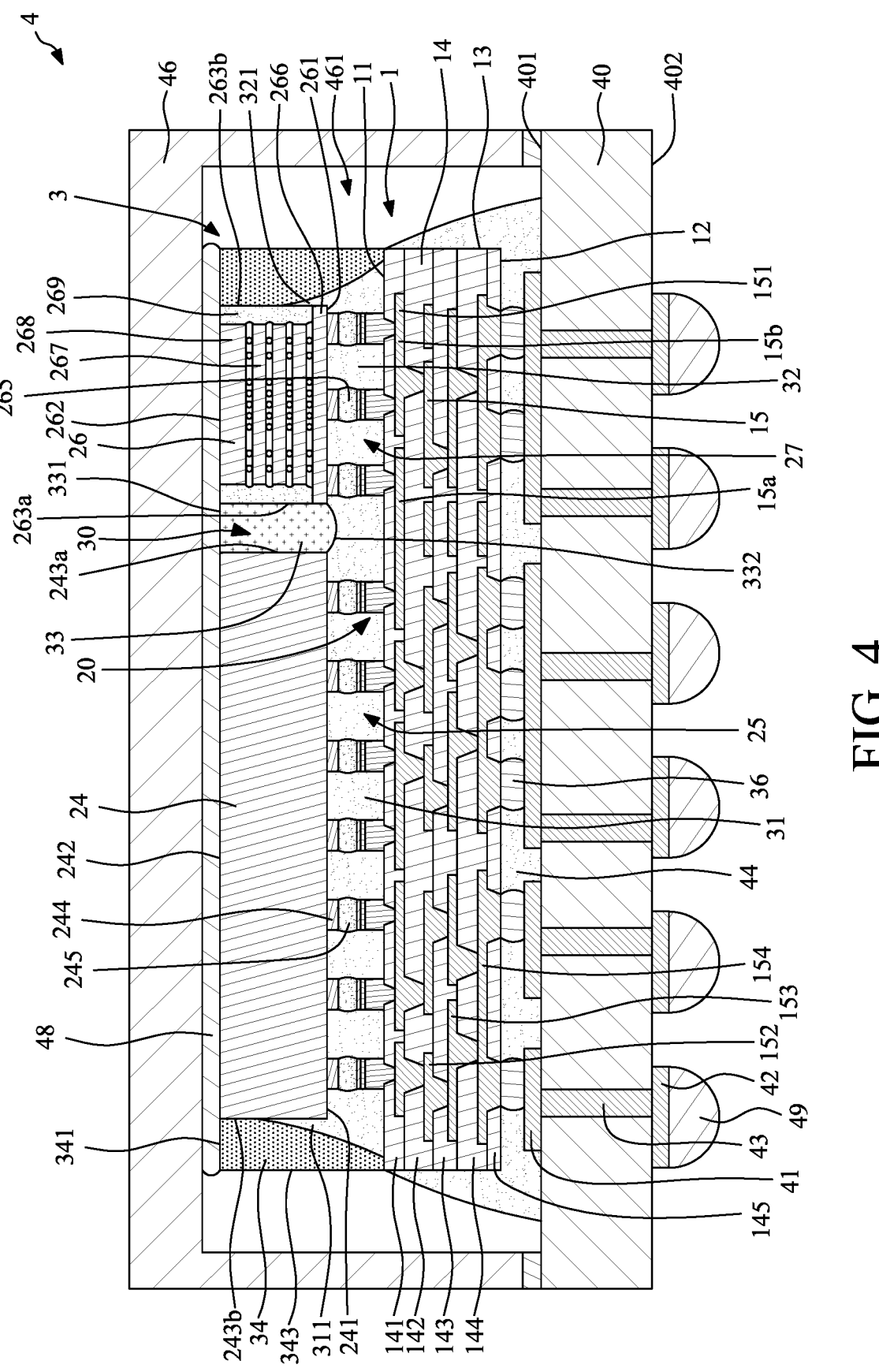
FIG. 4 illustrates a cross-sectional view of an assembly structure according to some embodiments of the present disclosure.

FIG. 4 illustrates a cross-sectional view of an assembly structure 4 according to some embodiments of the present disclosure. The assembly structure 4 may be a semiconductor package structure, and may include a base substrate 40, a package structure 3, a heat sink 46 and a plurality of external connectors 49. The base substrate 40 may include a glass reinforced epoxy material (such as FR4), bismaleimide triazine (BT), epoxy resin, silicon, printed circuit board (PCB) material, glass, ceramic or photoimageable dielectric (PID) material. The base substrate 40 may have a first surface 401 and a second surface 402 opposite to the first surface 401. As shown in FIG. 4, the base substrate 40 may include a first circuit layer 41, a second circuit layer 42, and a plurality of conductive vias 43. The first circuit layer 41 may be disposed adjacent to the first surface 401 of the base substrate 40, and the second circuit layer 42 may be disposed adjacent to the second surface 402 of the base substrate 40. The conductive vias 43 may extend through the base substrate 40 and electrically connect the first circuit layer 41 and the second circuit layer 42.

The package structure 3 of FIG. 4 may be same as or similar to the package structure 3 of FIG. 1 to FIG. 3. The package structure 3 may be electrically connected to the first circuit layer 41 of the base substrate 40 through the solder materials 36. A protection material 44 (i.e., an underfill) may be further included in a space between the package structure 3 and the base substrate 40 so as to cover and protect the solder materials 36 and the first circuit layer 41. Further, the heat sink 46 may be a cap structure or a hat structure, and may define a cavity 461 for accommodating the package structure 3. A material of the heat sink 46 may include metal such as copper, aluminum, and/or other suitable material. A portion of the heat sink 46 may be attached to the top surface of the package structure 3 through a thermal material 48 (e.g., thermal interface material (TIM)) so as to dissipate the heat generated by the first electronic device 24 and the second electronic devices 26, 26'. Another portion (e.g., bottom portion) of the heat sink 46 may be attached to the first surface 401 of the base substrate 40 through an adhesive material. In addition, the external connectors 49 (e.g., solder balls) are formed or disposed on the second circuit layer 42 for external connection. In some embodiments, the Young's Modulus of the stiff bonding material 33 may be greater than a Young's modulus of the heat sink 46. The CTE of the stiff bonding material 33 may be greater than a CTE of the heat sink 46.

Figure 5:
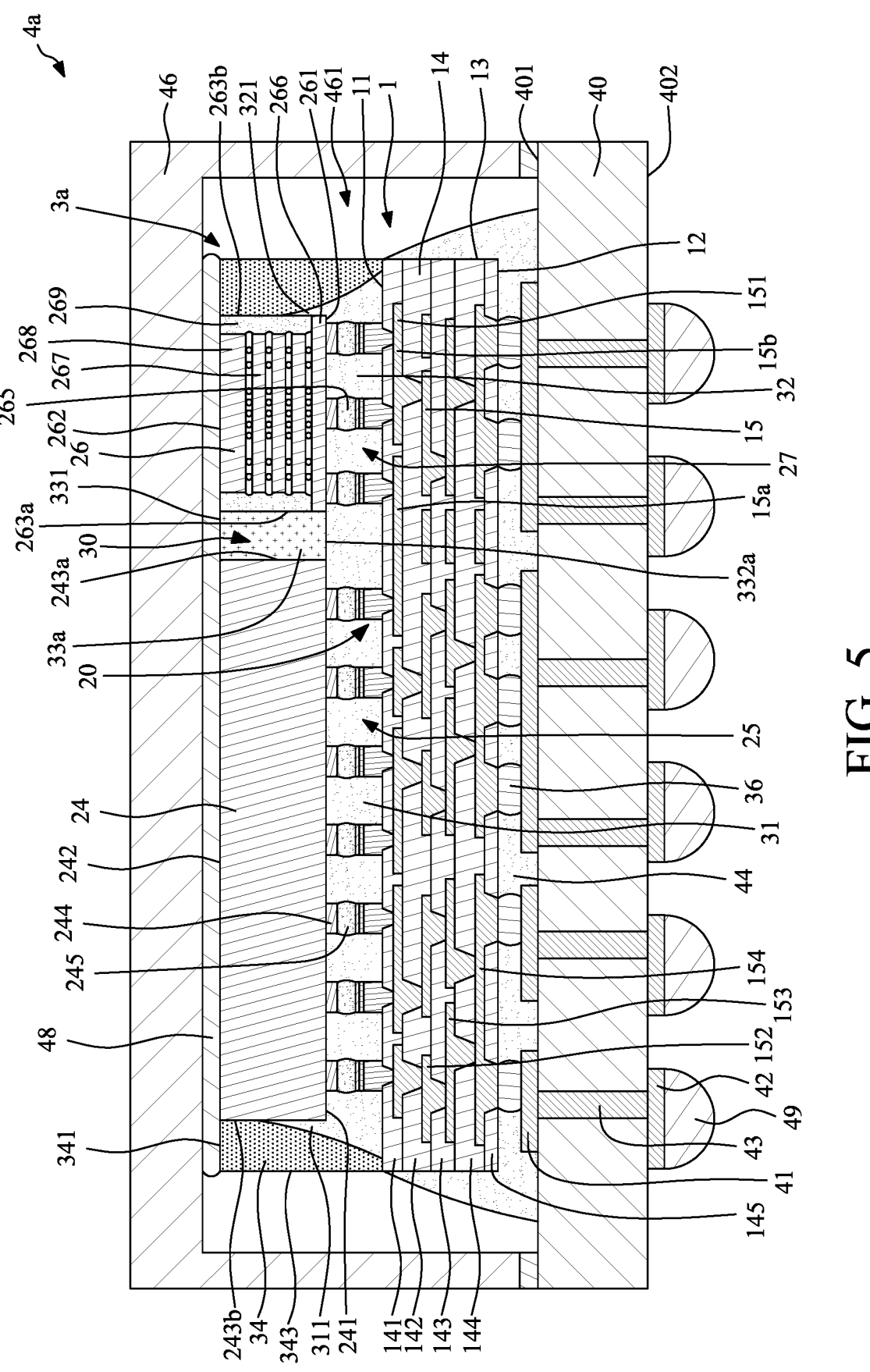
FIG. 5 illustrates a cross-sectional view of an assembly structure according to some embodiments of the present disclosure.

FIG. 5 illustrates a cross-sectional view of an example of an assembly structure 4*a* according to some embodiments of the present disclosure. The assembly structure 4*a* of FIG. 5 is similar to the assembly structure 4 of FIG. 4, except for a structure of the stiff bonding material 33*a* of the package structure 3*a*. As shown in FIG. 5, the bottom surface 332*a* of the stiff bonding material 33*a* may be substantially coplanar with the first active surface 241 of the first electronic device 24 and/or the second active surface 261 of the second electronic device 26. Thus, the bottom portion of the stiff bonding material 33 does not extend beyond the first active surface 241 of the first electronic device 24 and/or the second active surface 261 of the second electronic device 26.

Figure 6:
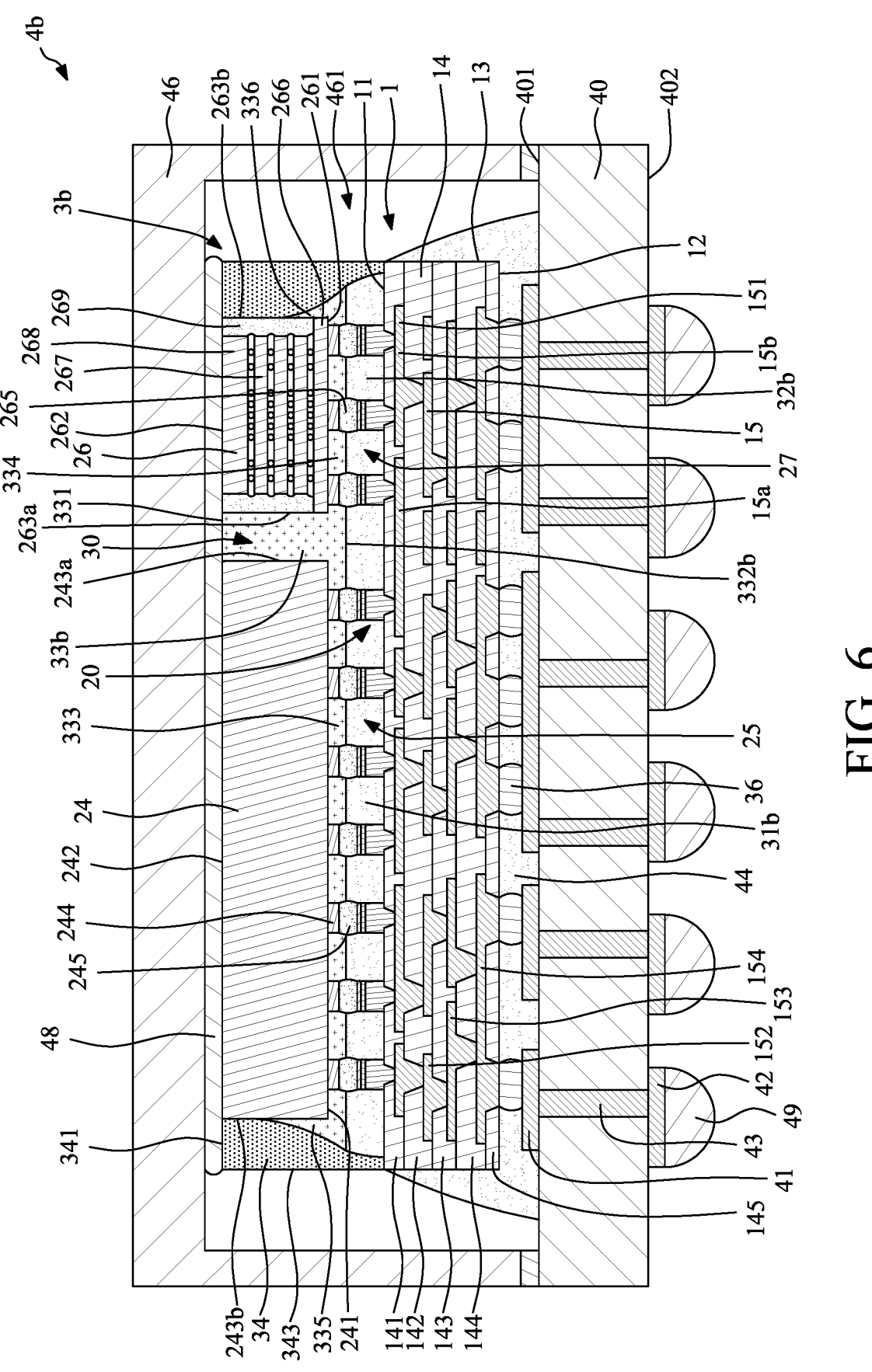
FIG. 6 illustrates a cross-sectional view of an assembly structure according to some embodiments of the present disclosure.

FIG. 6 illustrates a cross-sectional view of an example of an assembly structure 4*b* according to some embodiments of the present disclosure. The assembly structure 4*b* of FIG. 6 is similar to the assembly structure 4 of FIG. 4, except for structures of the stiff bonding material 33*b*, the first underfill 31*b* and the second underfill 32*b* of the package structure 3*b*. As shown in FIG. 6, the first underfill 31*b* may not completely fill the first space 25, and a first portion 333 of the stiff bonding material 33*b* may be further disposed in a first gap between the first underfill 31*b* and the first electronic device 24. Further, the second underfill 32*b* may not completely fill the second space 27, and a second portion 334 of the stiff bonding material 33*b* may be further disposed in a second gap between the second underfill 32*b* and the second electronic device 26. In some embodiments, a first extending portion 335 of the stiff bonding material 33*b* may extend to or may be disposed on the second lateral side surface 243*b* of the first electronic device 24, and a second extending portion 336 of the stiff bonding material 33*b* may extend to or may be disposed on the second lateral side surface 263b of the second electronic device 26.

Figure 7:
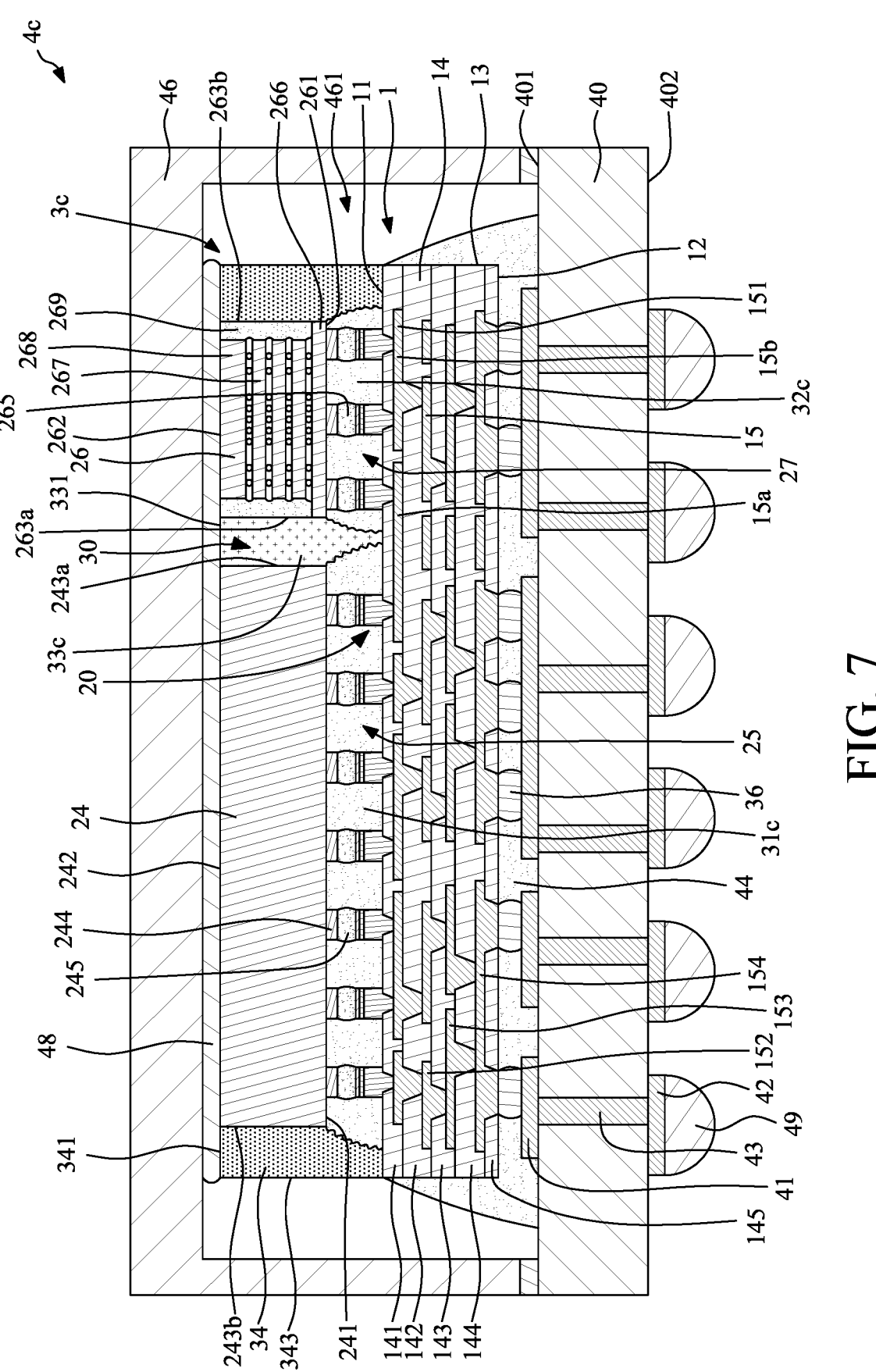
FIG. 7 illustrates a cross-sectional view of an assembly structure according to some embodiments of the present disclosure.

FIG. 7 illustrates a cross-sectional view of an example of an assembly structure 4c according to some embodiments of the present disclosure. The assembly structure 4c of FIG. 7 is similar to the assembly structure 4 of FIG. 4, except for structures of the stiff bonding material 33c, the first underfill 31c and the second underfill 32c of the package structure 3c. As shown in FIG. 7, the first underfill 31c is formed from a first film type material, and the second underfill 32c is formed from a second film type material. Further, the first underfill 31c and the second underfill 32c may be separated from each other. That is, the first underfill 31c and the second underfill 32c may be not formed integrally. In addition, the stiff bonding material 33c may be further disposed in a gap between the first underfill 31c and the second underfill 32c. In some embodiments, the stiff bonding material 33c may contact the first underfill 31c, the second underfill 32c and the first surface 11 of the wiring structure 1.

Figure 8:
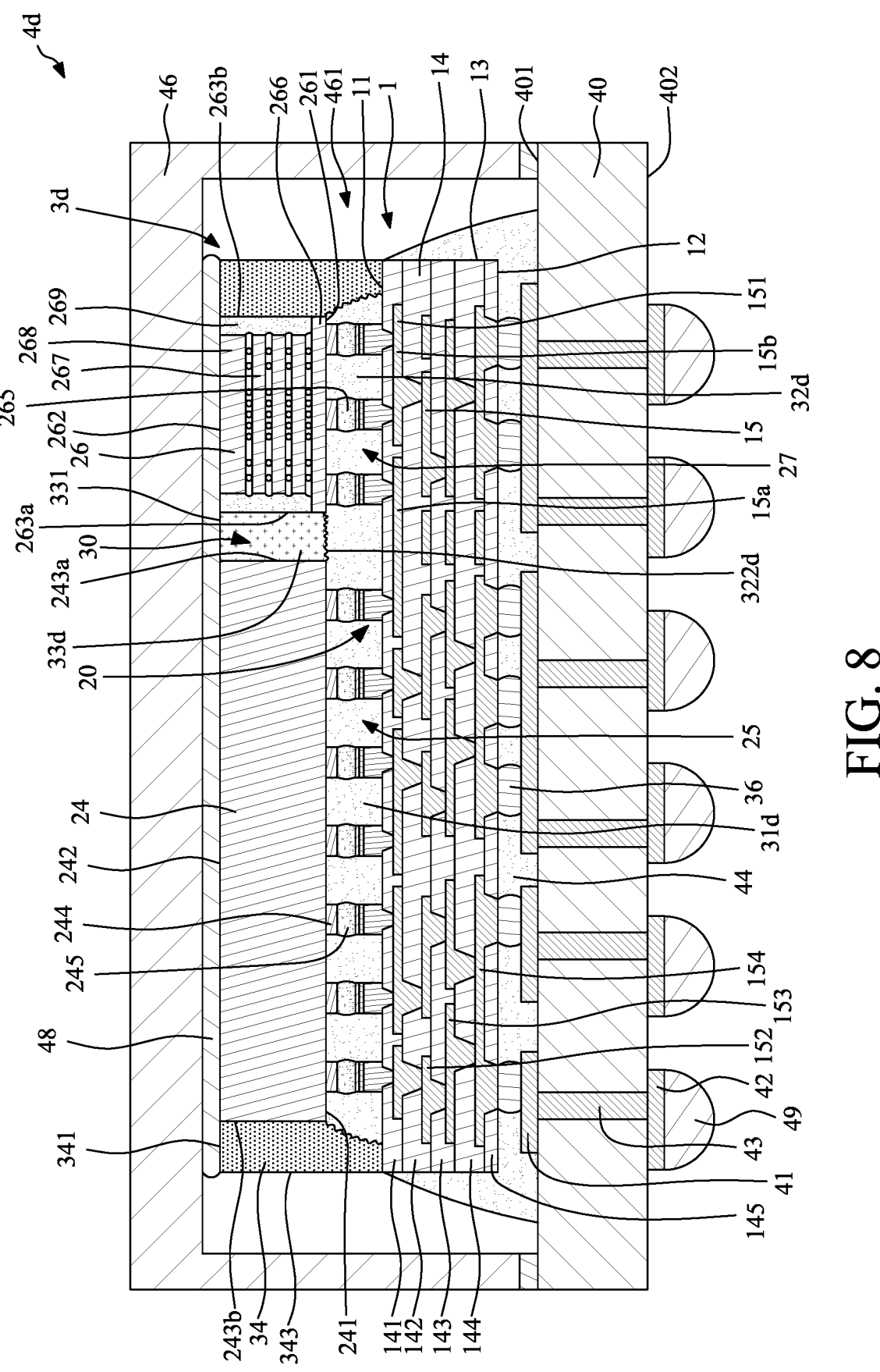
FIG. 8 illustrates a cross-sectional view of an assembly structure according to some embodiments of the present disclosure.

FIG. 8 illustrates a cross-sectional view of an example of an assembly structure 4d according to some embodiments of the present disclosure. The assembly structure 4d of FIG. 8 is similar to the assembly structure 4c of FIG. 7, except for structures of the stiff bonding material 33d, the first underfill 31d and the second underfill 32d of the package structure 3d. As shown in FIG. 8, the first underfill 31d is formed from a first film type material, and the second underfill 32d is formed from a second film type material. However, the first underfill 31d and the second underfill 32d may be combined or merged together during a thermal process. That is, the first underfill 31d and the second underfill 32d may be formed integrally. As shown in FIG. 8, the bottom surface 332d of the stiff bonding material 33d may be substantially coplanar with the first active surface 241 of the first electronic device 24 and/or the second active surface 261 of the second electronic device 26. Thus, the bottom portion of the stiff bonding material 33d does not extend beyond the first active surface 241 of the first electronic device 24 and/or the second active surface 261 of the second electronic device 26.

Figure 9:
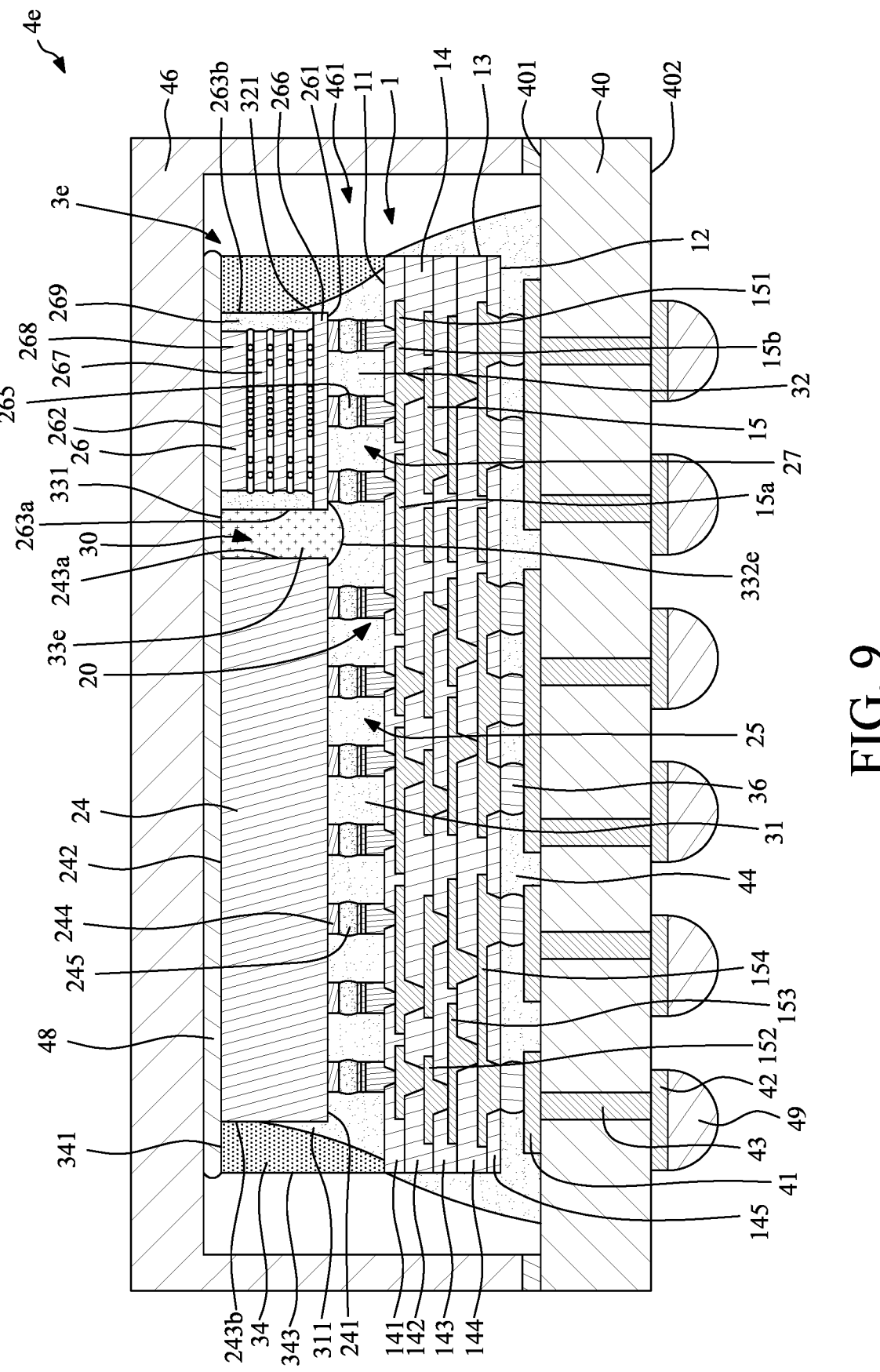
FIG. 9 illustrates a cross-sectional view of an assembly structure according to some embodiments of the present disclosure.

FIG. 9 illustrates a cross-sectional view of an example of an assembly structure 4e according to some embodiments of the present disclosure. The assembly structure 4e of FIG. 9 is similar to the assembly structure 4 of FIG. 4, except for a structure of the stiff bonding material 33e. As shown in FIG. 9, the bottom portion of the stiff bonding material 33e extends to cover a portion of the first active surface 241 of the first electronic device 24 and/or a portion of the second active surface 261 of the second electronic device 26. Thus, the bottom surface 332e of the stiff bonding material 33e extends between the first active surface 241 of the first electronic device 24 and the second active surface 261 of the second electronic device 26.

Figure 10:
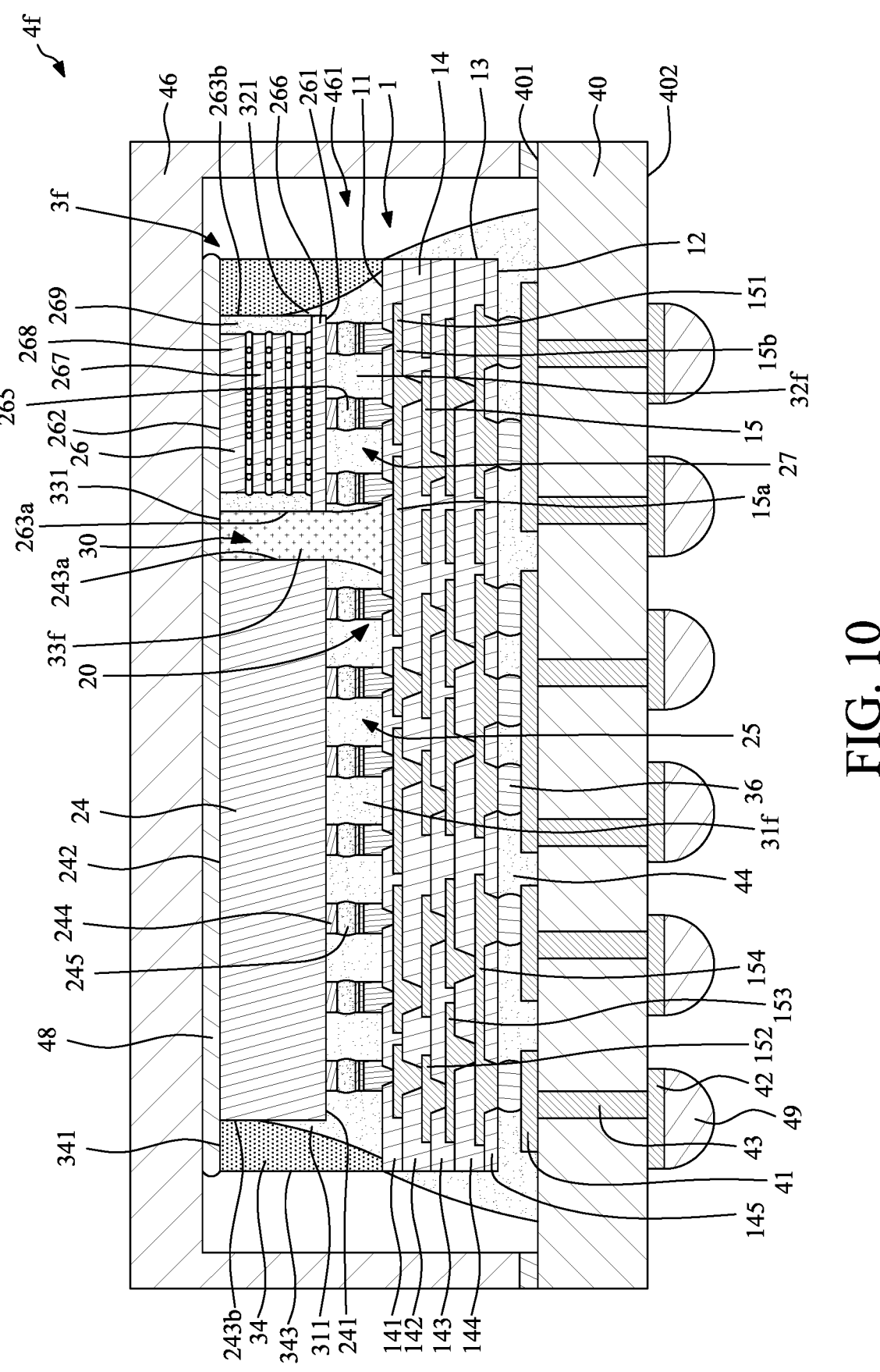
FIG. 10 illustrates a cross-sectional view of an assembly structure according to some embodiments of the present disclosure.

FIG. 10 illustrates a cross-sectional view of an example of an assembly structure 4f according to some embodiments of the present disclosure. The assembly structure 4f of FIG. 10 is similar to the assembly structure 4e of FIG. 9, except for structures of the stiff bonding material 33f, the first underfill 31f and the second underfill 32f of the package structure 3f. As shown in FIG. 10, the bottom portion of the stiff bonding material 33f extends to contact the first surface 11 of the wiring structure 1 so as to separate the first underfill 31f and the second underfill 32f.

FIG. 11 through FIG. 21 illustrate a method for manufacturing an assembly structure according to some embodiments of the present disclosure. In some embodiments, the method is for manufacturing the package structure 3 shown in FIG. 1 to FIG. 3, and the assembly structure 4 shown in FIG. 4.

Figure 11:
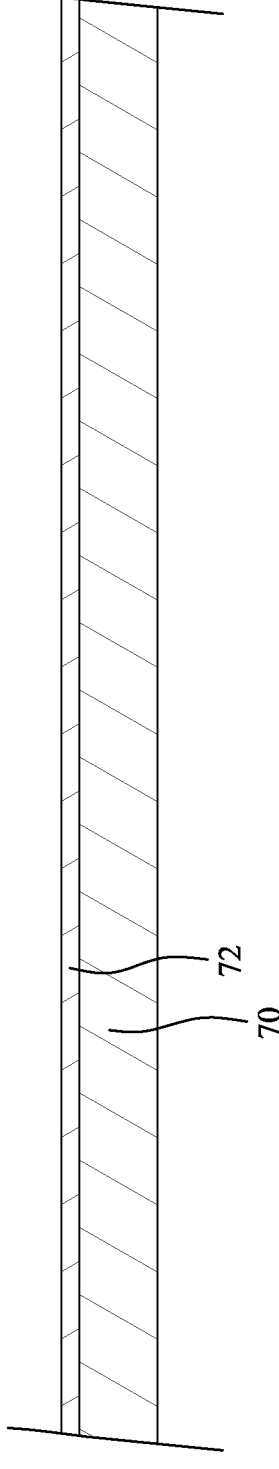
FIG. 11 illustrates one or more stages of an example of a method for manufacturing an assembly structure according to some embodiments of the present disclosure.
Figure 11:

Referring to FIG. 11, a carrier 70 is provided. The carrier 70 may include a release layer 72 disposed thereon.

Figure 12:
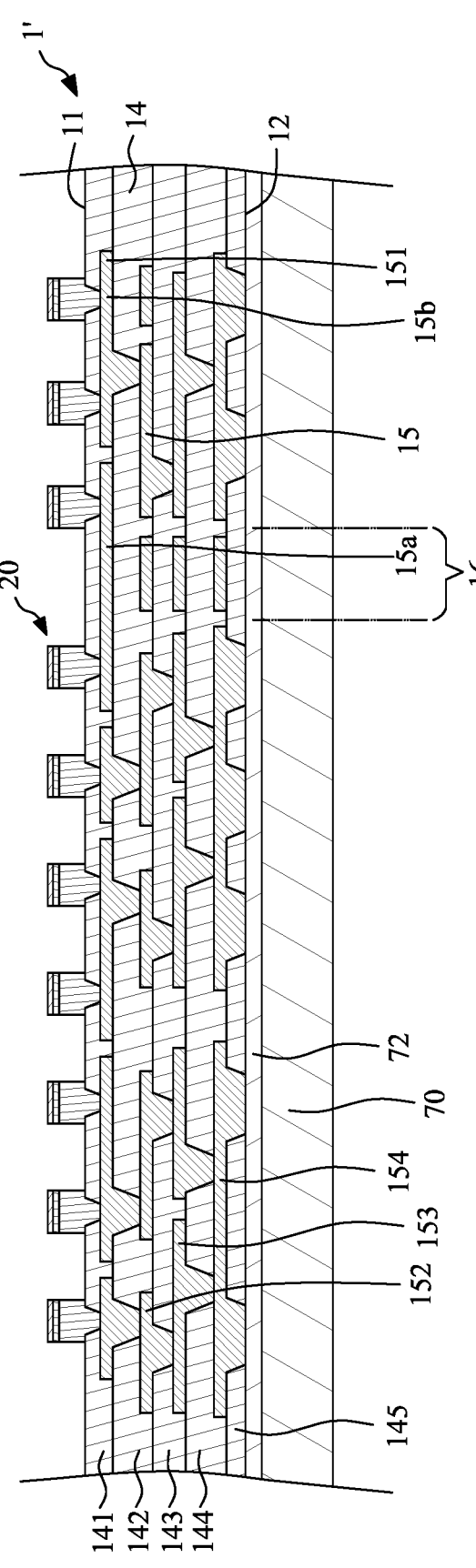
FIG. 12 illustrates one or more stages of an example of a method for manufacturing an assembly structure according to some embodiments of the present disclosure.

Referring to FIG. 12, a wiring structure 1' is formed or disposed on the release layer 72 on the carrier 70. The wiring structure 1' of FIG. 12 may be similar to the wiring structure 1 of FIG. 2 and FIG. 3, and may have a first surface 11, a second surface 12 opposite to the first surface 11, and a high density region 16 (or a fine line region). The wiring structure 1' may include at least one dielectric layer 14, at least one circuit layer 15 in contact with the dielectric layer 14 and a plurality of protrusion pads 20. For example, the wiring structure 1' includes a first dielectric layer 141, a first circuit layer 151, a second dielectric layer 142, a second circuit layer 152, a third dielectric layer 143, a third circuit layer 153, a fourth dielectric layer 144, a fourth circuit layer 154, and a fifth dielectric layer 145.

Figure 13:
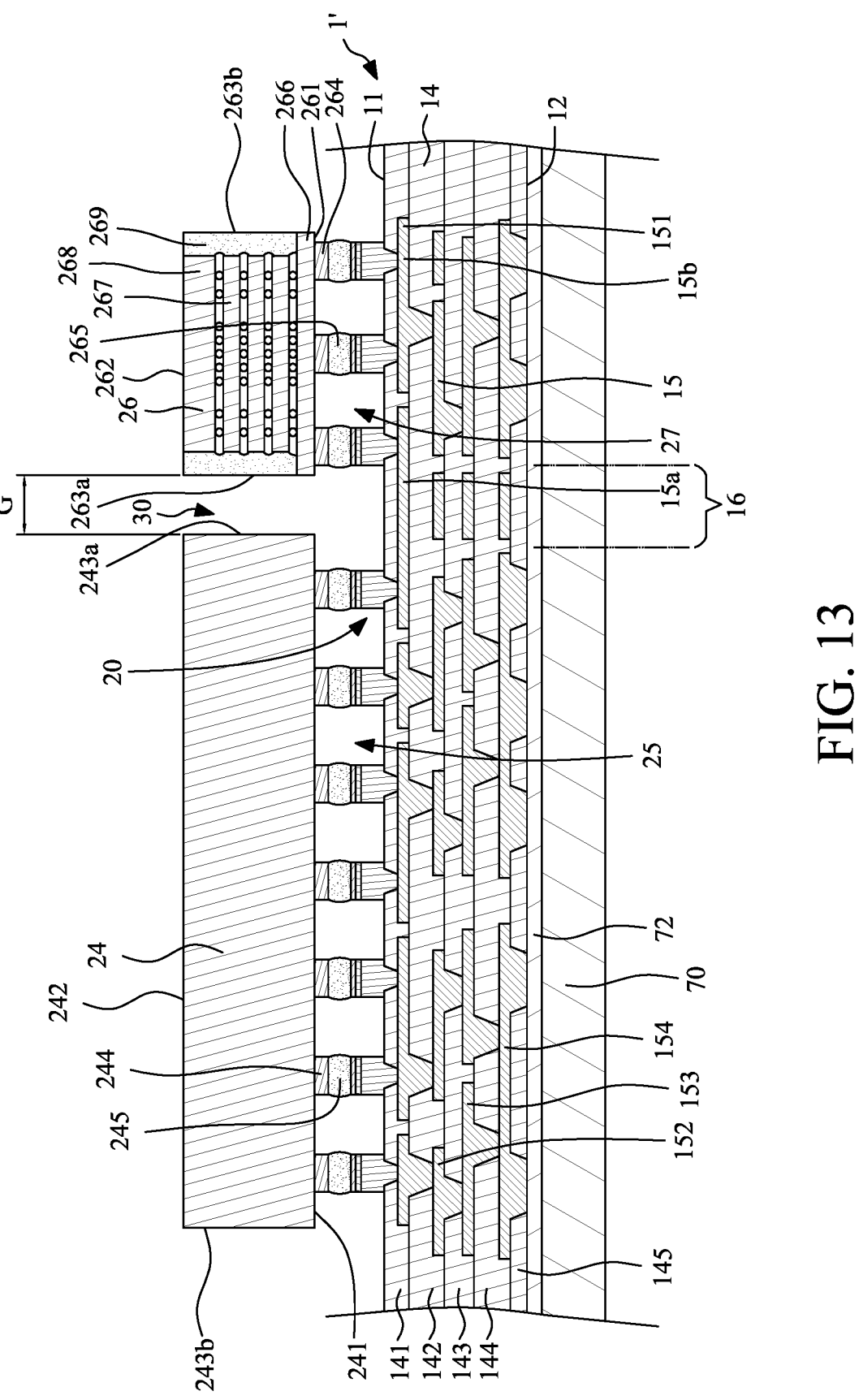
FIG. 13 illustrates one or more stages of an example of a method for manufacturing an assembly structure according to some embodiments of the present disclosure.

Referring to FIG. 13, a first electronic device 24 and a second electronic device 26 are provided. The first electronic device 24 and the second electronic device 26 of FIG. 13 may be similar to the first electronic device 24 and the second electronic device 26 of FIG. 2, respectively. Then, the first electronic device 24 and the second electronic device 26 are electrically connected to the circuit layer 15 of the wiring structure 1' by flip-chip bonding. Thus, the first electronic device 24 and the second electronic device 26 are disposed and bonded on the wiring structure 1' side by side, and the second electronic device 26 may be electrically connected to the first electronic device 24 through the interconnection portion 15a of the circuit layer 15. Meanwhile, a central gap 30 is formed between the first electronic device 24 and the second electronic device 26. The central gap 30 may be defined by the first lateral side surface 243a of the first electronic device 24 and the first lateral side surface 263a of the second electronic device 26.

Figure 14:
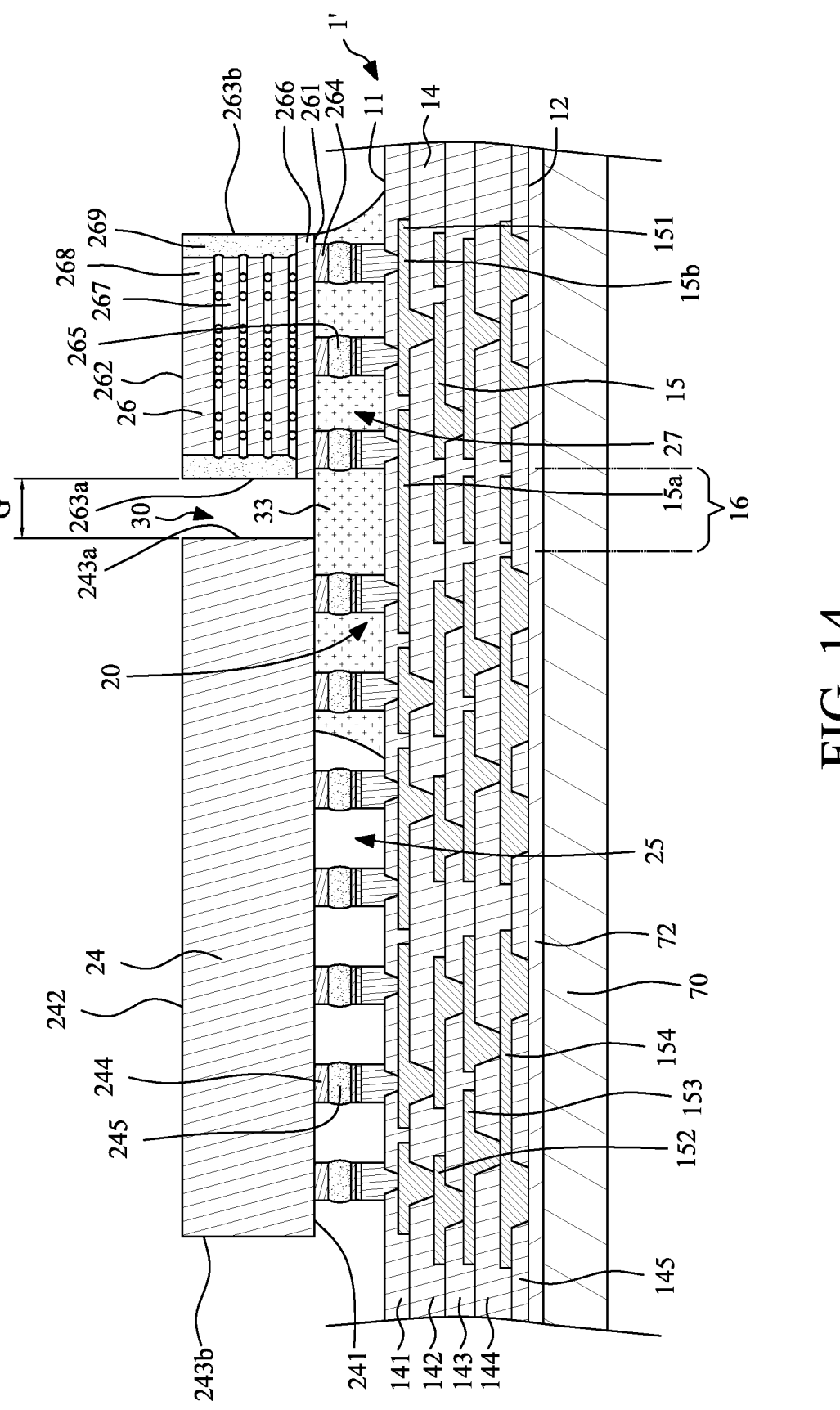
FIG. 14 illustrates one or more stages of an example of a method for manufacturing an assembly structure according to some embodiments of the present disclosure.

Referring to FIG. 14, a stiff bonding material 33 is applied or disposed in a first space 25 between the first electronic device 24 and the wiring structure 1', and/or in a second space 27 between the second electronic device 26 and the wiring structure 1'. In some embodiments, a viscosity of the stiff bonding material 33 may be about 10 Pa·s to about 90 Pa·s, and the stiff bonding material 33 may be applied or disposed by dispensing technique according to the method shown in FIG. 15.

Figure 15:
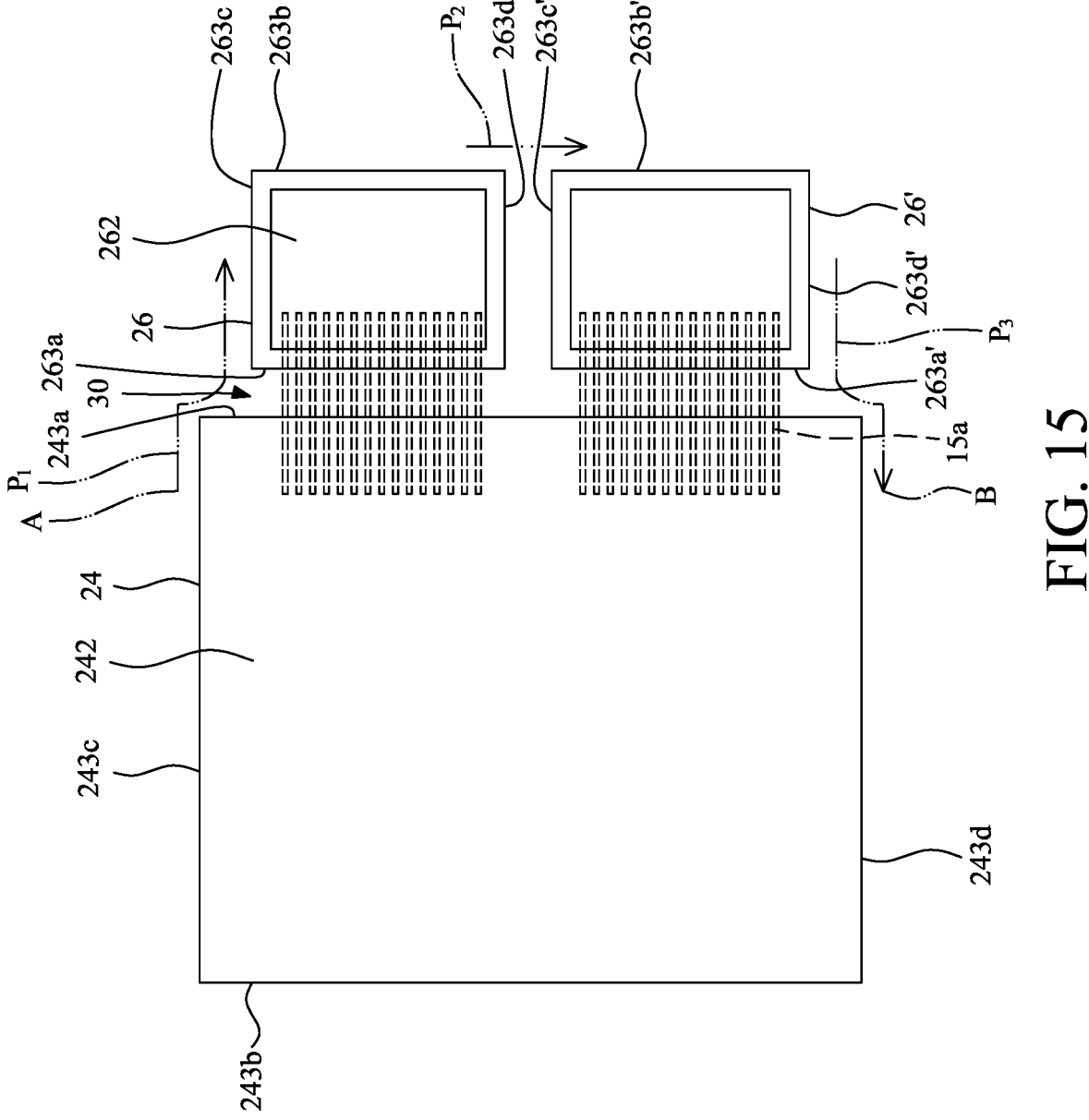
FIG. 15 illustrates one or more stages of an example of a method for manufacturing an assembly structure according to some embodiments of the present disclosure.
Figure 15A:
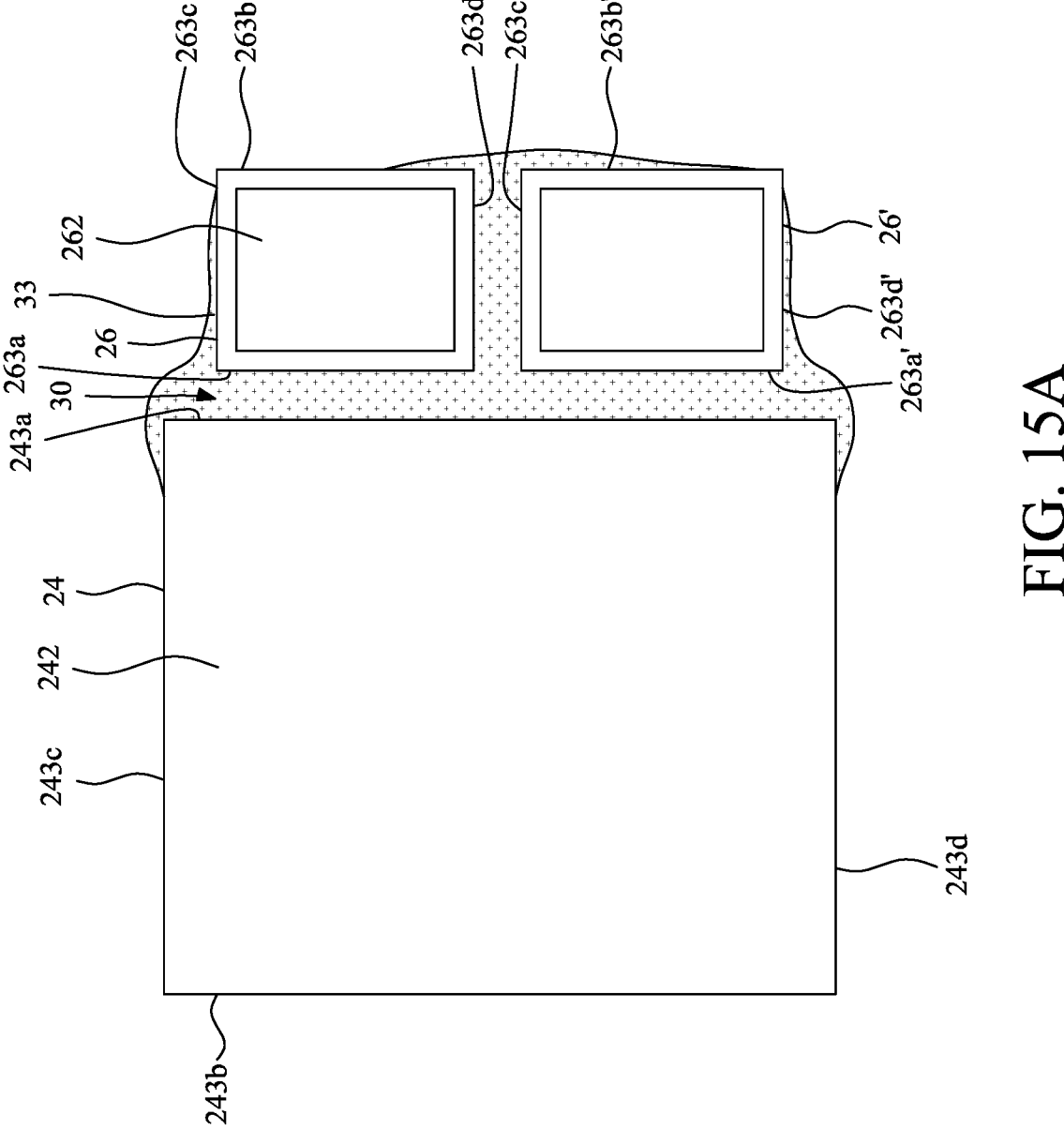
FIG. 15A illustrates one or more stages of an example of a method for manufacturing an assembly structure according to some embodiments of the present disclosure.

As shown in FIG. 15, from a top view, the stiff bonding material 33 is applied along a portion of a peripheral side edge of a combination of the first electronic device 24 and the second electronic devices 26, 26'. For example, the stiff bonding material 33 may be applied along the third lateral side surface 243c of the first electronic device 24 from a point "A" to the third lateral side surface 263c of the second electronic device 26, as shown in a first path $P_1$ of FIG. 15. Then, the stiff bonding material 33 may be further applied along the second lateral side surface 263b of the second electronic device 26 and the second lateral side surface 263b' of the second electronic device 26', as shown in a second path $P_2$ of FIG. 15. Then, the stiff bonding material 33 may be further applied along the fourth lateral side surface 263d' of the second electronic device 26' to a point "B" on the fourth lateral side surface 243d of the first electronic device 24, as shown in a third path $P_3$ of FIG. 15. That is, the stiff bonding material 33 may be applied from the point "A" to the point "B" along the peripheral side edge of a combination of the first electronic device 24 and the second electronic devices 26, 26'. Then, after the dispensing process, a top view of the first electronic device 24, the second electronic devices 26, 26' and the stiff bonding material 33 is shown as FIG. 15A.

Figure 16:
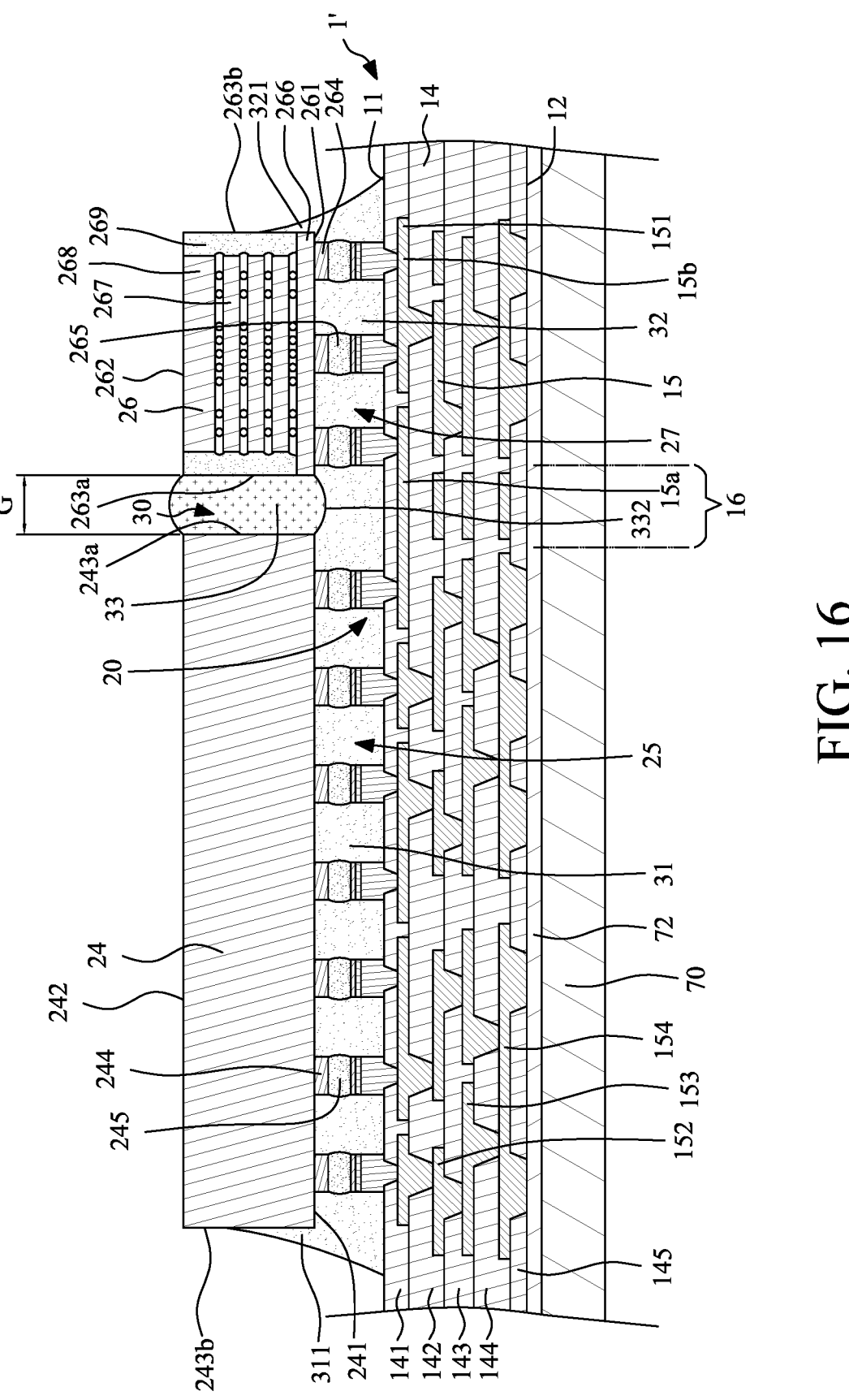
FIG. 16 illustrates one or more stages of an example of a method for manufacturing an assembly structure according to some embodiments of the present disclosure.

Referring to FIG. 16, a first underfill 31 and a second underfill 32 are applied or disposed in the first space 25 and the second space 27, respectively, to push the stiff bonding material 33 into the central gap 30. Meanwhile, the first underfill 31 may completely fill the first space 25, the second underfill 32 may completely fill the second space 27, and the stiff bonding material 33 may completely fill the central gap 30. In addition, the first underfill 31 and the second underfill 32 may be formed from an underfill material integrally and concurrently. The underfill material (including the first underfill 31 and the second underfill 32) is different from the stiff bonding material 33. For example, a density of the stiff bonding material 33 is less than a density of the underfill material (including the first underfill 31 and the second underfill 32), a viscosity of the stiff bonding material 33 is less than a viscosity of the underfill material (including the first underfill 31 and the second underfill 32), and a wettability of the stiff bonding material 33 is greater than a wettability of the underfill material (including the first underfill 31 and the second underfill 32). In some embodiments, the underfill material (including the first underfill 31 and the second underfill 32) may be applied or disposed by dispensing technique according to the method shown in FIG. 17.

Figure 17:
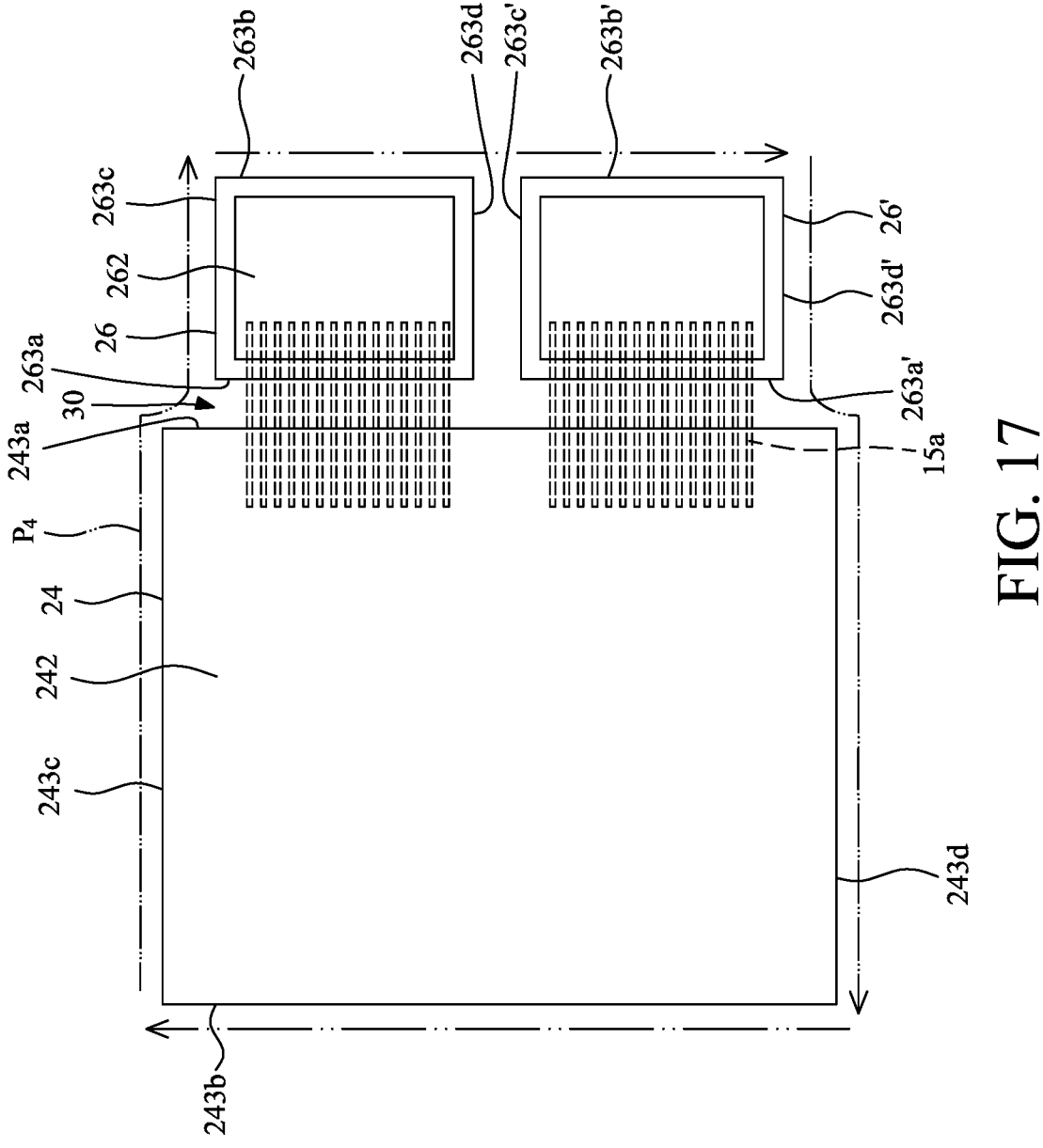
FIG. 17 illustrates one or more stages of an example of a method for manufacturing an assembly structure according to some embodiments of the present disclosure.
Figure 17A:
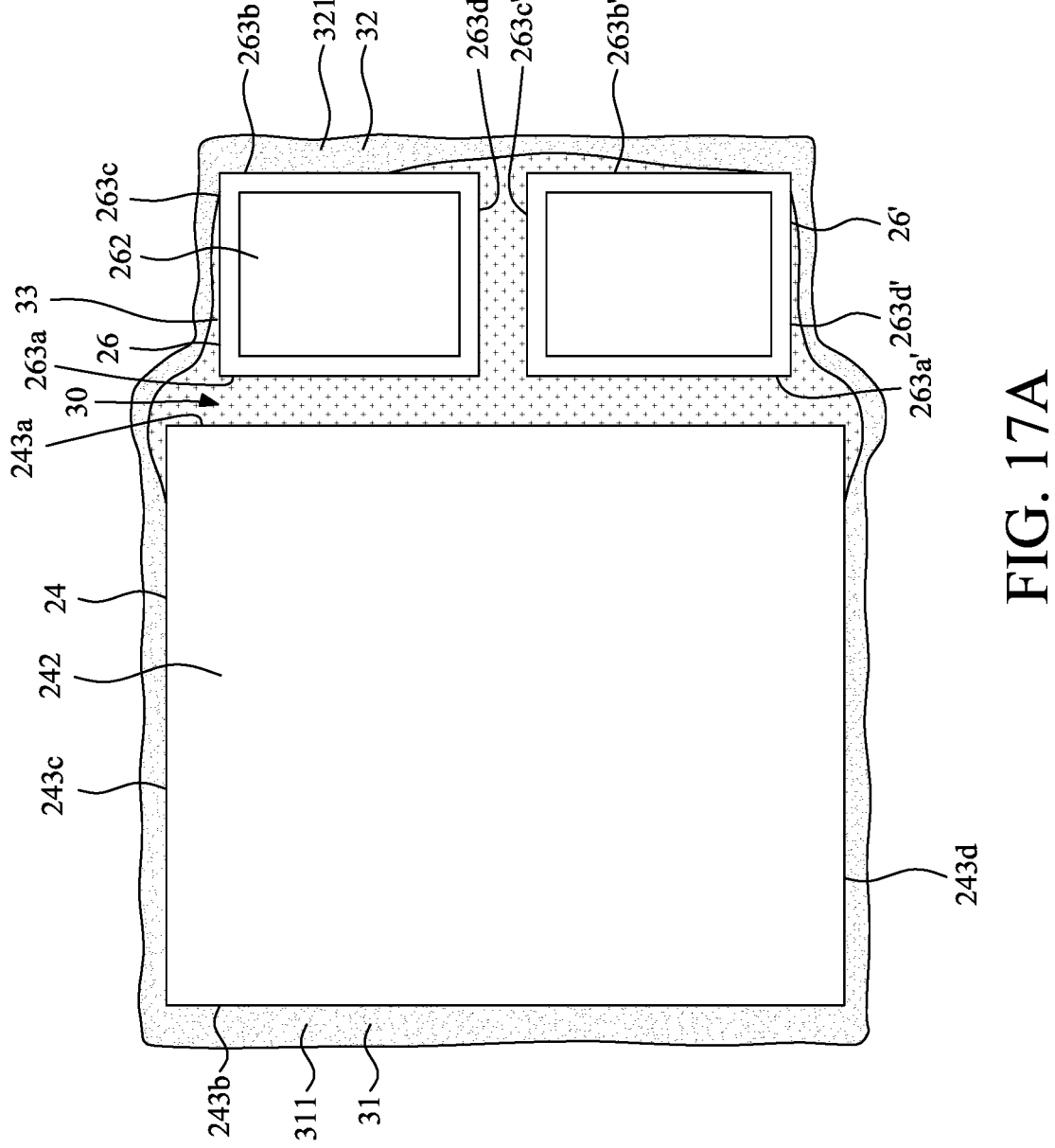
FIG. 17A illustrates one or more stages of an example of a method for manufacturing an assembly structure according to some embodiments of the present disclosure.

As shown in FIG. 17, from a top view, the underfill material (including the first underfill 31 and the second underfill 32) is applied along the entire of the peripheral side edge of a combination of the first electronic device 24 and the second electronic devices 26, 26'. For example, the underfill material (including the first underfill 31 and the second underfill 32) may be applied along the third lateral side surface 243c of the first electronic device 24, the third lateral side surface 263c of the second electronic device 26, the second lateral side surface 263b of the second electronic device 26, the second lateral side surface 263b' of the second electronic device 26', the fourth lateral side surface 263d' of the second electronic device 26', the fourth lateral side surface 243d of the first electronic device 24 and the second lateral side surface 243b of the first electronic device 24, as shown in a fourth path P$_4$ of FIG. 17. That is, the underfill material (including the first underfill 31 and the second underfill 32) may be applied according to the fourth path P$_4$ that is a substantially complete loop along the peripheral side edge of a combination of the first electronic device 24 and the second electronic devices 26, 26'. Then, after the dispensing process, a top view of the first electronic device 24, the second electronic devices 26, 26', the stiff bonding material 33 and the underfill material (including the first underfill 31 and the second underfill 32) is shown as FIG. 17A.

Figure 18:
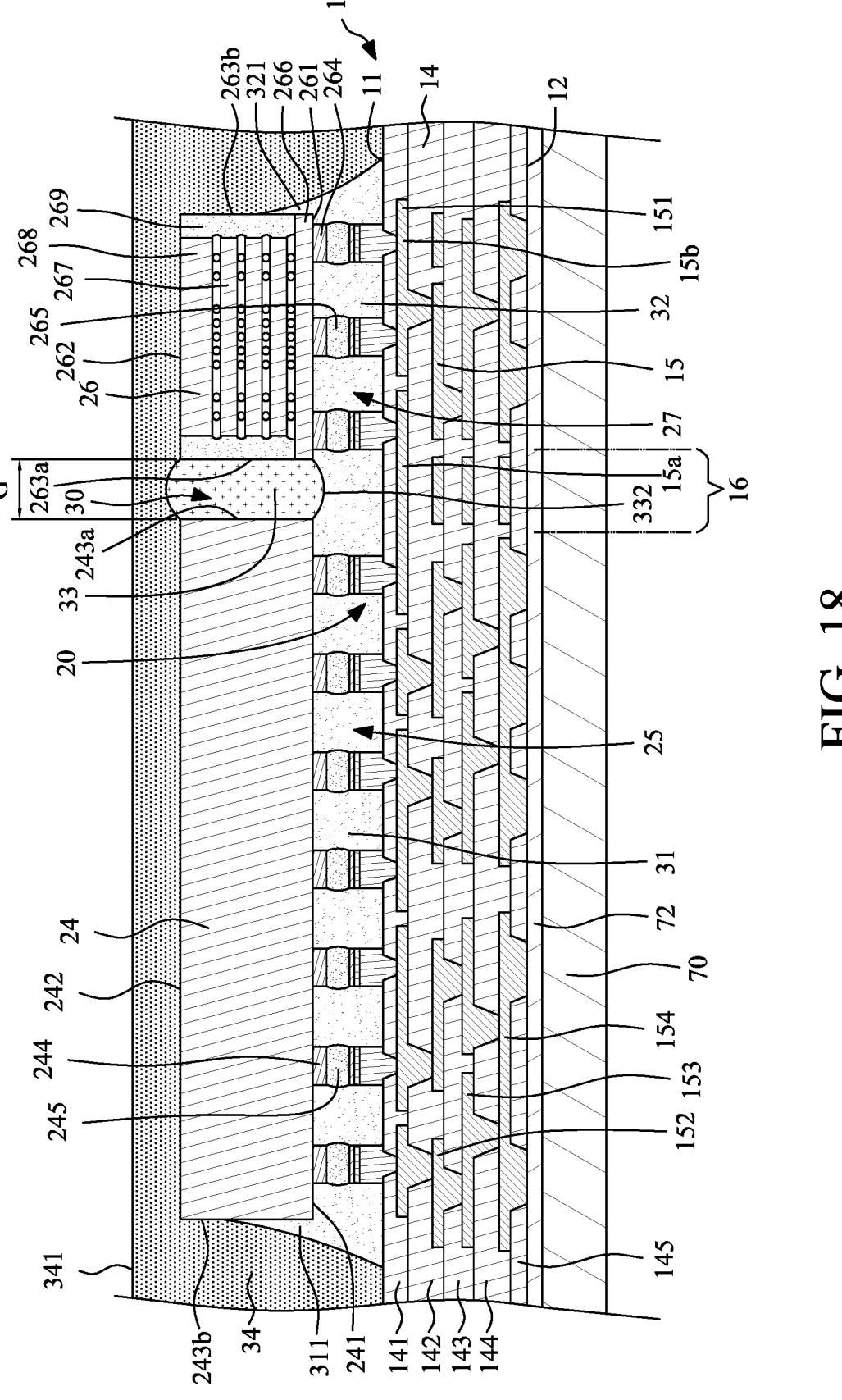
FIG. 18 illustrates one or more stages of an example of a method for manufacturing an assembly structure according to some embodiments of the present disclosure.

Referring to FIG. 18, the underfill material (including the first underfill 31 and the second underfill 32) and the stiff bonding material 33 may be cured. Then, an encapsulant 34 (e.g., a molding compound) may be formed or disposed to cover at least a portion of the first surface 11 of the wiring structure 1', at least a portion of the first electronic device 24, at least a portion of the second electronic device 26, the underfill material (including the first underfill 31 and the second underfill 32) and the stiff bonding material 33. The encapsulant 34 has a first surface 341 (e.g., a top surface).

Figure 19:
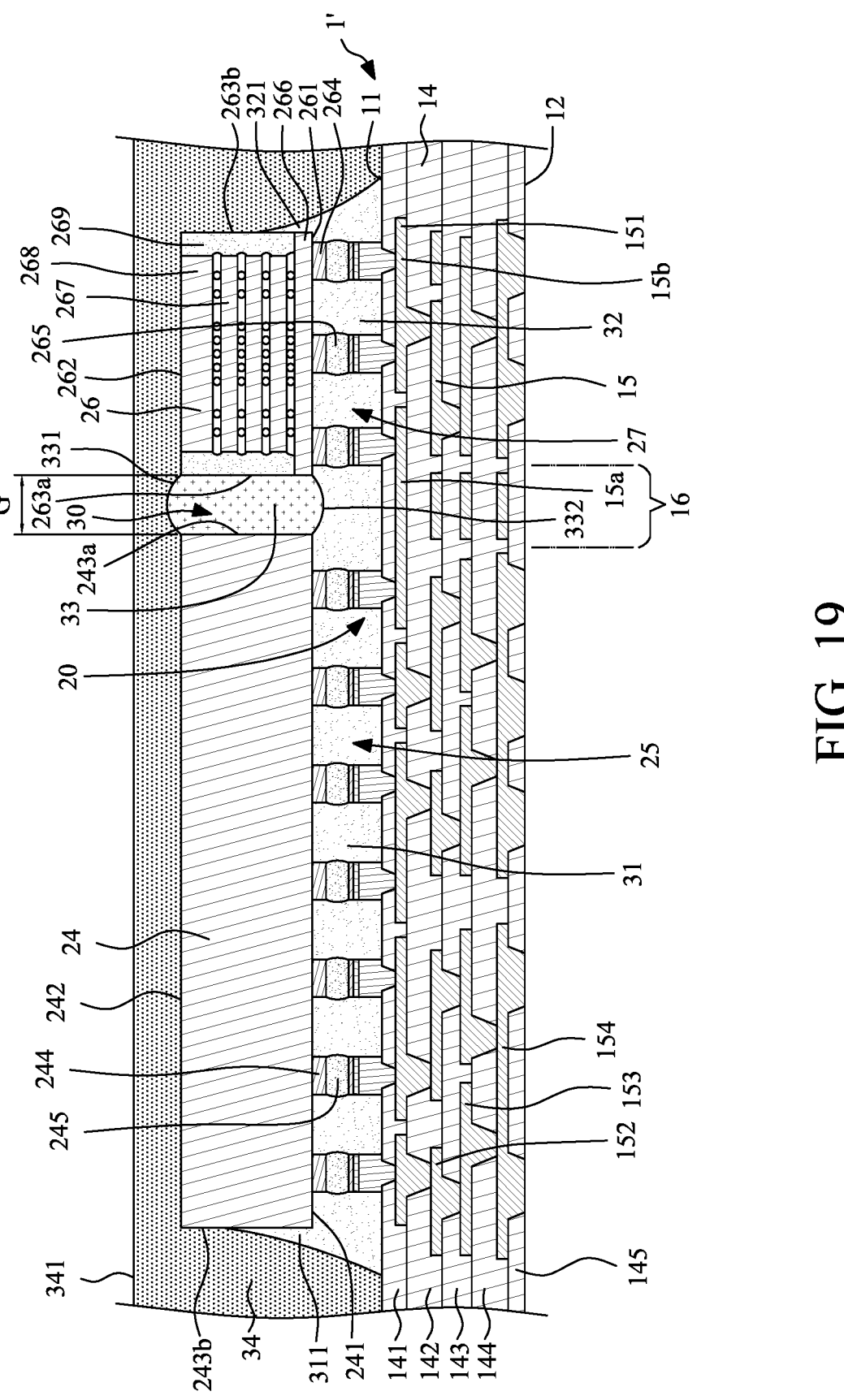
FIG. 19 illustrates one or more stages of an example of a method for manufacturing an assembly structure according to some embodiments of the present disclosure.

Referring to FIG. 19, the carrier 70 and the release layer 72 are removed. Thus, portions (i.e., the bottom portions of the via portions) of the fourth circuit layer 154 are exposed from the second surface 12 of the wiring structure 1'.

Figure 20:
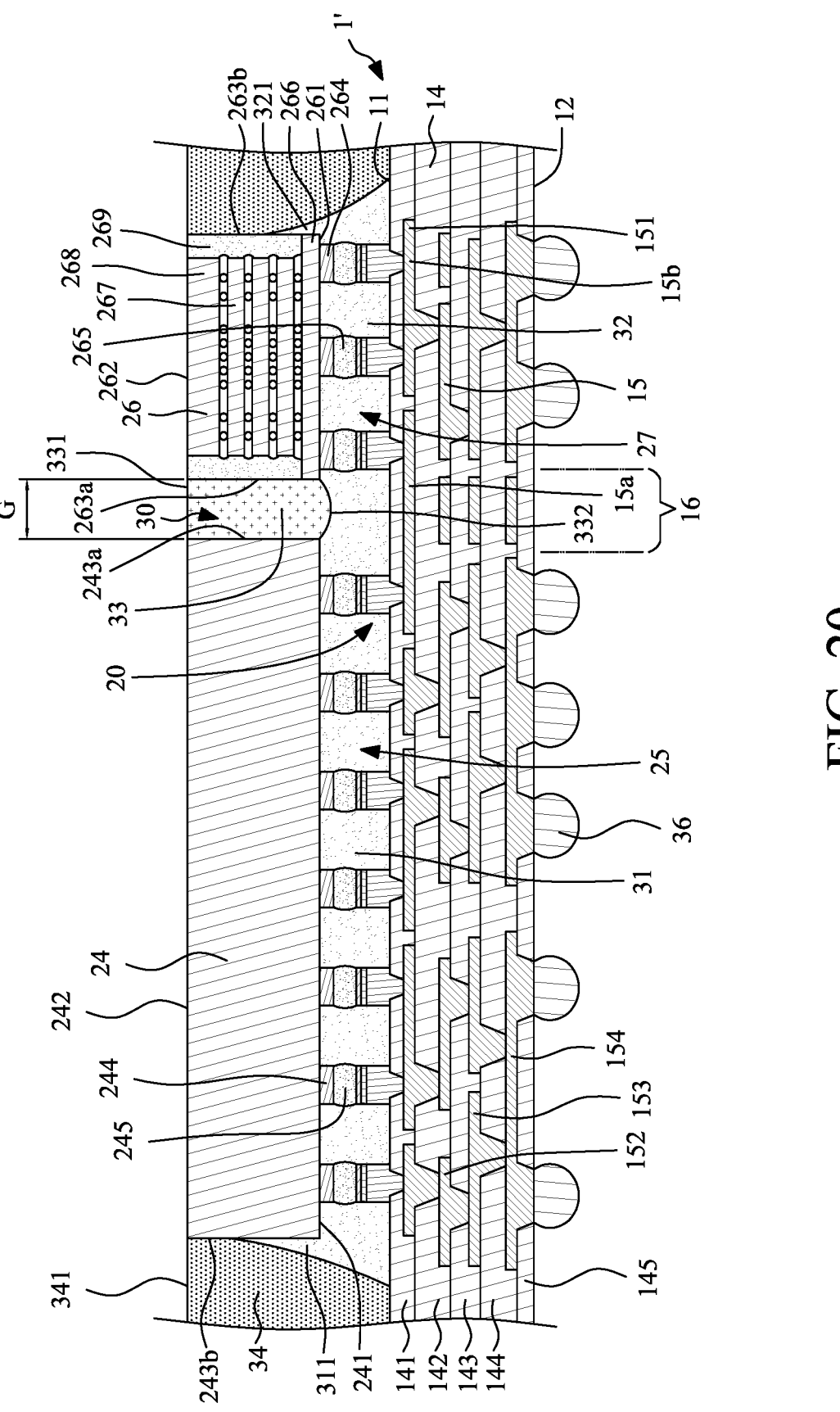
FIG. 20 illustrates one or more stages of an example of a method for manufacturing an assembly structure according to some embodiments of the present disclosure.

Referring to FIG. 20, a plurality of solder materials 36 (e.g., solder balls) are formed or disposed on the second surface 12 of the wiring structure 1'. For example, the solder materials 36 may be disposed on the exposed portions (i.e., the bottom portions of the via portions) of the fourth circuit layer 154. Then, the encapsulant 34 is thinned from its first surface 341 by, for example, grinding. Thus, the first surface 341 of the encapsulant 34, the second surface 242 of the first electronic device 24, the second surface 262 of the second electronic device 26 and the top surface 331 of the stiff bonding material 33 may be substantially coplanar with each other. Then, a singulation process may be conducted to the wiring structure 1' so as to obtain a plurality of package structures 3 shown in FIG. 1 to FIG. 3.

Figure 21:
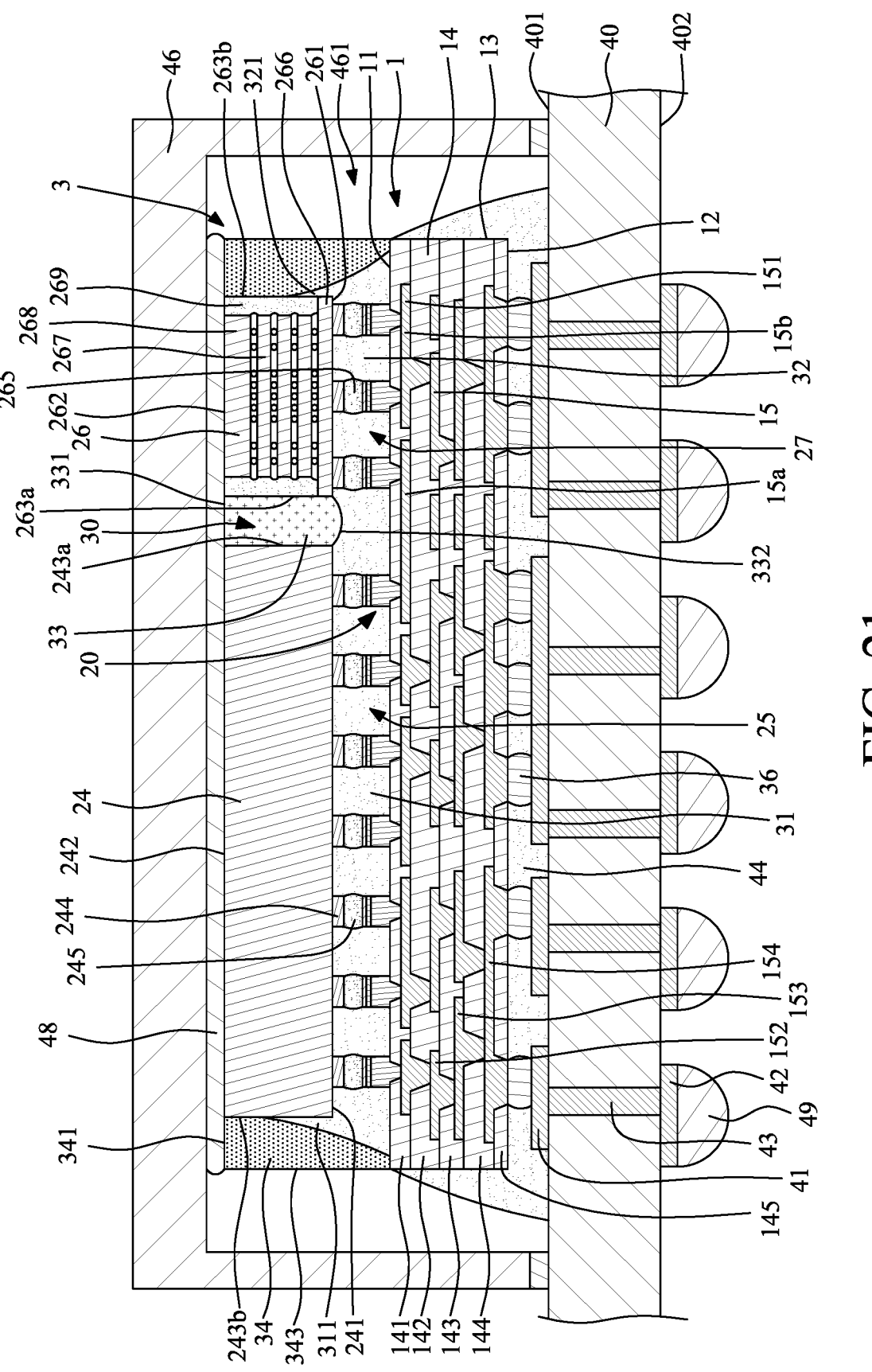
FIG. 21 illustrates one or more stages of an example of a method for manufacturing an assembly structure according to some embodiments of the present disclosure.

Referring to FIG. 21, the package structure 3 may be electrically connected to a first surface 401 of a base substrate 40 through the solder materials 36. Then, a protection material 44 (i.e., an underfill) is formed or disposed in a space between the package structure 3 and the base substrate 40 so as to cover and protect the solder materials 36. Then, a heat sink 46 may be attached to package structure 3 and the base substrate 40. In some embodiments, the heat sink 46 may be a cap or hat structure, and may define a cavity 461 for accommodating the package structure 3. A portion of the heat sink 46 may be attached to the top surface of the package structure 3 through a thermal material 48 (e.g., thermal interface material (TIM)). Another portion (e.g., bottom portion) of the heat sink 46 may be attached to the base substrate 40 through an adhesive material. Then, a singulation process may be conducted to the base substrate 40 so as to obtain a plurality of assembly structures 4 shown in FIG. 4.

Figure 22:
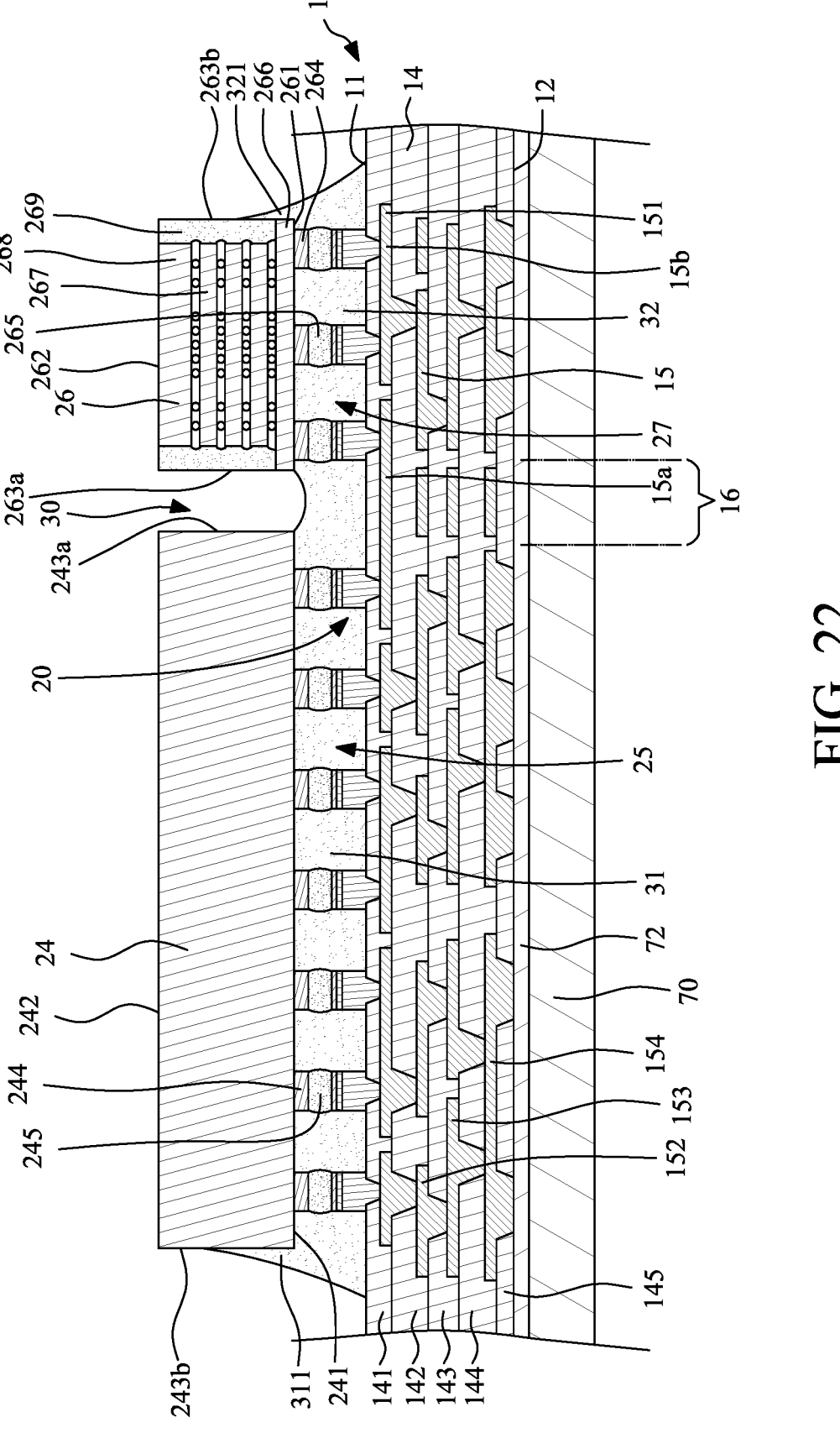
FIG. 22 illustrates one or more stages of an example of a method for manufacturing an assembly structure according to some embodiments of the present disclosure.

FIG. 22 through FIG. 26 illustrate a method for manufacturing an assembly structure according to some embodiments of the present disclosure. In some embodiments, the method is for manufacturing the package structure 3 shown in FIG. 1 to FIG. 3, and the assembly structure 4 shown in FIG. 4. The initial stages of the illustrated process are the same as, or similar to, the stages illustrated in FIG. 11 to FIG. 13. FIG. 22 depicts a stage subsequent to that depicted in FIG. 13.

Referring to FIG. 22, a first underfill 31 and a second underfill 32 are applied or disposed in the first space 25 and the second space 27, respectively. Meanwhile, the first underfill 31 may completely fill the first space 25, and the second underfill 32 may completely fill the second space 27. In addition, the first underfill 31 and the second underfill 32 may be formed from an underfill material integrally and concurrently. In some embodiments, the underfill material (including the first underfill 31 and the second underfill 32) may be applied or disposed by dispensing technique according to the method shown in FIG. 23.

Figure 23:
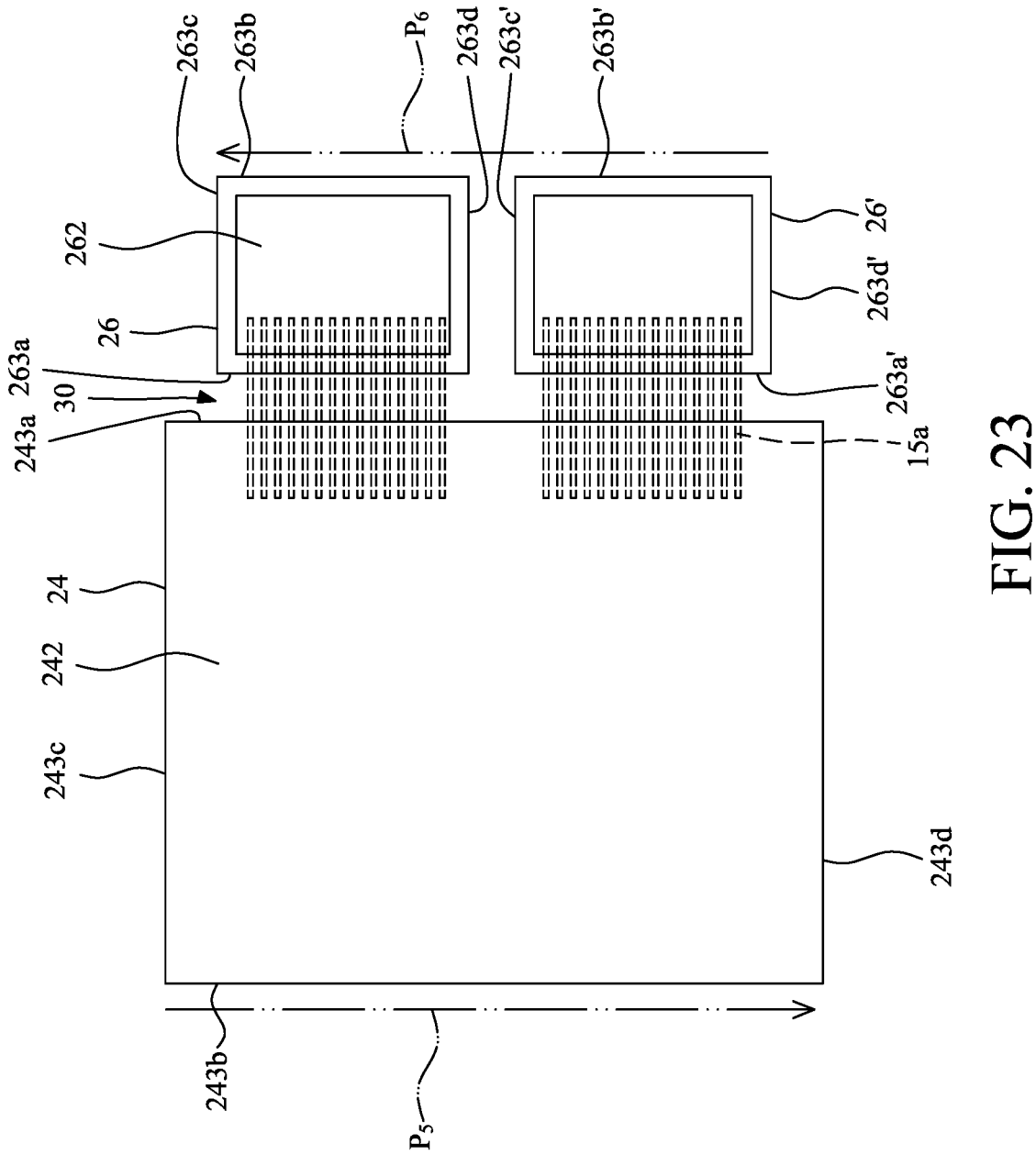
FIG. 23 illustrates one or more stages of an example of a method for manufacturing an assembly structure according to some embodiments of the present disclosure.
Figure 23A:
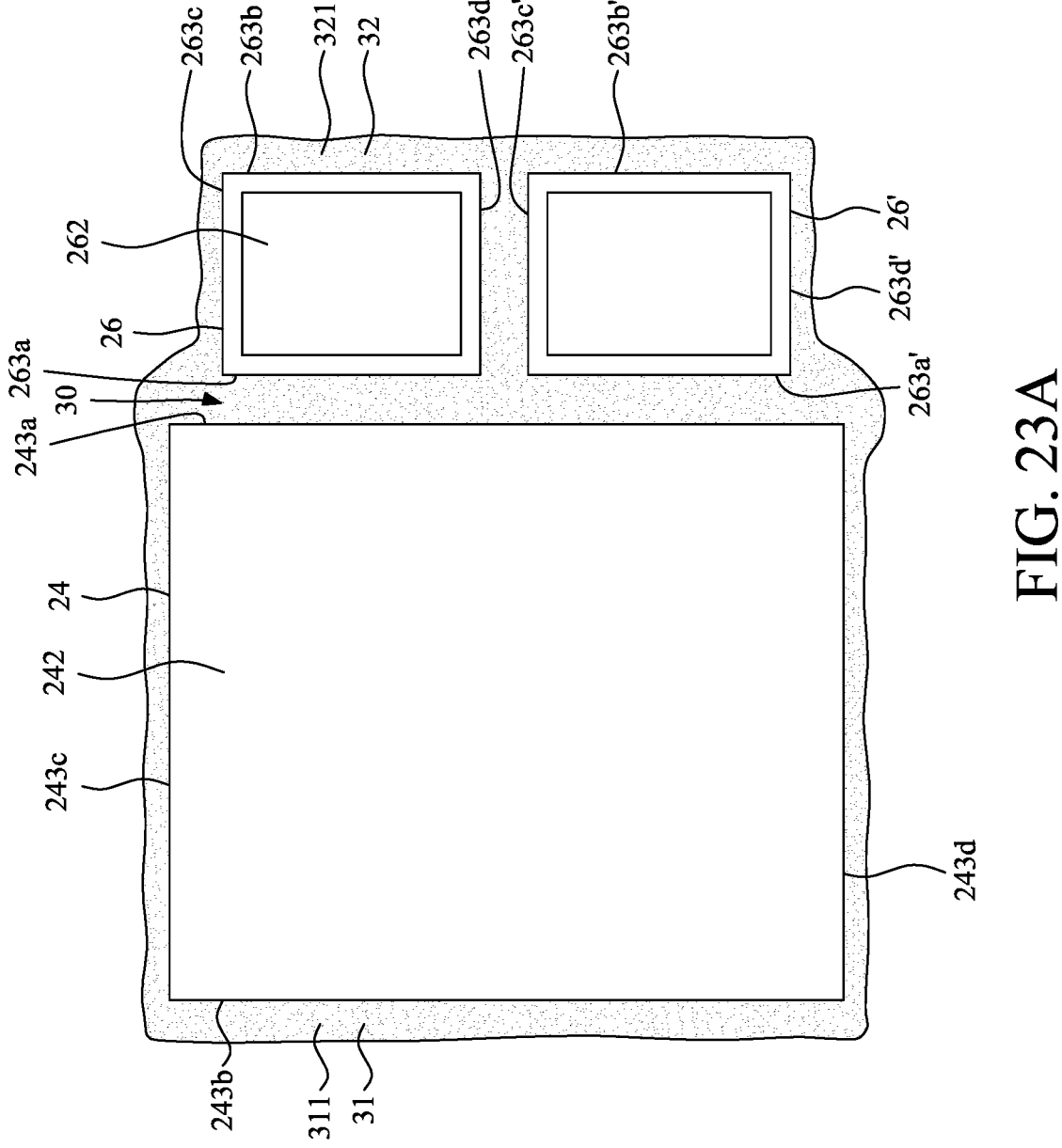
FIG. 23A illustrates one or more stages of an example of a method for manufacturing an assembly structure according to some embodiments of the present disclosure.

As shown in FIG. 23, from a top view, the underfill material (including the first underfill 31) is applied along the second lateral side surface 243b of the first electronic device 24, as shown in a fifth path P$_5$ of FIG. 23. Further, the underfill material (including the second underfill 32) is applied along the second lateral side surface 263b' of the second electronic device 26' and the second lateral side surface 263b of the second electronic device 26, as shown in a sixth path P$_6$ of FIG. 23. In some embodiments, the first underfill 31 and the second underfill 32 may be combined or merged together, so that the first underfill 31 and the second underfill 32 may be formed integrally. Then, after the dispensing process, a top view of the first electronic device 24, the second electronic devices 26, 26' and the underfill material (including the first underfill 31 and the second underfill 32) is shown as FIG. 23A.

Figure 24:
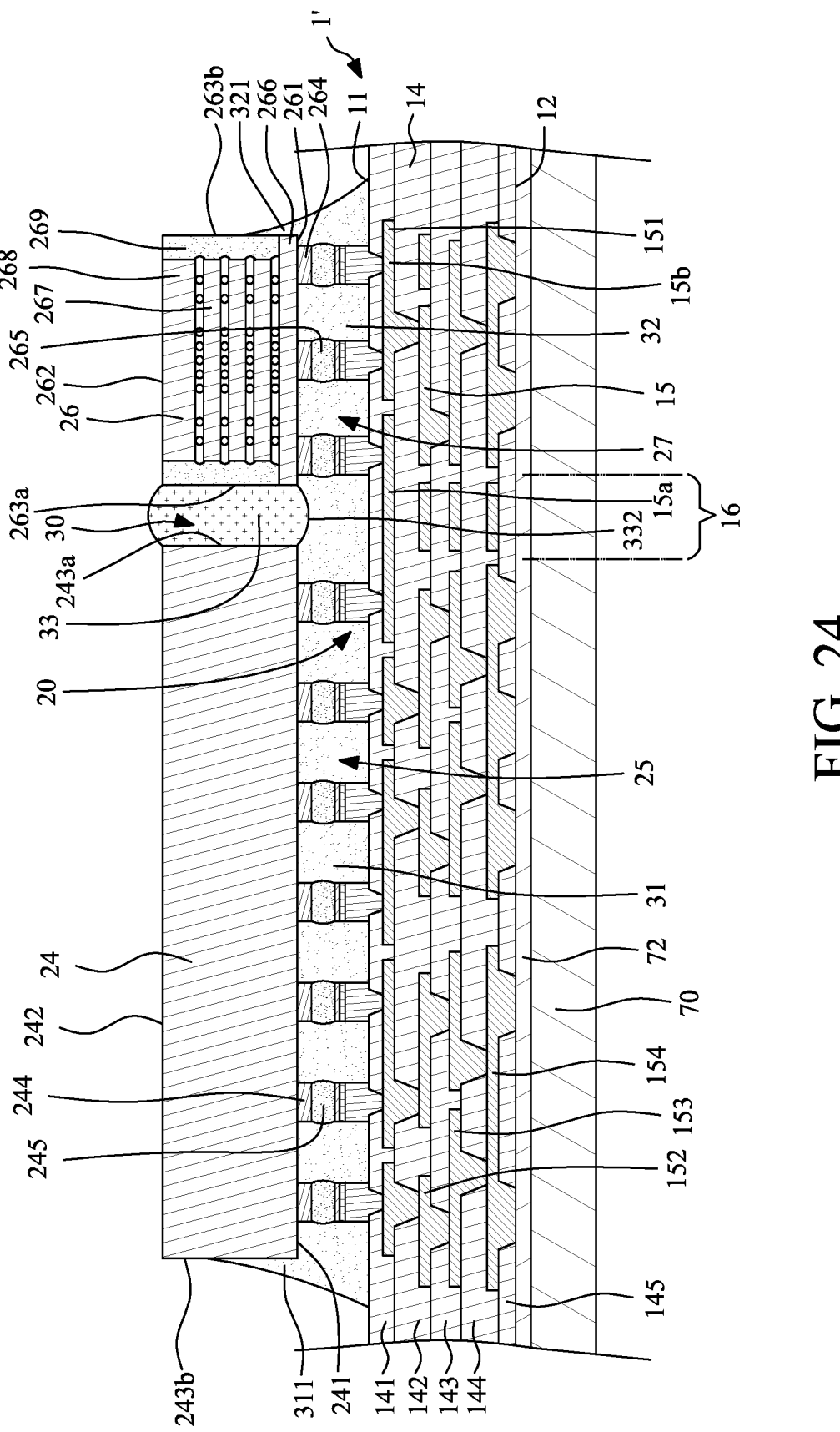
FIG. 24 illustrates one or more stages of an example of a method for manufacturing an assembly structure according to some embodiments of the present disclosure.

Referring to FIG. 24, a stiff bonding material 33 is formed or disposed in the central gap 30 on the underfill material (including the first underfill 31 and the second underfill 32). In some embodiments, the stiff bonding material 33 may be applied or disposed by filling technique according to the method shown in FIG. 25.

Figure 25:
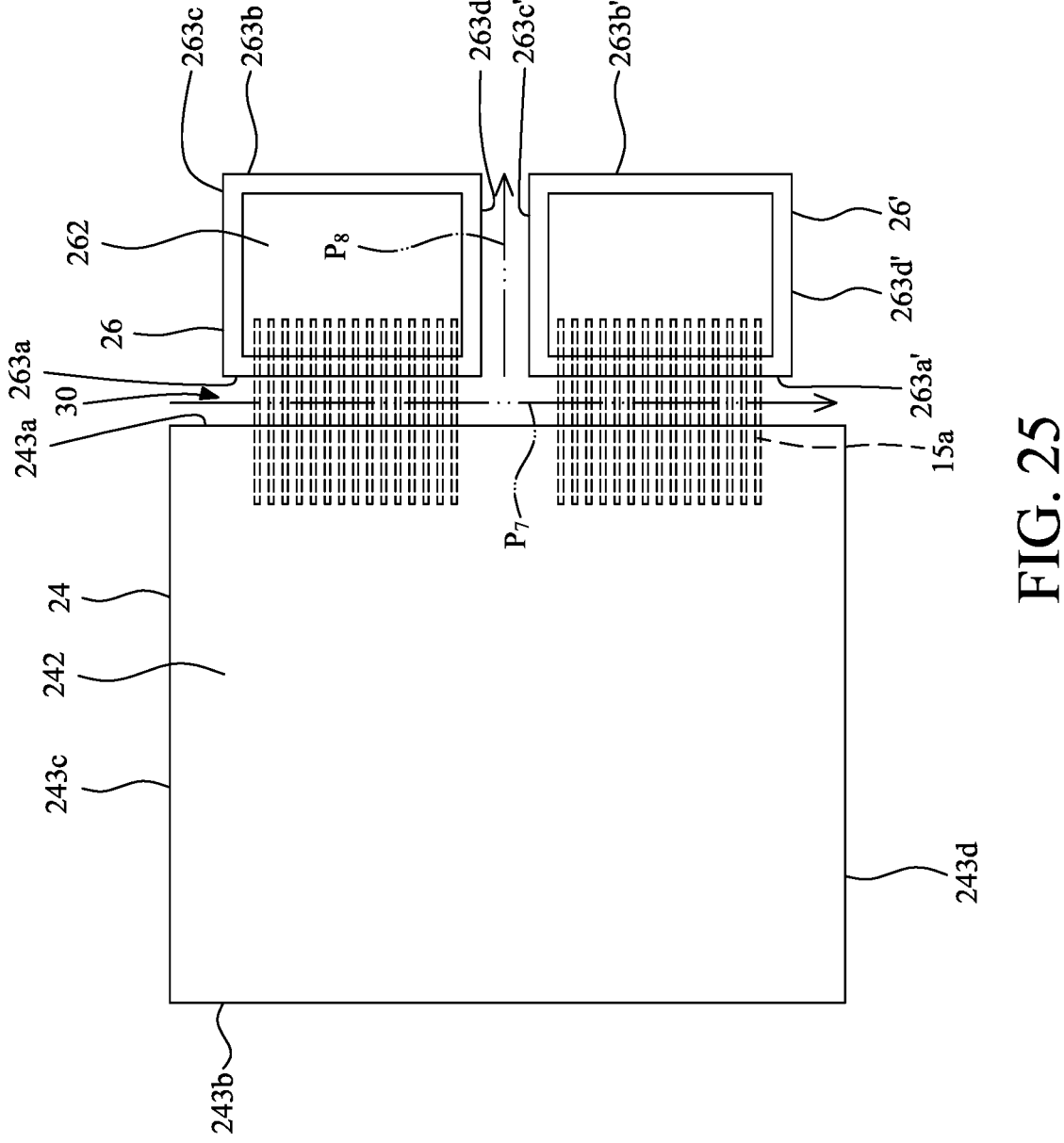
FIG. 25 illustrates one or more stages of an example of a method for manufacturing an assembly structure according to some embodiments of the present disclosure.
Figure 25A:
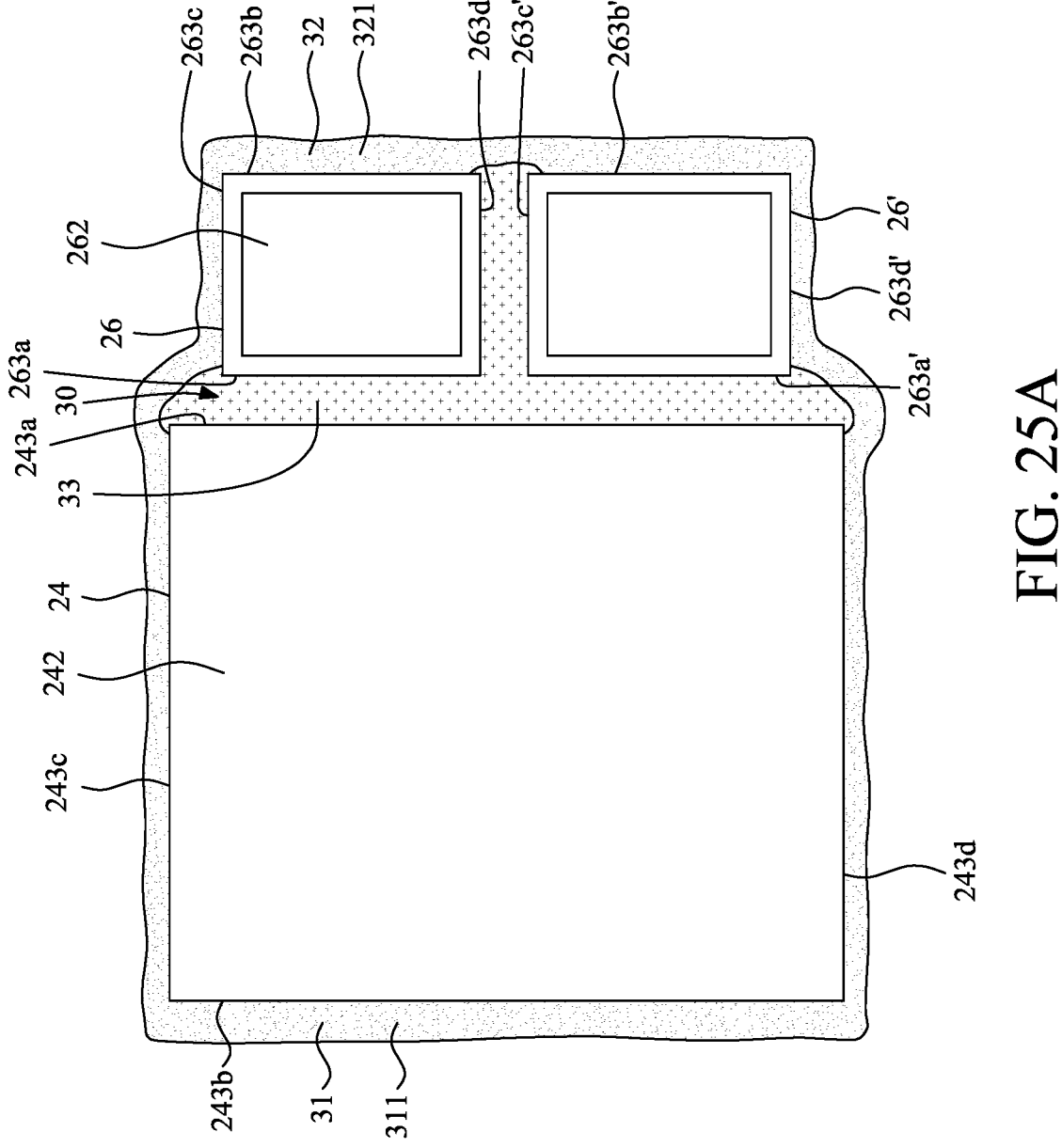
FIG. 25A illustrates one or more stages of an example of a method for manufacturing an assembly structure according to some embodiments of the present disclosure.

As shown in FIG. 25, from a top view, the stiff bonding material 33 is applied along the central gap 30 between the first electronic device 24 and the second electronic device 26, and between the first electronic device 24 and the second electronic device 26', as shown in a seventh path P$_7$ of FIG. 25. Further, the stiff bonding material 33 may be further applied along a branch gap between the fourth lateral side surface 263d of the second electronic device 26 and the third lateral side surface 263c' of the second electronic device 26', as shown in a eighth path P$_8$ of FIG. 25. Then, after the filling process, a top view of the first electronic device 24, the second electronic devices 26, 26', the stiff bonding material 33 and the underfill material (including the first underfill 31 and the second underfill 32) is shown as FIG. 25A.

Figure 26:
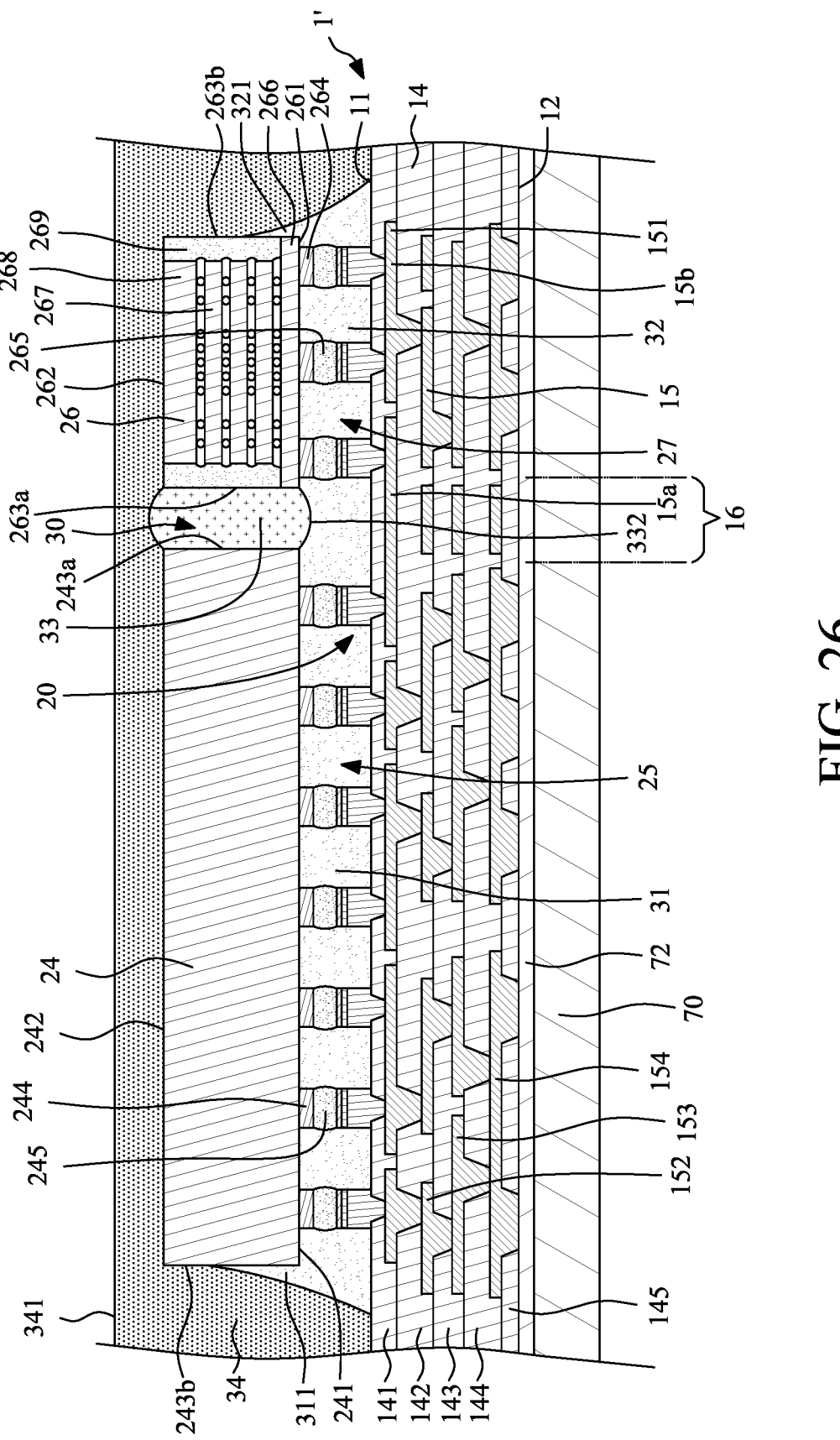
FIG. 26 illustrates one or more stages of an example of a method for manufacturing an assembly structure according to some embodiments of the present disclosure.

Referring to FIG. 26, the underfill material (including the first underfill 31 and the second underfill 32) and the stiff bonding material 33 may be cured. Then, an encapsulant 34 (e.g., a molding compound) may be formed or disposed to cover at least a portion of the first surface 11 of the wiring structure 1', at least a portion of the first electronic device 24, at least a portion of the second electronic device 26, the underfill material (including the first underfill 31 and the second underfill 32) and the stiff bonding material 33.

Then, the following stages of the illustrated process are the same as, or similar to, the stages illustrated in FIG. 19 to FIG. 21, so as to obtain the package structure 3 shown in FIG. 1 to FIG. 3 and the assembly structure 4 shown in FIG. 4.

Figure 27:
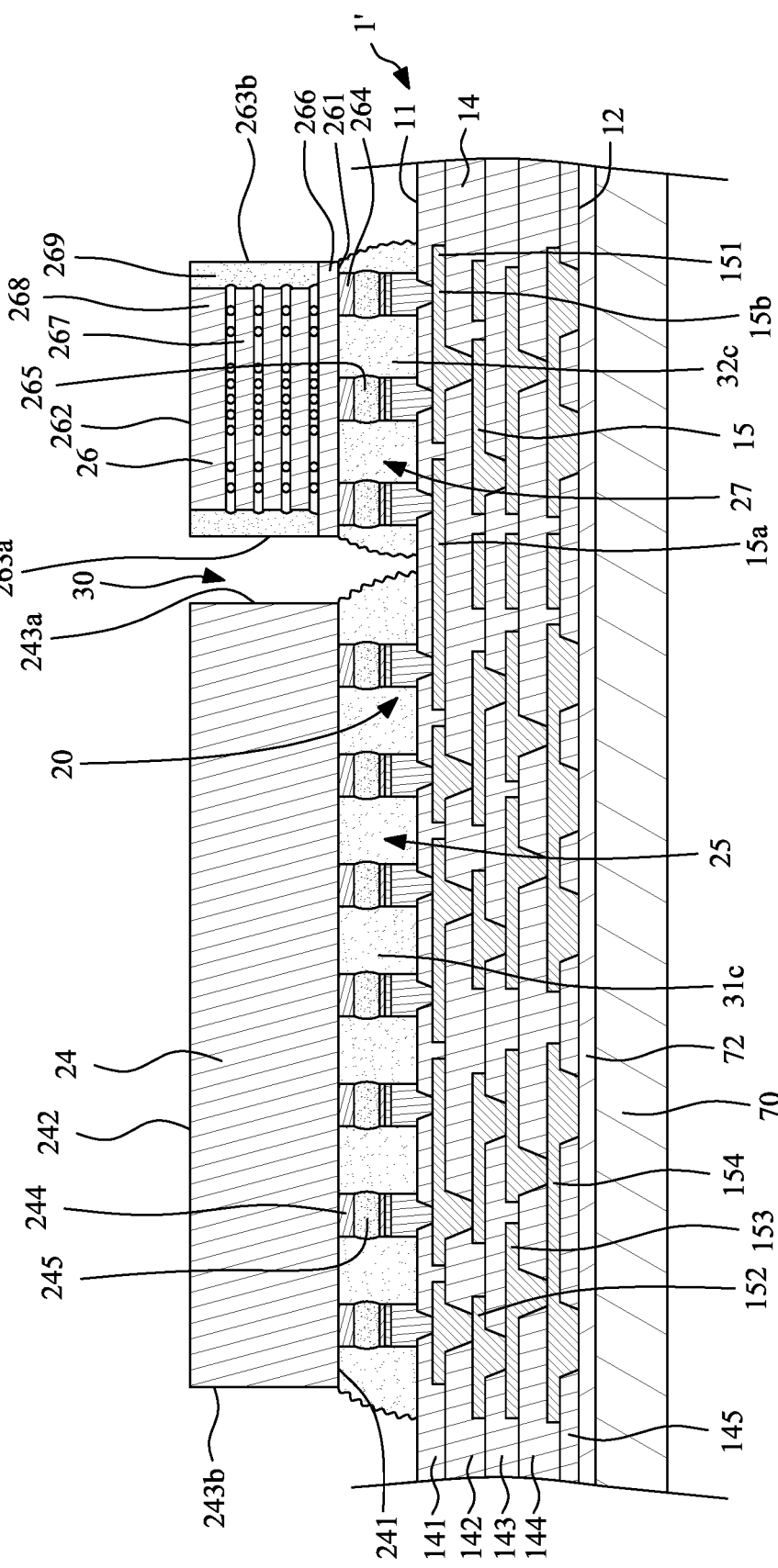
FIG. 27 illustrates one or more stages of an example of a method for manufacturing an assembly structure according to some embodiments of the present disclosure.
Figure 28:
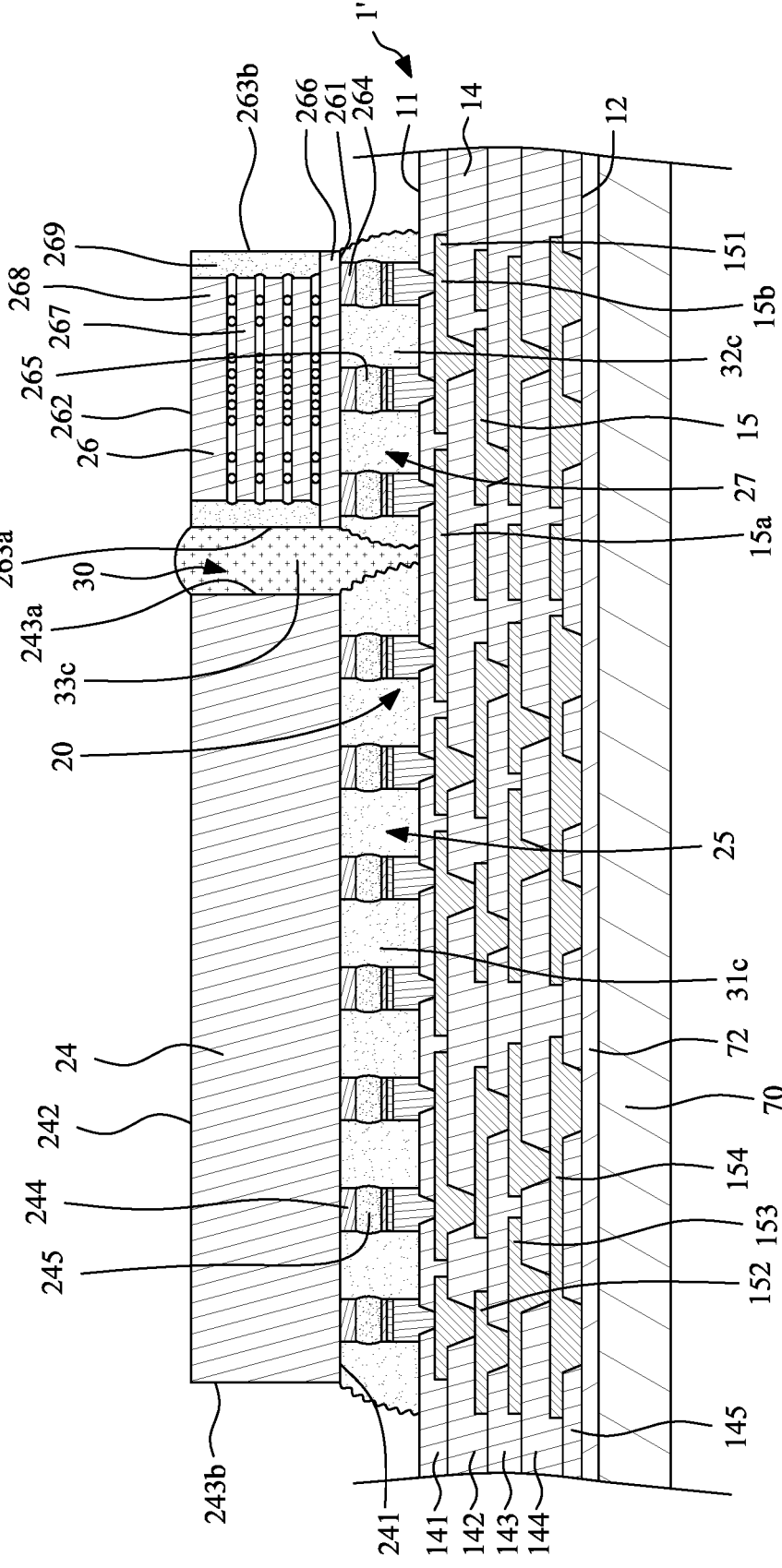
FIG. 28 illustrates one or more stages of an example of a method for manufacturing an assembly structure according to some embodiments of the present disclosure.
Figure 29:
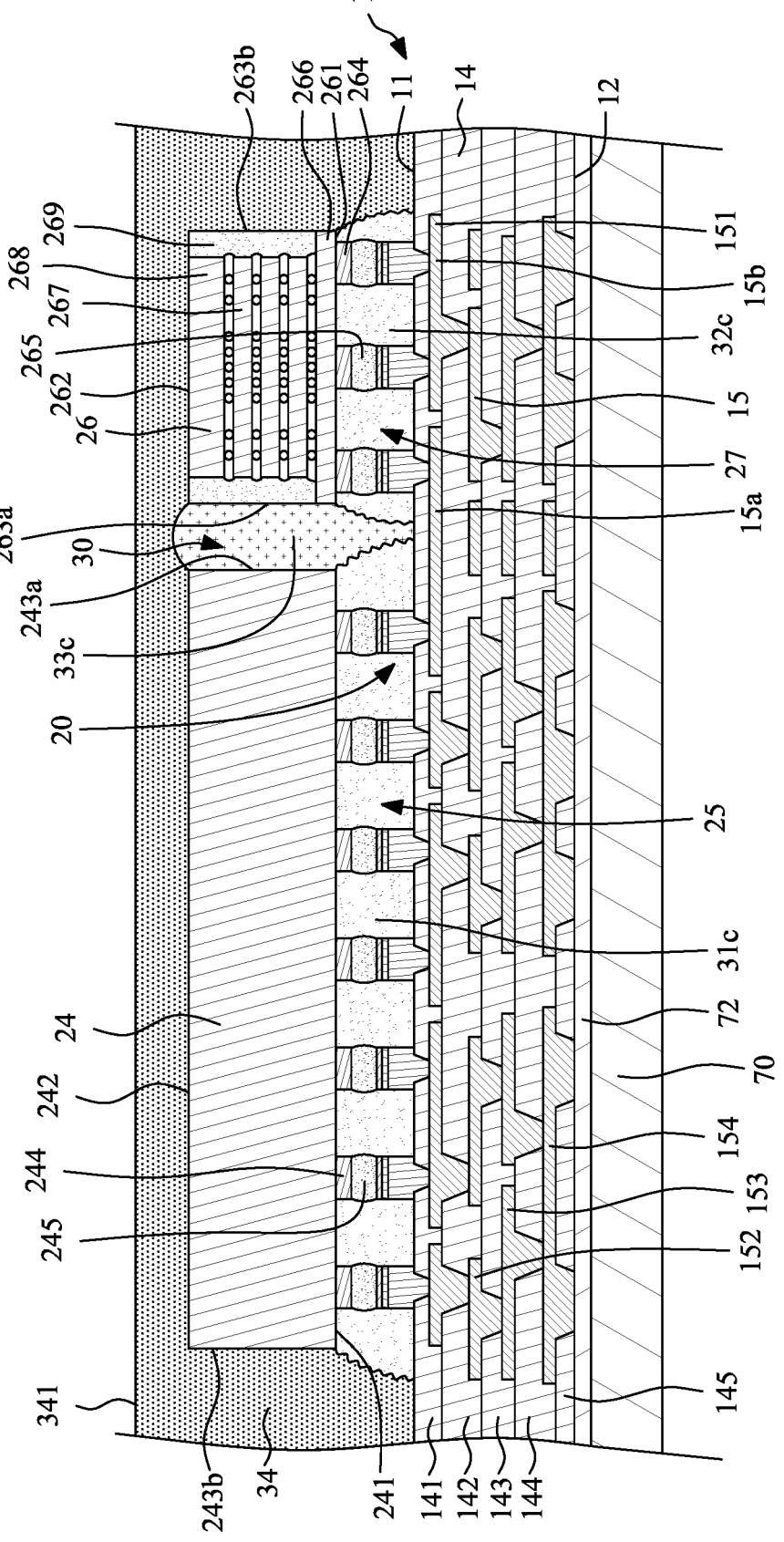
FIG. 29 illustrates one or more stages of an example of a method for manufacturing an assembly structure according to some embodiments of the present disclosure.

FIG. 27 through FIG. 29 illustrate a method for manufacturing an assembly structure according to some embodiments of the present disclosure. In some embodiments, the method is for manufacturing the package structure 3c and the assembly structure 4c shown in FIG. 7. The initial stages of the illustrated process are the same as, or similar to, the stages illustrated in FIG. 11 to FIG. 12. FIG. 27 depicts a stage subsequent to that depicted in FIG. 12.

Referring to FIG. 27, a first film type material is attached or disposed on the first active surface 241 of the first electronic device 24. Then, the first electronic device 24 and the first film type material are disposed on the wiring structure 1'. Meanwhile, the first active surface 241 of the first electronic device 24 is electrically connected to the circuit layer 15 of the wiring structure 1' by flip-chip bonding, and the first film type material becomes the first underfill 31c that may completely fill the first space 25 between the first electronic device 24 and the wiring structure 1'. That is, the first underfill 31c is formed from the first film type material. In addition, a second film type material is attached or disposed on the second active surface 261 of the second electronic device 26. Then, the second electronic device 26 and the second film type material are disposed on the wiring structure 1'. Meanwhile, the second active surface 261 of the second electronic device 26 is electrically connected to the circuit layer 15 of the wiring structure 1' by flip-chip bonding, and the second film type material becomes the second underfill 32c that may completely fill the second space 27 between the second electronic device 26 and the wiring structure 1'. That is, the second underfill 32c is formed from the second film type material.

As shown in FIG. 27, the first electronic device 24 and the second electronic device 26 are disposed and bonded on the wiring structure 1' side by side, and a central gap 30 is formed between the first electronic device 24 and the second electronic device 26. In addition, the first underfill 31c and the second underfill 32c may be separated from each other. That is, the first underfill 31c and the second underfill 32c may be not formed integrally, and an extending gap under the central gap 30 is formed between the first underfill 31c and the second underfill 32c.

Referring to FIG. 28, a stiff bonding material 33c may be applied or disposed in the central gap 30 and the extending gap to contact the first surface 11 of the wiring structure 1' by dispensing technique.

Referring to FIG. 29, the first underfill 31c, the second underfill 32c and the stiff bonding material 33c may be cured. Then, an encapsulant 34 (e.g., a molding compound) may be formed or disposed to cover at least a portion of the first surface 11 of the wiring structure 1', at least a portion of the first electronic device 24, at least a portion of the second electronic device 26, the underfill material (including the first underfill 31 and the second underfill 32) and the stiff bonding material 33c.

Then, the following stages of the illustrated process are the same as, or similar to, the stages illustrated in FIG. 19 to FIG. 21, so as to obtain the package structure 3c and the assembly structure 4c shown in FIG. 7.

Figure 30:
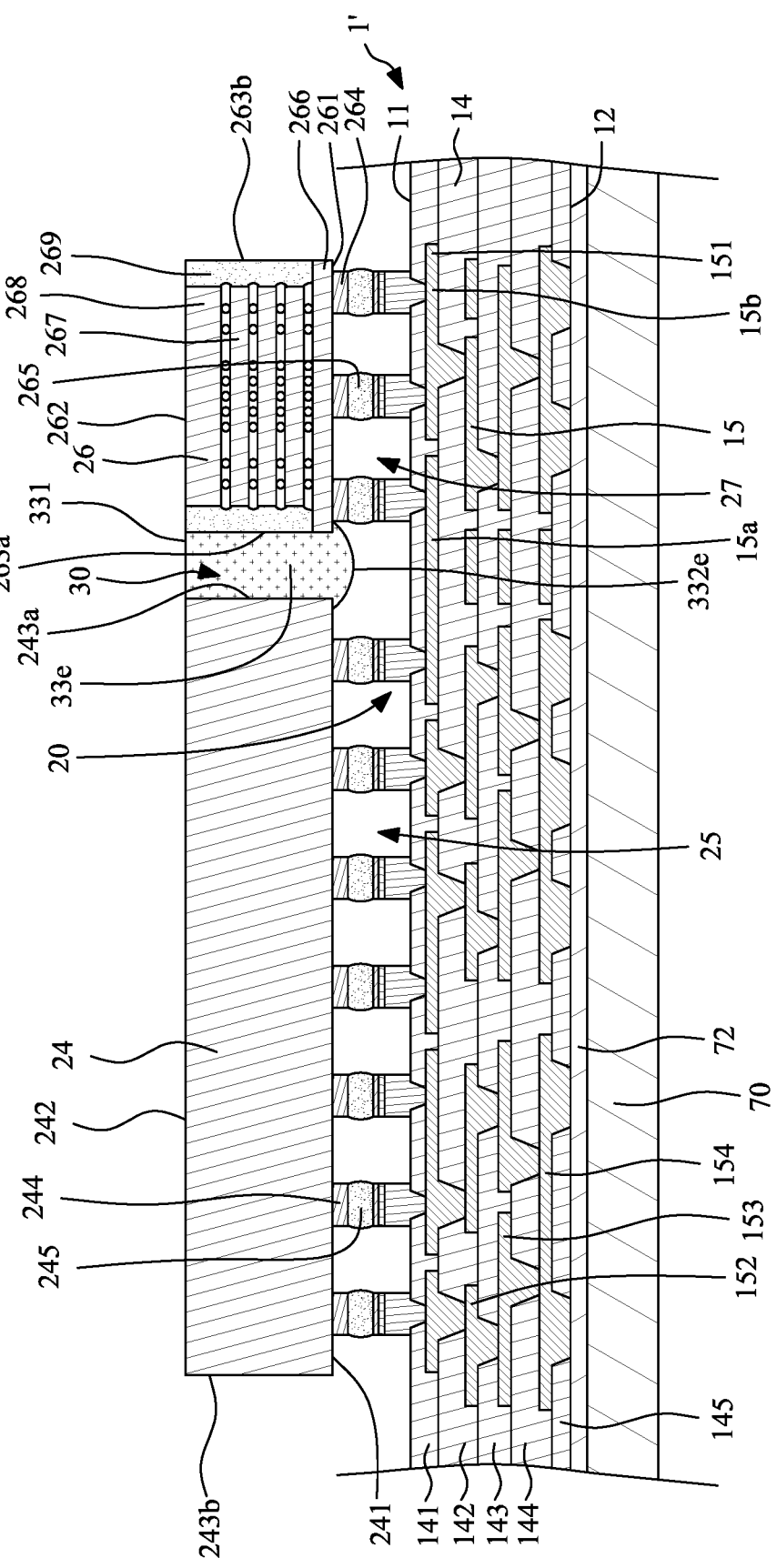
FIG. 30 illustrates one or more stages of an example of a method for manufacturing an assembly structure according to some embodiments of the present disclosure.

FIG. 30 through FIG. 37 illustrate a method for manufacturing an assembly structure according to some embodiments of the present disclosure. In some embodiments, the method is for manufacturing the package structure 3e and the assembly structure 4e shown in FIG. 9. The initial stages of the illustrated process are the same as, or similar to, the stages illustrated in FIG. 11 to FIG. 13. FIG. 30 depicts a stage subsequent to that depicted in FIG. 13.

Referring to FIG. 30, a stiff bonding material 33e may be applied or disposed in the central gap 30 by dispensing technique. The stiff bonding material 33e may not contact the wiring structure 1' to form an empty space under the stiff bonding material 33e. Further, the bottom portion of the stiff bonding material 33e extends to cover a portion of the first active surface 241 of the first electronic device 24 and/or a portion of the second active surface 261 of the second electronic device 26. Thus, the bottom surface 332e of the stiff bonding material 33e extends between the first active surface 241 of the first electronic device 24 and the second active surface 261 of the second electronic device 26. In some embodiments, a viscosity of the stiff bonding material 33 may be about 50 Pa·s to about 100 Pa·s, and the stiff bonding material 33e may be applied or disposed by filling technique according to the method shown in FIG. 31.

Figure 31:
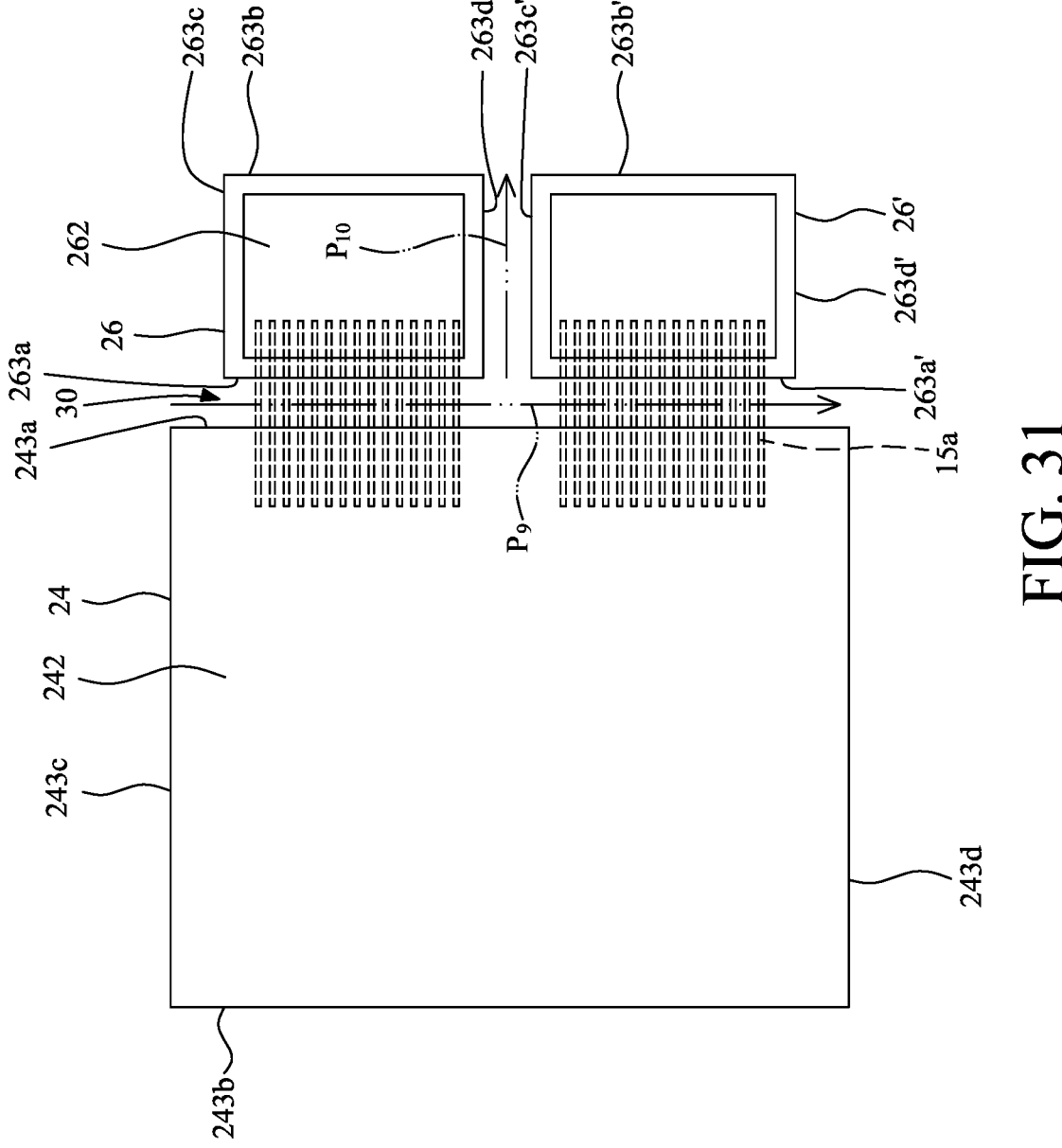
FIG. 31 illustrates one or more stages of an example of a method for manufacturing an assembly structure according to some embodiments of the present disclosure.

As shown in FIG. 31, from a top view, the stiff bonding material 33e is applied along the central gap 30 between the first electronic device 24 and the second electronic device 26, and between the first electronic device 24 and the second electronic device 26', as shown in a ninth path P$_9$ of FIG. 31. Further, the stiff bonding material 33e may be further applied along a branch gap between the fourth lateral side surface 263d of the second electronic device 26 and the third lateral side surface 263c' of the second electronic device 26', as shown in a tenth path P$_{10}$ of FIG. 31.

Figure 32:
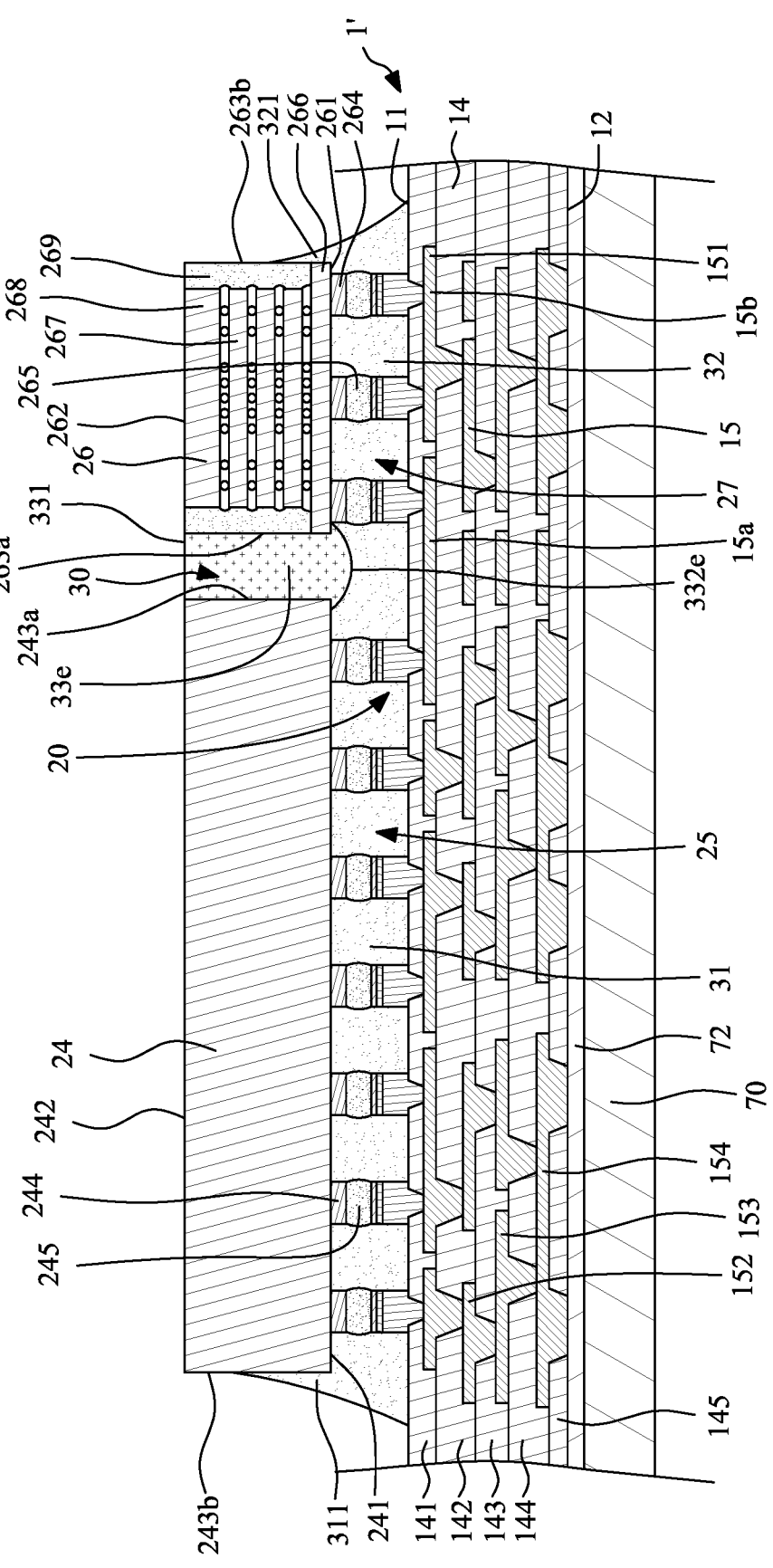
FIG. 32 illustrates one or more stages of an example of a method for manufacturing an assembly structure according to some embodiments of the present disclosure.

Referring to FIG. 32, a first underfill 31 and a second underfill 32 are applied or disposed in the first space 25 and the second space 27, respectively. Meanwhile, the first underfill 31 may completely fill the first space 25, and the second underfill 32 may completely fill the second space 27. In addition, the first underfill 31 and/or the second underfill 32 may be further disposed in the empty space between the stiff bonding material 33e and the wiring structure 1'. Thus, the first underfill 31 and the second underfill 32 may be formed from an underfill material integrally and concurrently. In some embodiments, the underfill material (including the first underfill 31 and the second underfill 32) may be applied or disposed by dispensing technique according to the method shown in FIG. 33.

Figure 33:
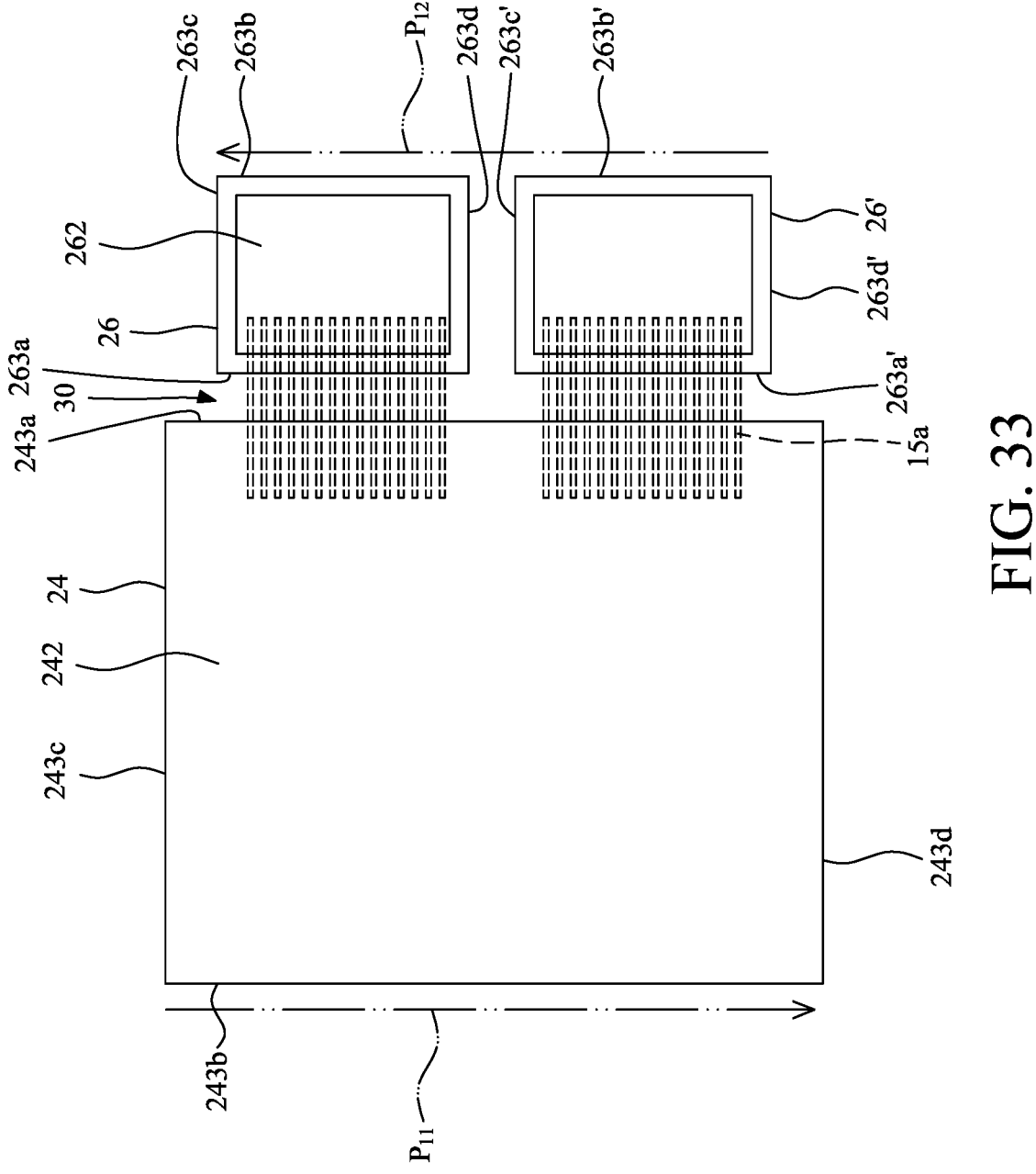
FIG. 33 illustrates one or more stages of an example of a method for manufacturing an assembly structure according to some embodiments of the present disclosure.

As shown in FIG. 33, from a top view, the underfill material (including the first underfill 31) is applied along the second lateral side surface 243b of the first electronic device 24, as shown in a eleventh path $P_{11}$ of FIG. 33. Further, the underfill material (including the second underfill 32) is applied along the second lateral side surface 263b' of the second electronic device 26' and the second lateral side surface 263b of the second electronic device 26, as shown in a twelfth path $P_{12}$ of FIG. 33. In some embodiments, the first underfill 31 and the second underfill 32 may be combined or merged together, so that the first underfill 31 and the second underfill 32 may be formed integrally.

Figure 34:
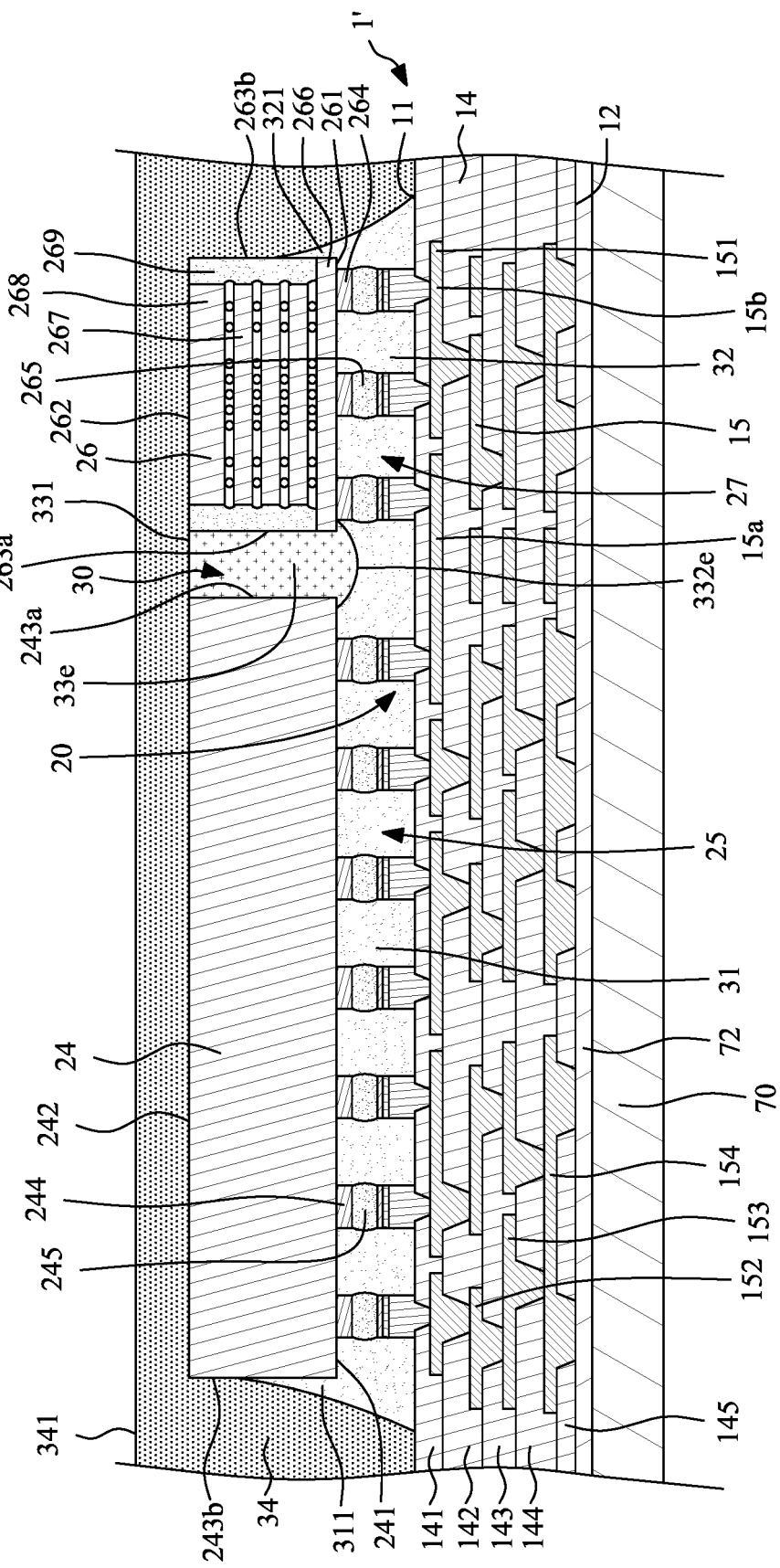
FIG. 34 illustrates one or more stages of an example of a method for manufacturing an assembly structure according to some embodiments of the present disclosure.

Referring to FIG. 34, the underfill material (including the first underfill 31 and the second underfill 32) and the stiff bonding material 33e may be cured. Then, an encapsulant 34 (e.g., a molding compound) may be formed or disposed to cover at least a portion of the first surface 11 of the wiring structure 1', at least a portion of the first electronic device 24, at least a portion of the second electronic device 26, the underfill material (including the first underfill 31 and the second underfill 32) and the stiff bonding material 33e. The encapsulant 34 has a first surface 341 (e.g., a top surface).

Figure 35:
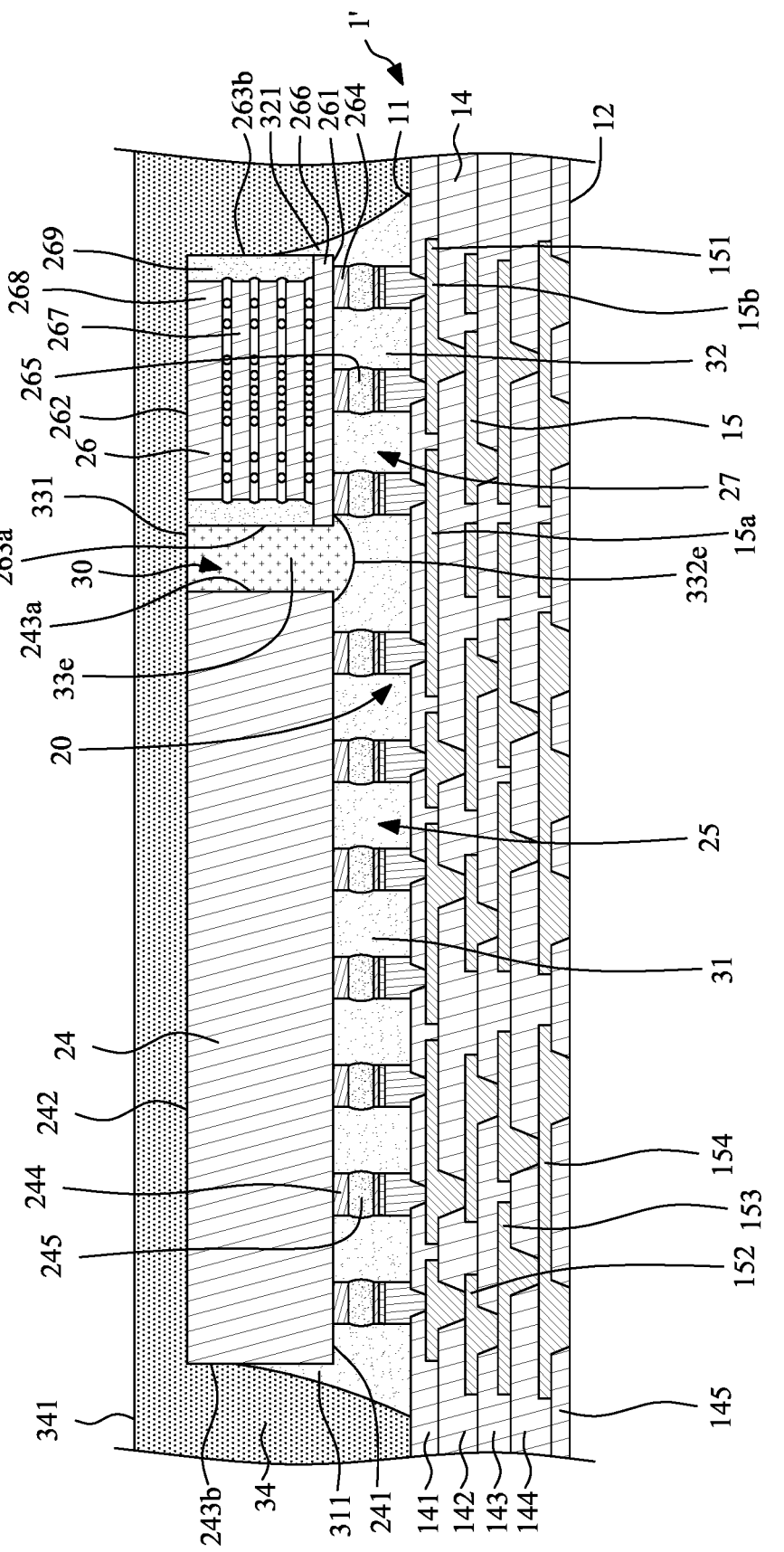
FIG. 35 illustrates one or more stages of an example of a method for manufacturing an assembly structure according to some embodiments of the present disclosure.

Referring to FIG. 35, the carrier 70 and the release layer 72 are removed. Thus, portions (i.e., the bottom portions of the via portions) of the fourth circuit layer 154 are exposed from the second surface 12 of the wiring structure 1'.

Figure 36:
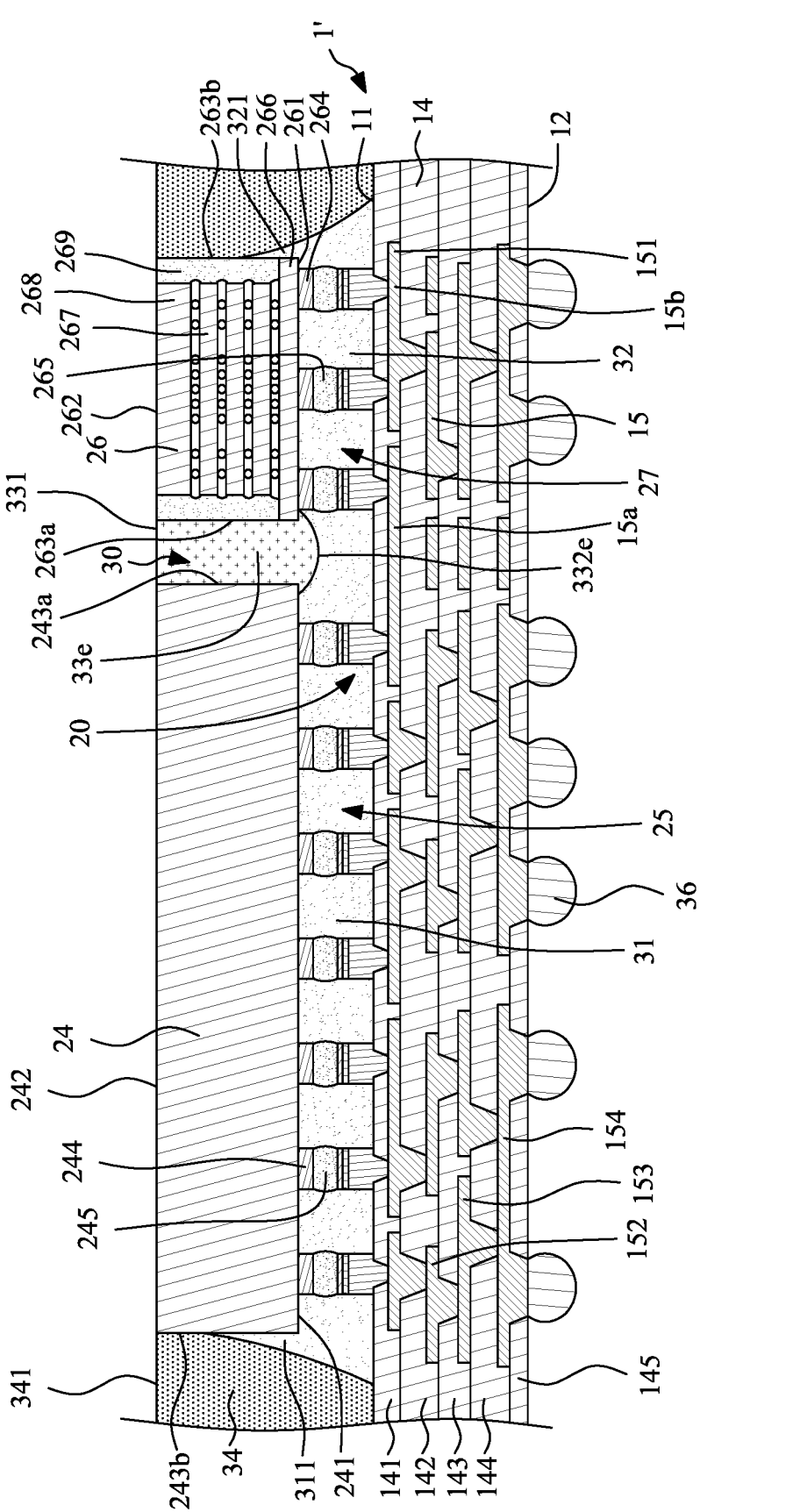
FIG. 36 illustrates one or more stages of an example of a method for manufacturing an assembly structure according to some embodiments of the present disclosure.

Referring to FIG. 36, a plurality of solder materials 36 (e.g., solder balls) are formed or disposed on the second surface 12 of the wiring structure 1'. For example, the solder materials 36 may be disposed on the exposed portions (i.e., the bottom portions of the via portions) of the fourth circuit layer 154. Then, the encapsulant 34 is thinned from its first surface 341 by, for example, grinding. Thus, the first surface 341 of the encapsulant 34, the second surface 242 of the first electronic device 24, the second surface 262 of the second electronic device 26 and the top surface 331 of the stiff bonding material 33e may be substantially coplanar with each other. Then, a singulation process may be conducted to the wiring structure 1' so as to obtain a plurality of package structures 3e shown in FIG. 9.

Figure 37:
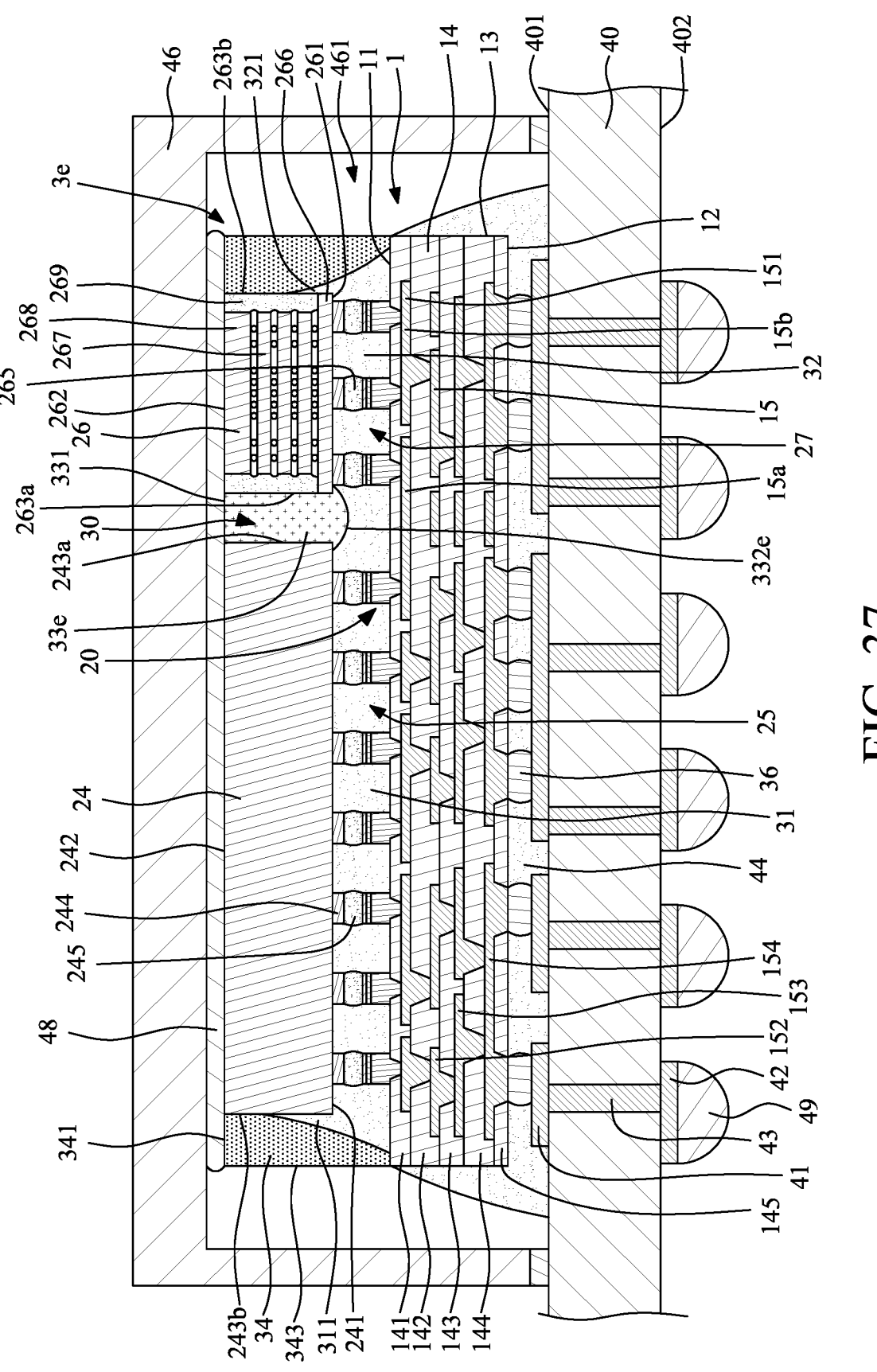
FIG. 37 illustrates one or more stages of an example of a method for manufacturing an assembly structure according to some embodiments of the present disclosure.

Referring to FIG. 37, the package structure 3e may be electrically connected to a first surface 401 of a base substrate 40 through the solder materials 36. Then, a protection material 44 (i.e., an underfill) is formed or disposed in a space between the package structure 3e and the base substrate 40 so as to cover and protect the solder materials 36. Then, a heat sink 46 may be attached to package structure 3e and the base substrate 40. In some embodiments, the heat sink 46 may be a cap or hat structure, and may define a cavity 461 for accommodating the package structure 3e. A portion of the heat sink 46 may be attached to the top surface of the package structure 3e through a thermal material 48 (e.g., thermal interface material (TIM)). Another portion (e.g., bottom portion) of the heat sink 46 may be attached to base substrate 40 through an adhesive material. Then, a singulation process may be conducted to the base substrate 40 so as to obtain a plurality of assembly structures 4e shown in FIG. 9.

In another embodiment of a method for manufacturing an assembly structure of the present disclosure, in the stage of FIG. 30, the stiff bonding material (e.g., a stiff bonding material 33f of FIG. 10) may contact the first surface 11 of the wiring structure 1'. Then, in the stage of FIG. 32, the first underfill (e.g., the first underfill 31f of FIG. 10) and the second underfill (e.g., the second underfill 32f of FIG. 10) are separated by the stiff bonding material 33f. Then, after the stages illustrated in FIG. 34 to FIG. 37, a plurality of assembly structures 4f shown in FIG. 10 are obtained.

Figure 38:
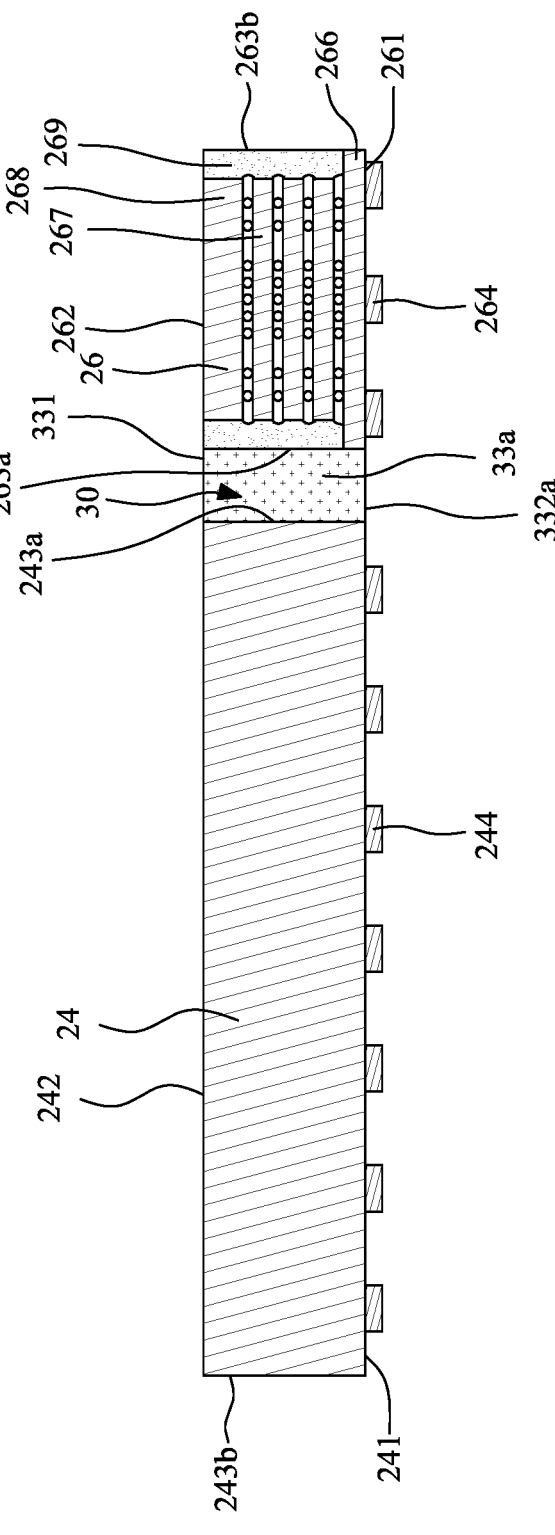
FIG. 38 illustrates one or more stages of an example of a method for manufacturing an assembly structure according to some embodiments of the present disclosure.
Figure 39:
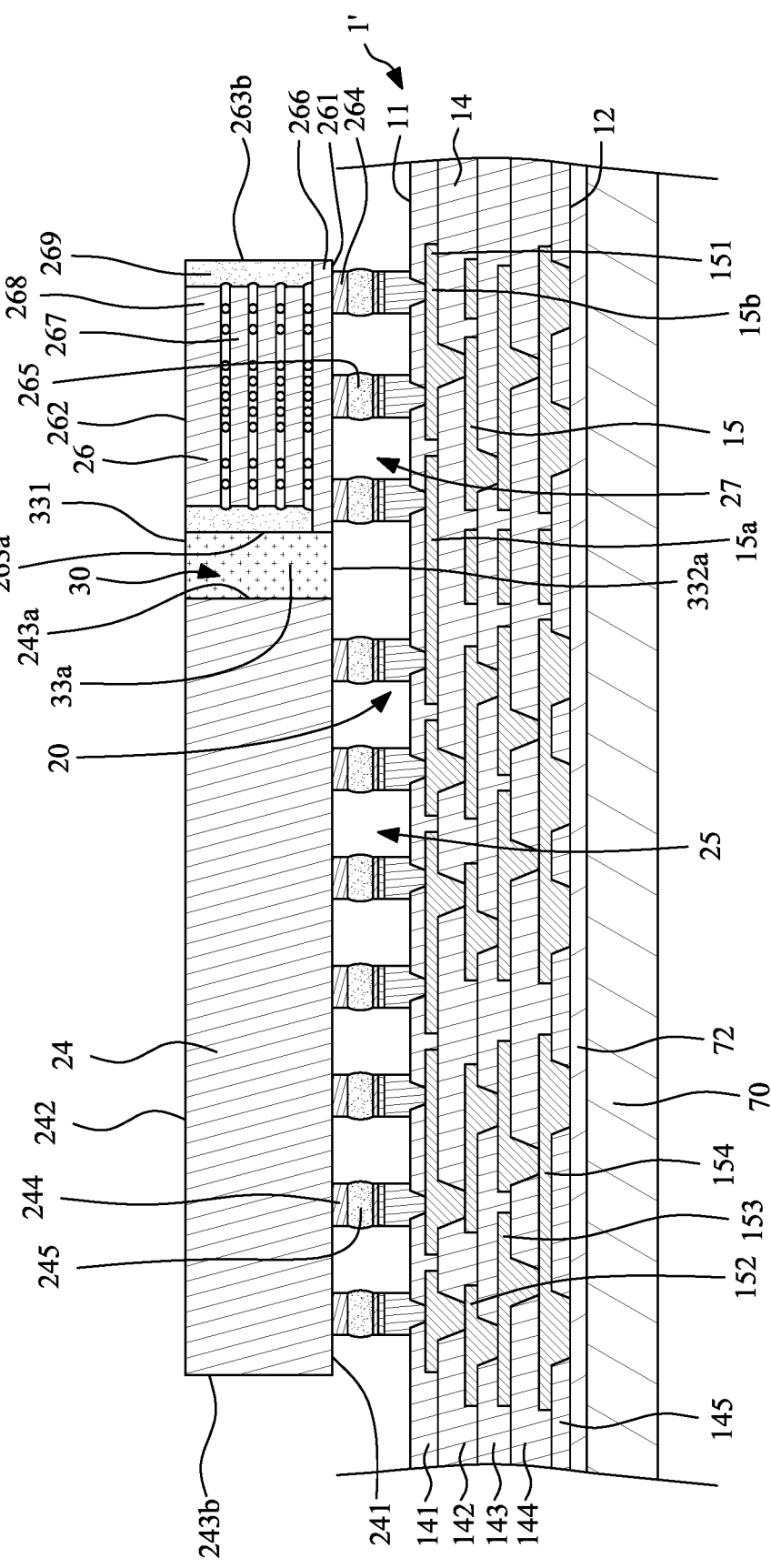
FIG. 39 illustrates one or more stages of an example of a method for manufacturing an assembly structure according to some embodiments of the present disclosure.
Figure 40:
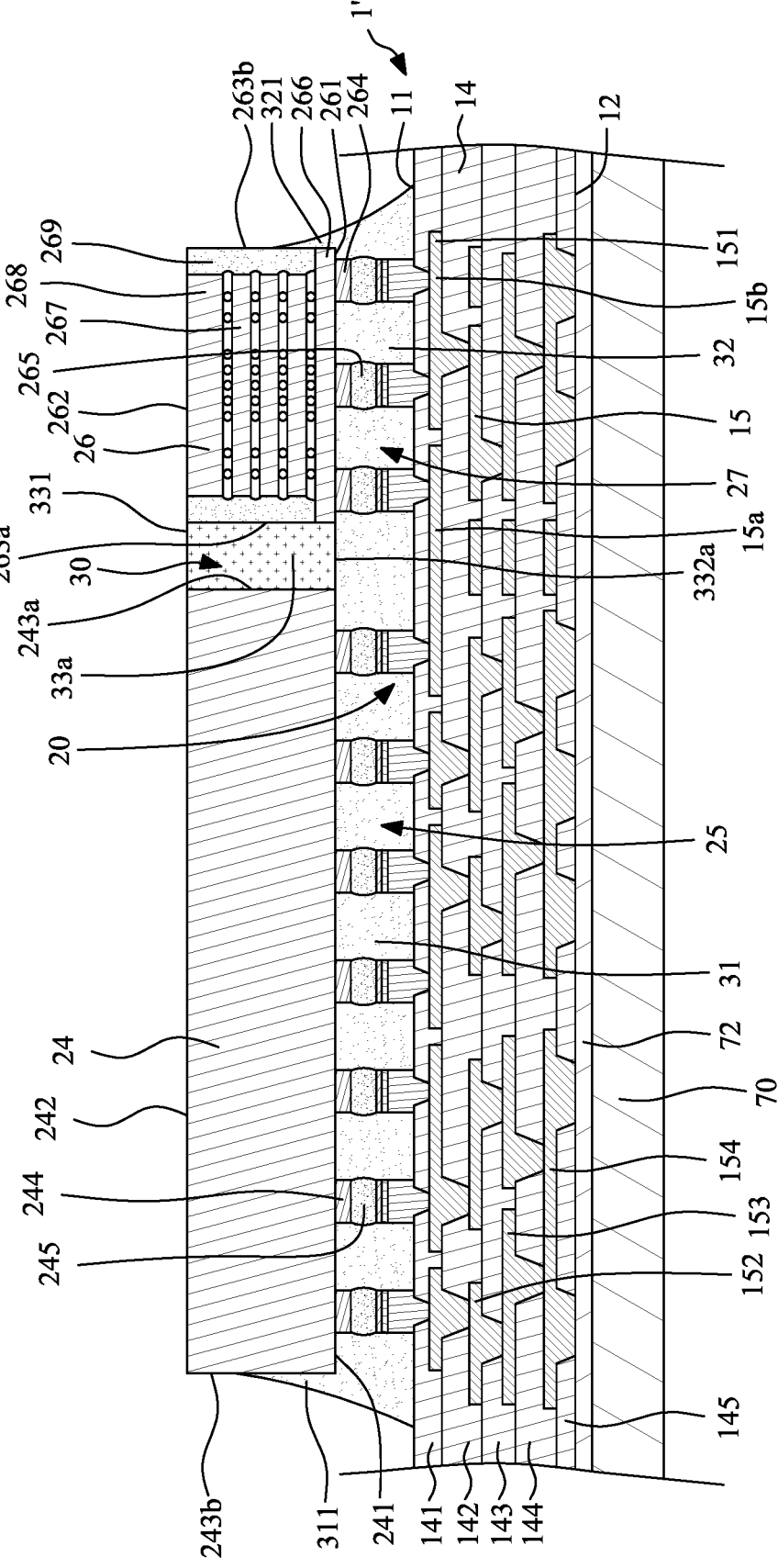
FIG. 40 illustrates one or more stages of an example of a method for manufacturing an assembly structure according to some embodiments of the present disclosure.

FIG. 38 through FIG. 40 illustrate a method for manufacturing an assembly structure according to some embodiments of the present disclosure. In some embodiments, the method is for manufacturing the package structure 3a and the assembly structure 4a shown in FIG. 5.

Referring to FIG. 38, a first lateral side surface 243a of a first electronic device 24 is bonded or attached to a first lateral side surface 263a of a second electronic device 26 through a stiff bonding material 33a to form a combined structure. The bottom surface 332a of the stiff bonding material 33a may be substantially coplanar with the first active surface 241 of the first electronic device 24 and/or the second active surface 261 of the second electronic device 26. The stiff bonding material 33a may be cured.

Referring to FIG. 39, the combined structure of FIG. 38 is electrically connected to the wiring structure 1' of FIG. 12.

Referring to FIG. 40, a first underfill 31 may be applied or disposed in a first space 25 between the first electronic device 24 and the wiring structure 1'. A second underfill 32 may be applied or disposed in a second space 27 between the second electronic device 26 and the wiring structure 1'.

Then, the following stages of the illustrated process are the same as, or similar to, the stages illustrated in FIG. 18 to FIG. 21, so as to obtain the package structure 3a and the assembly structure 4a shown in FIG. 5.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to +10% of that numerical value, such as less than or equal to +5%, less than or equal to +4%, less than or equal to +3%, less than or equal to +2%, less than or equal to +1%, less than or equal to +0.5%, less than or equal to +0.1%, or less than or equal to +0.05%. For example, two numerical values can be deemed to be "substantially" the same or equal if a difference between the values is less than or equal to +10% of an average of the values, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
a wiring structure;
an electronic device electrically connected to the wiring structure through a solder material;
a resin layer encapsulating the electronic device;
an underfill disposed between the resin layer and the wiring structure, and directly contacting the resin layer to form an interface, wherein the interface directly contacts the solder material; and
an encapsulation layer contacting the wiring structure, the electronic device, the resin layer and the underfill, wherein a top surface of the encapsulation layer is substantially coplanar with a top surface of the electronic device and a top surface of the resin layer.

2. The package structure of claim 1, wherein a lateral surface of the solder material includes a curved surface.

3. The package structure of claim 1, wherein an electrical contact of the electronic device is electrically connected to a protrusion pad of the wiring structure through the solder material.

4. The package structure of claim 3, wherein the resin layer contacts the electrical contact of the electronic device, wherein the interface does not contact the electrical contact of the electronic device.

5. The package structure of claim 4, wherein the underfill contacts the protrusion pad of the wiring structure, wherein the interface does not contact the protrusion pad of the wiring structure.

6. A package structure, comprising:
a wiring structure;
an electronic device disposed over the wiring structure, wherein the electronic device includes a first electronic device and a second electronic device;
a resin layer encapsulating the electronic device, and including a first portion disposed between the electronic device and the wiring structure, wherein the resin layer further includes a second portion disposed in a gap between the first electronic device and the second electronic device, wherein a top surface of the second portion of the resin layer is substantially coplanar with a top surface of the first electronic device and a top surface of the second electronic device;
an underfill disposed between the resin layer and the wiring structure, wherein a width of an entirety of a bottom surface of the first portion of the resin layer is substantially equal to a width of an entirety of a top surface of the underfill, wherein the width of the entirety of the top surface of the underfill is less than a width of an entirety of a bottom surface of the underfill; and
an encapsulation layer contacting the wiring structure, the first electronic device, the second electronic device, the resin layer and the underfill, wherein a top surface of the encapsulation layer is substantially coplanar with the top surface of the second portion of the resin layer.

7. The package structure of claim 6, wherein the bottom surface of the resin layer directly contacts the top surface of the underfill.

8. The package structure of claim 6, wherein the resin layer further includes a first extending portion disposed on an outer lateral side surface of the first electronic device, and a second extending portion disposed on an outer lateral side surface of the second electronic device, wherein a topmost point of the first extending portion is lower than the top surface of the second portion of the resin layer, wherein a topmost point of the second extending portion is lower than the top surface of the second portion of the resin layer.

* * * * *